(12) United States Patent
Garnett et al.

(10) Patent No.: US 7,124,321 B2
(45) Date of Patent: Oct. 17, 2006

(54) ADAPTIVE THROTTLING

(75) Inventors: Paul J Garnett, Camberley (GB); Andrew S Burnham, Leatherhead (GB)

(73) Assignee: Sun Microsystems, Inc., Santa Clara, CA (US)

( * ) Notice: Subject to any disclaimer, the term of this patent is extended or adjusted under 35 U.S.C. 154(b) by 644 days.

(21) Appl. No.: 10/361,468

(22) Filed: Feb. 10, 2003

(65) Prior Publication Data

US 2004/0158771 A1    Aug. 12, 2004

(51) Int. Cl.
*G06F 11/00* (2006.01)

(52) U.S. Cl. ........................................... 714/14
(58) Field of Classification Search ................. 714/14, 714/6, 8, 11, 13; 713/300, 340
See application file for complete search history.

(56) References Cited

U.S. PATENT DOCUMENTS

| 4,651,020 | A | * | 3/1987 | Kenny et al. ................. 307/43 |
| 5,892,973 | A | * | 4/1999 | Martinez et al. ............. 710/15 |
| 5,894,413 | A |   | 4/1999 | Ferguson |
| 6,208,520 | B1 |   | 3/2001 | Schmitt |
| 6,823,475 | B1 | * | 11/2004 | Harker ......................... 714/14 |
| 6,957,353 | B1 | * | 10/2005 | Bresniker et al. ........... 713/320 |
| 2003/0056125 | A1 | * | 3/2003 | O'Conner et al. ........... 713/300 |
| 2003/0056126 | A1 | * | 3/2003 | O'Connor et al. ........... 713/300 |
| 2003/0065958 | A1 | * | 4/2003 | Hansen et al. ............... 713/300 |
| 2003/0084359 | A1 | * | 5/2003 | Bresniker et al. ........... 713/324 |
| 2005/0172157 | A1 | * | 8/2005 | Artman et al. ............... 713/300 |

* cited by examiner

*Primary Examiner*—Nadeem Iqbal
(74) *Attorney, Agent, or Firm*—Meyertons Hood Kivlin Kowert & Goetzel, P.C.; B. Noël Kivlin

(57) ABSTRACT

A computer system is provided having at least one processing resource, at least one power resource and at least one redundant power resource. The at least one processing resource is operable to exploit a greater level of power than is provided by the at least one power resource. The at least one processing resource is configured to exploit power provided by both the at least one power resource and the at least one redundant power resource, at a time when both the at least one power resource and the at least one redundant power resource are both operable to provide power. The at least one processing resource is further configured to limit its power consumption to the power supply capability of one of the power resource and the redundant power resource when one of the power resource and the redundant power resource is not available

23 Claims, 28 Drawing Sheets

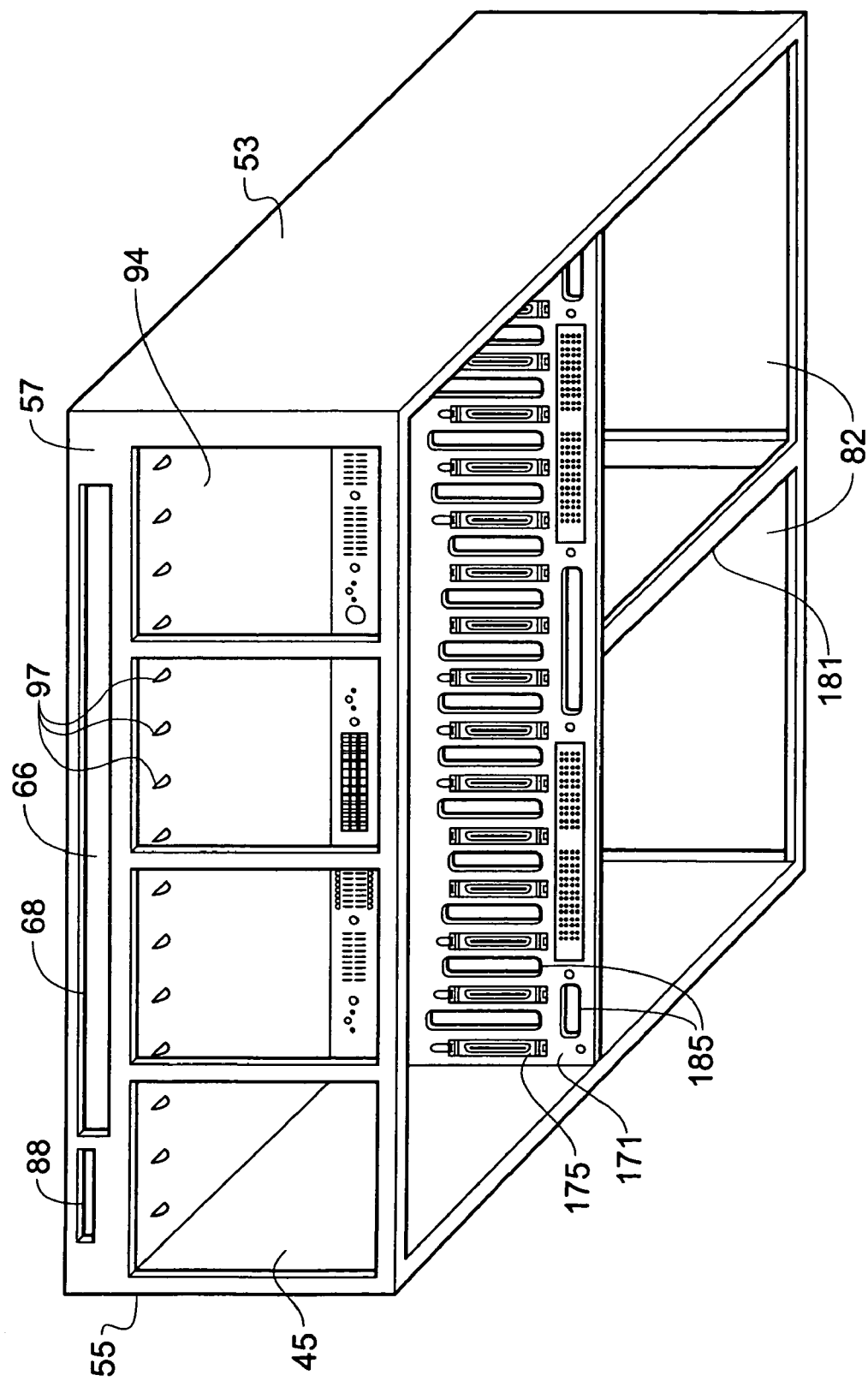

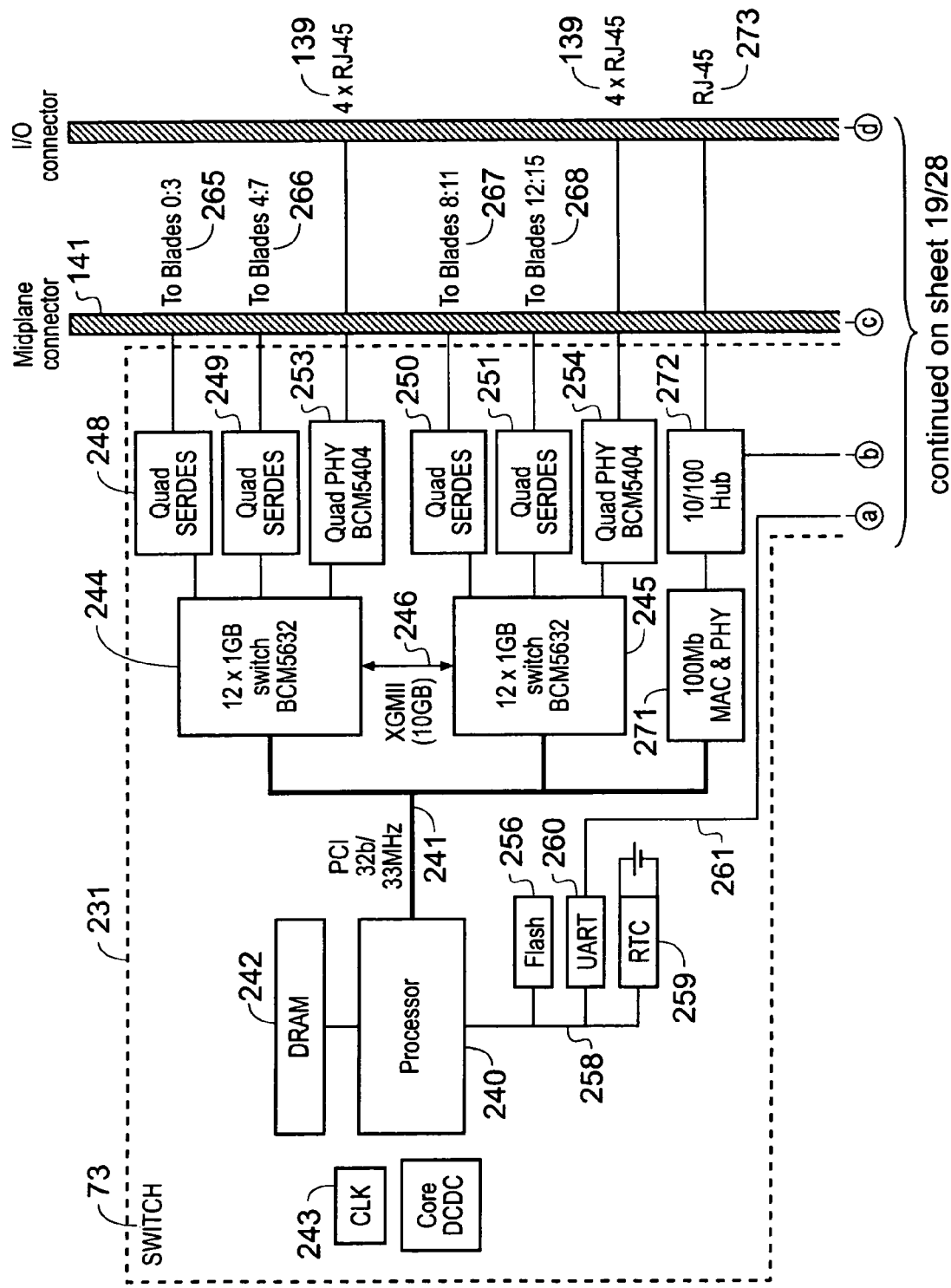

ADAPTIVE THROTTLING

BACKGROUND OF THE INVENTION

The present invention relates to power adaptive throttling, and in particular but not exclusively to use of redundant power to increase performance of a computer system element during availability of redundant power.

One application for the present invention relates to high density computer systems, for example, computer server systems for telecommunications applications. In telecommunications applications, it is important to provide high reliability and high capacity of operation. Various approaches have been taken to providing such high-performance, high reliability systems. Typically such systems are designed around providing redundant resources so that if one component of the system develops a fault, the system remains operational using the redundant resources. Fault tolerance can also be achieved, for example, with multiprocessor systems that provide redundancy through dynamic, e.g., software-controlled, task distribution. High density systems are typically rack mountable, with one or more processor systems occupying a shelf in the rack. The trend in recent times is to make the computers with smaller form factors. This means that more computers can be located in a rack. This has the advantage of increasing the processing density within the racks, and also the advantage of reducing the distance between the computer systems.

The present invention relates to exploitation of redundant resources whilst maintaining the failsafe nature of the redundant situation.

SUMMARY OF THE INVENTION

Viewed from a first aspect, the present invention provides a computer system having at least one processing element and at least two power supply elements operable to provide redundant power supply for the at least one processing element. The processing element is configured to consume more power than is provided by the power supply capability of one of the power supply elements at a time when redundant power supply is available. The processing element is further configured to limit its power consumption to the power supply capability of one of the power supply elements when redundant power supply is not available.

This arrangement provides for excess power which is present in a circumstance of availability of redundant power to be utilized to enhance computer system performance. The arrangement also provides for failsafe controlled return to non-utilization of the excess power in the event that redundant power becomes non-available.

Viewed from another aspect, the present invention provides a computer system operable to receive redundant power supply, wherein the computer system is operable to exploit additional power provided by the redundant power supply at a time when the redundant supply is available and to limit power exploitation to available power when the redundant supply is not available. This arrangement allows spare power provided in a redundant power supply scenario to be exploited to enhance performance when available, and for power exploitation to be limited to avoid overload of power supply when redundancy ceases.

According to an alternative aspect, the invention provides a method of exploiting redundant power provided to a programmable processing apparatus, the method comprising: detecting an operational status of each of a plurality of power supplies to the programmable processing apparatus to determine a redundancy availability result; permitting the programmable processing apparatus to utilize more power than is available in the event of a negative redundancy availability result upon a determination of a positive redundancy availability result; and limiting the power utilization of the programmable processing apparatus to the power that is available in the event of a negative redundancy availability result upon a determination of a negative redundancy availability result. This method provides for controlled use of redundant power to enhance computer system performance without compromising the redundant functionality of the power supply to the computer system.

BRIEF DESCRIPTION OF THE DRAWINGS

Embodiments of the present invention will be described hereinafter, by way of example only, with reference to the accompanying drawings in which like reference signs relate to like elements and in which:

FIGS. 8A, 8B and 8C are a schematic plan view and schematic perspective views, respectively, of an example of the chassis and midplane of the shelf of FIG. 2;

Figure 1:
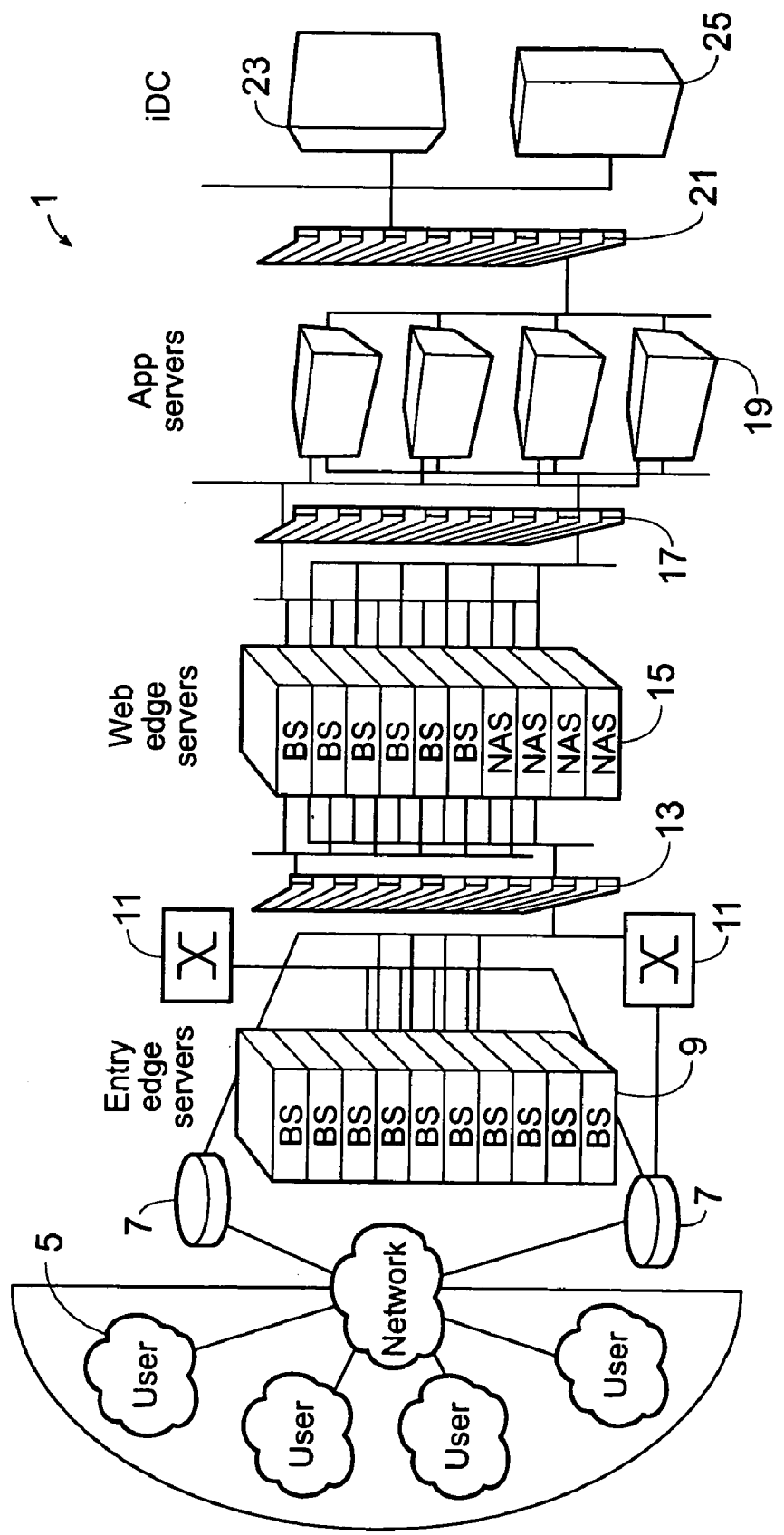
FIG. 1 is a schematic representation of an architecture of a multiprocessor system for supporting a web site.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Embodiments and examples are described hereafter by way of example only in the following with reference to the accompanying drawings.

Shown in FIG. 1 is an example of an application of a high capacity multiserver system 1 for implementing a network-connected web site such as, for example, an airline reservation system on the World Wide Web.

As shown in FIG. 1, an external network 3 (e.g., the Internet) for communicating with a user 5 can be connected to gateways 7 which can be connected to an entry edge server group 9 implemented by a web farm. The entry edge server group 9 forms an interface to the external network 3. The entry edge server group 9 can then be connected by switches 11 and a firewall 13 to a web edge server group 15 that can also be implemented as a web farm as shown in FIG. 1. The web edge server group can serve to cache web pages that are readily accessible to users 5 accessing the system 1 from the external network 3, for example for checking flight times, etc. The web edge server group can comprise a number of blade server (BS) shelves and a number of network addressable storage (NAS) shelves for storing critical data. The web edge server group 15 can be further connected by a further firewall 17 to a plurality of application servers 19, which can be responsible for, for example, processing flight reservations. The application servers 19 can then be connected via a further firewall 21 to computer systems 23, 25, for example, e-commerce services including financial services for receiving and processing payment for airline reservations.

As will be appreciated, the server system described above with reference to FIG. 1 is only an example of a possible application for a multiprocessor server system. Multiprocessor server systems have many different applications and the present system is not limited to being applicable for use in only one or a limited number of such applications, rather multiprocessor server systems as described herein are operable for use in many different applications. A non-exhaustive list of such alternative applications includes: e-commerce web server systems; telecommunications network server systems; LAN application and file server systems and remote vehicle control systems.

Figure 2:
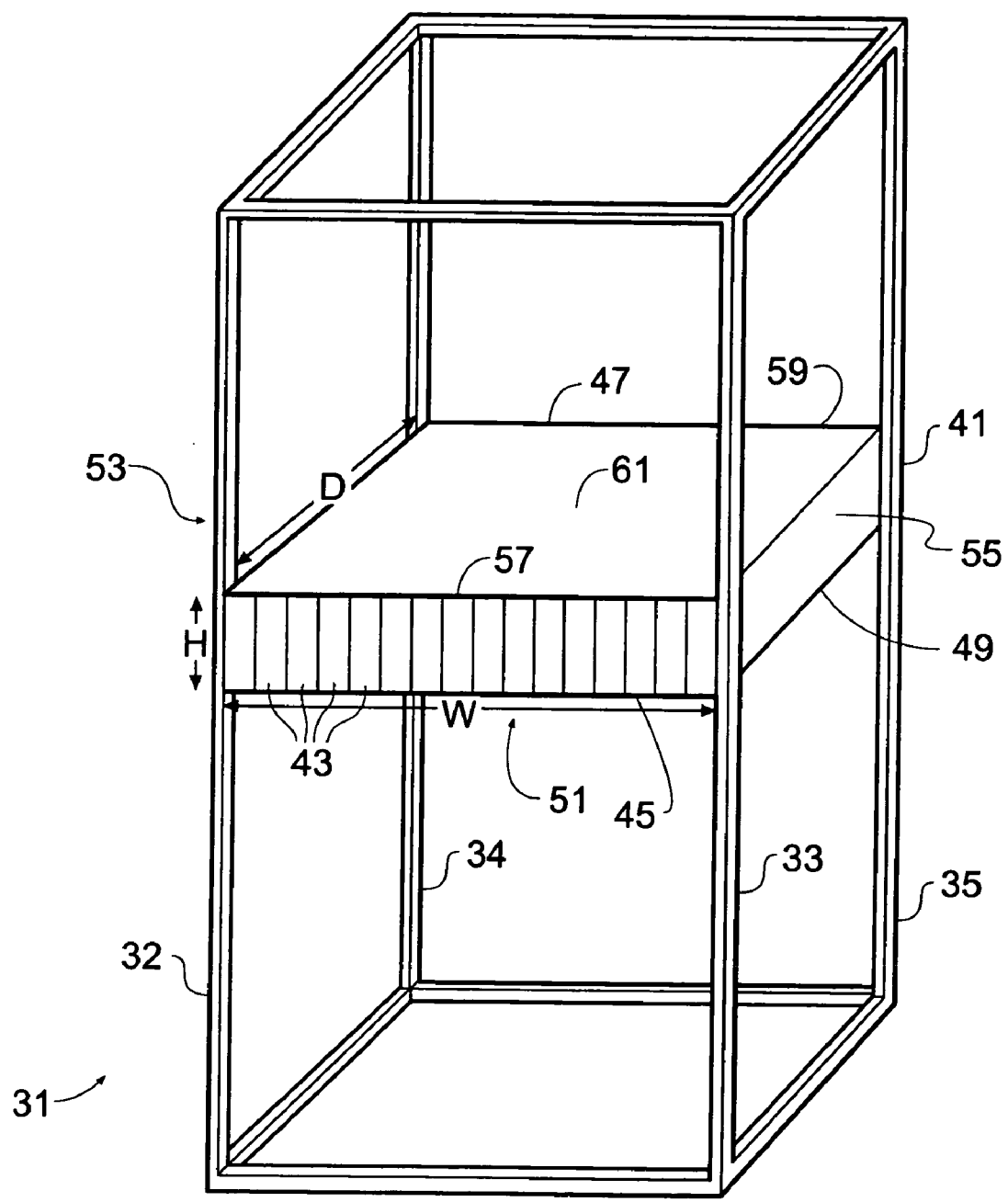
FIG. 2 is a schematic representation of a racking system incorporating an example of a carrier in the form of a rack-mountable shelf according to a first example.

With reference to FIG. 2, there is shown a schematic perspective representation of a rack system 31 as viewed from the front including left and right front uprights 32 and 33 and left and right rear uprights 34 and 35. The uprights can be formed with apertures for receiving shelf fixings (e.g., screws, bolts, clips, etc., for mounting brackets, slides, rails, etc.).

Also shown in FIG. 2 is an example of a blade server shelf 41 mounted in the rack system 31. The shelf 41 forms a carrier configured to carry a plurality of information processing cartridges 43 located side by side along the shelf.

The term "shelf" is used herein in a conventional way to describe a structure that is mountable in rack system 31 and is configured to carry one or more components to form at least a part of a rack-mountable system. In the present example, the shelf 41 is three-dimensional, having a height (H), width (W) and depth (D). In the present example, one dimension (hereinafter described as the height, H) is smaller than the other dimensions (hereinafter described as the depth, D, and the width, W) to facilitate mounting of the shelf within the rack system 31. It will be appreciated that although the width and depth are typically constrained by the dimensions of the racking system for which the shelf is designed, there is more freedom as regard the height, subject to taking account of any appropriate standards and packaging considerations.

Each of the information processing cartridges contains at least one processor. Each information processing cartridge in the present example is operable as a server. In the described examples, the information processing cartridges are configured as robust enclosed modules.

In the example to be described in more detail presently, the information processing cartridges, when aligned in the carrier shelf, look like rectangular slabs, or blades. Accordingly, an information processing cartridge can be described as a blade. The information processing cartridges 43 comprise information processing modules enclosed in an enclosure, or housing, so that the information processing modules have the form of cartridges. Also, as the information processing cartridges are to operate as computer servers in the example described in more detail presently, an information processing cartridge 43 can also be described as a server blade. Accordingly, in the context of this example, the terms module, cartridge and blade are used interchangeably.

The illustrated example of a shelf 41 is configured to carry sixteen information processing cartridges 43, each of which is removably mountable in a respective opening 45 in the front of the shelf, whereby the information processing cartridges can be inserted into and removed from the front of the shelf 41 without removing the shelf 41 from the rack system 31.

In the present example, the shelf 41 comprises a three-dimensional, generally rectangular, enclosure, or housing, 47 that is suitable for mounting in generic racking systems including both 4-post and 2-post systems. It can be mounted on fixed rigid rack mounting ears and/or a simple slide/support system. The present example is designed for standard 19"-wide racking (1"=25.4 mm) as defined, for example, in the well-known IEC297 and EIA 310 specification standards with height corresponding to the so-called 3U (3 standard unit) height. For mounting such a 3U unit in such a 19"-wide racking system, with a depth of, say 25" or 30", the enclosure can be arranged with a height of up to about 130.5 mm, a width of up to about 445 mm and a depth, including all hardware and fascias, but excluding cable management, of up to about 635 mm, with the depth from the front-most point of a fascia to a rear I/O connector panel of a rear mounted Field Replaceable Unit (FRU) of about 610 mm. Of course, other examples designed for other racking systems could have different dimensions.

This example of a shelf 41 has a single enclosure, or housing, 47 that houses a number of modular units or subsystems, the majority of which are replaceable in the field and are therefore known as Field Replaceable Units (FRUs). These modular units include the information processing cartridges 43.

The shelf enclosure 47 can be fabricated from sheet material (e.g., from steel sheet) to form a chassis portion 49 that includes a base 51, two sides 53 and 55, a front 57 and a rear 59. The word "front" as used here is merely used as a label herein to refer to the face, or wall 57 of the enclosure that is located at the main access side of the rack system 31 in use when the shelf is mounted therein. Similarly, the words "rear" and "side" are merely used as labels herein to refer to the faces, or walls 59, 53 and 55 that, in use, are located at those respective positions when the shelf is mounted in the rack system 31.

The openings 45 can be formed in the front face 57 for receiving the information processing cartridges 43 and, as will be explained later, apertures can also be formed in the rear face 59 for receiving further FRUs. The enclosure can further include a removable top cover 61 that can be secured to the chassis portion 49 by suitable fastening (e.g., screws). The apertures in the front and rear faces 57 and 59 allow at least some of the FRUs to be inserted into and/or removed from the shelf enclosure 47 via the front or the rear thereof, as appropriate, without removing the shelf from the racking. Access to components mounted in the shelf that are not accessible via one of the apertures in the front 47 and rear 59 faces can be achieved by removing the shelf enclosure 47 from the racking system 31 and then removing the top cover 61 of the shelf enclosure 47.

Figure 3:
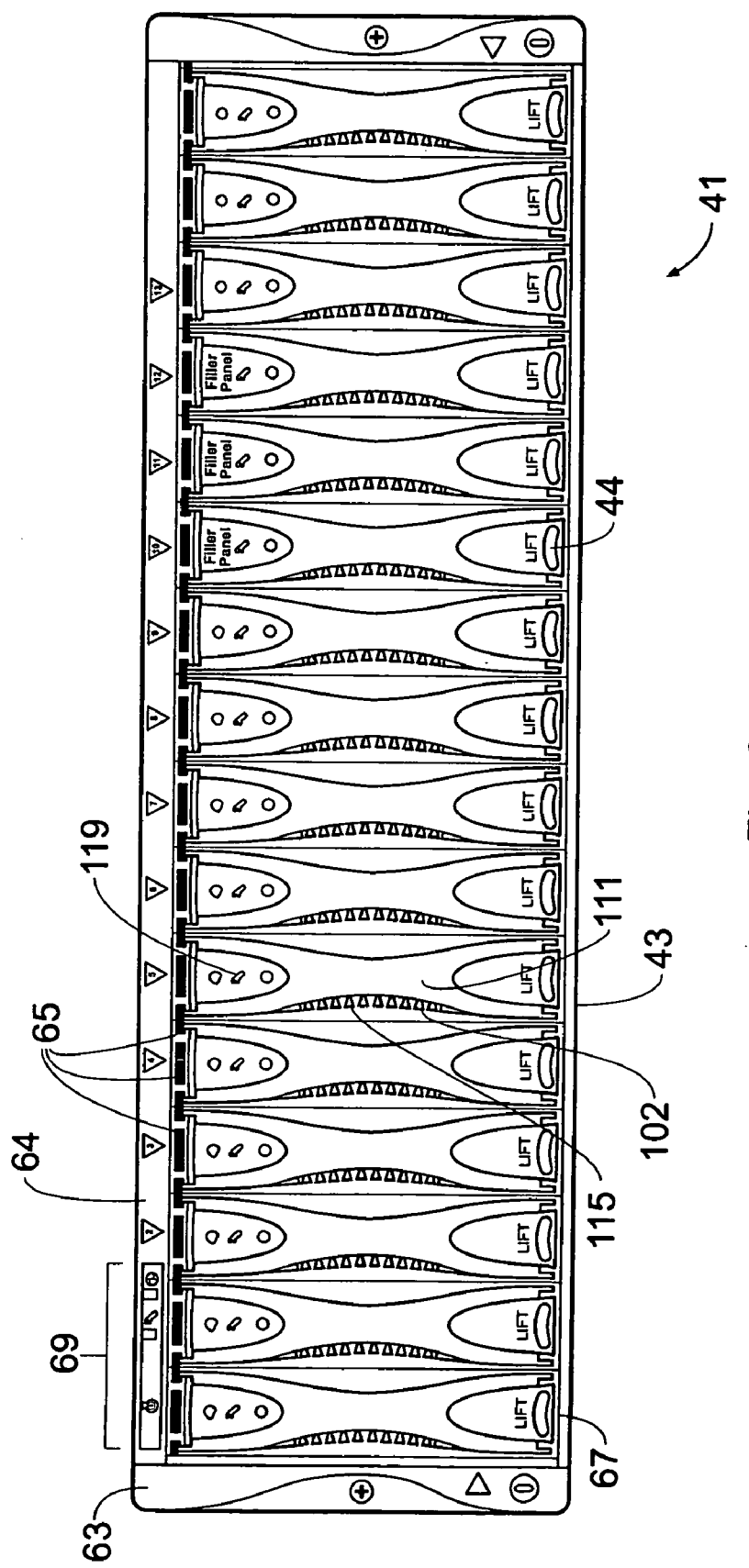
FIG. 3 is a front view of an example of a carrier in the form of a shelf of FIG. 2.

FIG. 3 is a front view of an example of a shelf 41 for a first example. A plastic front bezel 63 can be provided that fits on the front face 57 (shown in FIG. 2) of the chassis 49 of the shelf enclosure 47. The front bezel 63 can be formed as a unitary removable part that spans the whole width and height of the front of the shelf enclosure 47. The front bezel 63 could alternatively include a number of separate components, or mouldings. The front bezel can include a peripheral portion 64 that can provide areas for corporate and product branding marks, for identification and numbering for the information processing cartridge and for a bar code label (all not shown). One or more apertures 65 can be formed in the peripheral portion 64 of the bezel 63. The apertures 65 in the bezel can be arranged to align with one or more apertures (e.g. a slot (not shown in FIG. 3) in the front face of the chassis. In use, air can pass through the apertures 65 to flow into the shelf enclosure 47 to reach FRUs that are mounted in the shelf enclosure 47 through the rear face 59 thereof. Air flowing through the aperture 65 flows into a plenum chamber 66 (not shown in FIG. 3) to flow past the processing cartridges 43 to reach rear mounted FRUs. A central area 67 of the front bezel 63 can be open allowing access to the openings 45 in the front face 57 of the shelf enclosure 47 for insertion and removal of the information processing cartridges 43. Where no active module is mounted in a location for an information processing module, a blanking panel, or filler panel, such as the blanking panel 44, can be located in that location. LED indicators 69 can be mounted on a system indicator printed circuit board (not shown) behind a designated area of the bezel to provide an indication of system status via light guides incorporated into the bezel. A further system indicator board (also not shown) carrying LED indicators can be provided inside the shelf enclosure to be visible from the rear thereof.

As mentioned above, in the present example of a shelf, up to sixteen information processing cartridges 43 can be installed in respective openings 45 in the front face 57 thereof. The number of information processing cartridges 43 actually installed in any installation is dependent upon the system configuration required. Various features relating to the information processing cartridges 43 that are shown in FIG. 3 will be described later.

Figure 4:
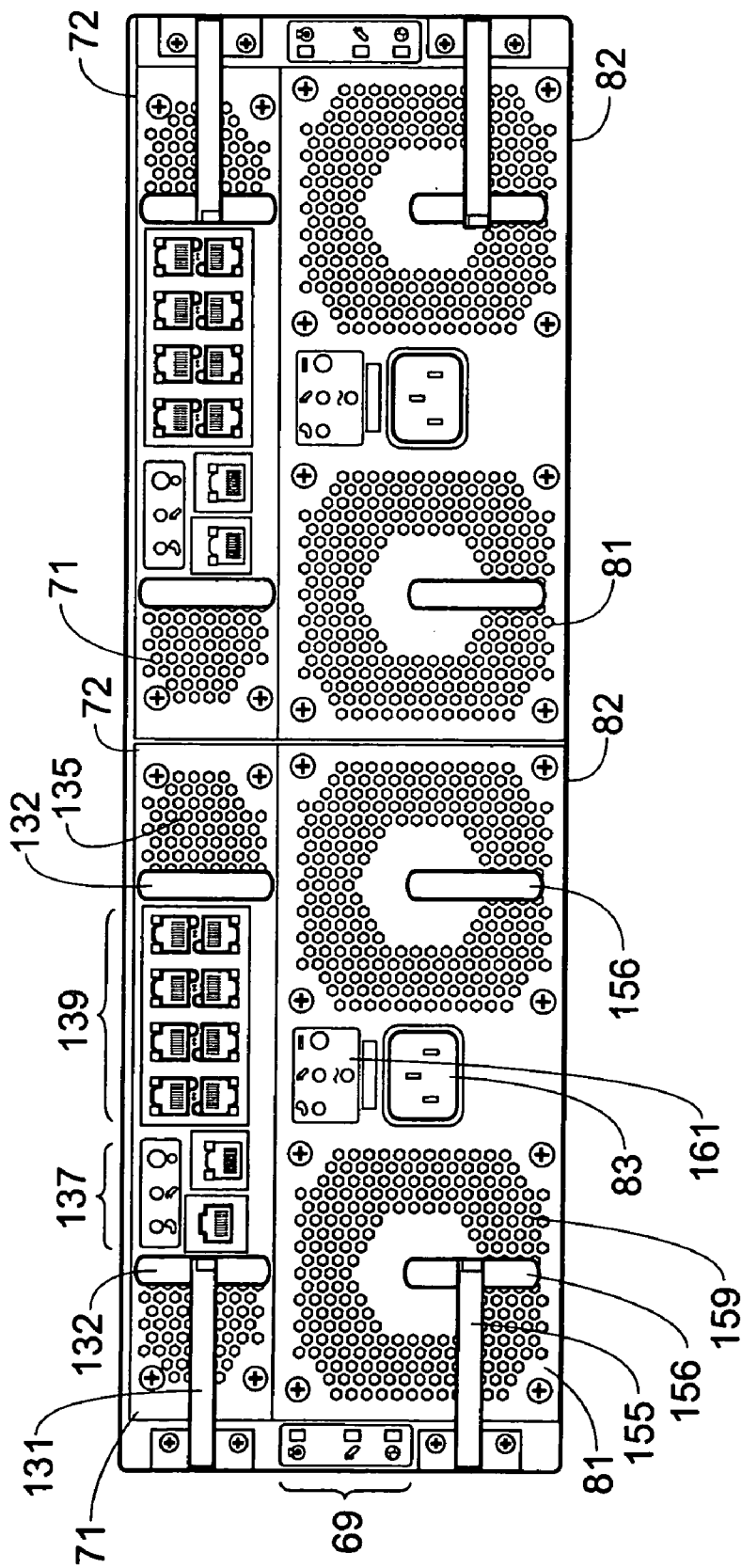
FIG. 4 is a rear view of an example of the shelf of FIG. 2.

FIG. 4 illustrates the rear of the shelf unit of FIGS. 2 and 3. This shows two different types of FRU 71 and 81 (4 units in total) that have been inserted into respective apertures 72 and 82 in the rear of the shelf enclosure 47. The FRUs shown in FIG. 4 include two Combined Switch and Service Processors (CSSPs) 71 and two Power Supply Units (PSUs) 81. Various features shown in FIG. 4 will be described later.

Before proceeding with a more detailed description of each of the FRUs 43, 71 and 81 introduced so far and of the construction of the shelf 41, there follows a brief description of an information processing cartridge 43, a CSSP 71 and a PSU 81 with reference to FIGS. 3, 4, 5 and 7.

Figure 5A:
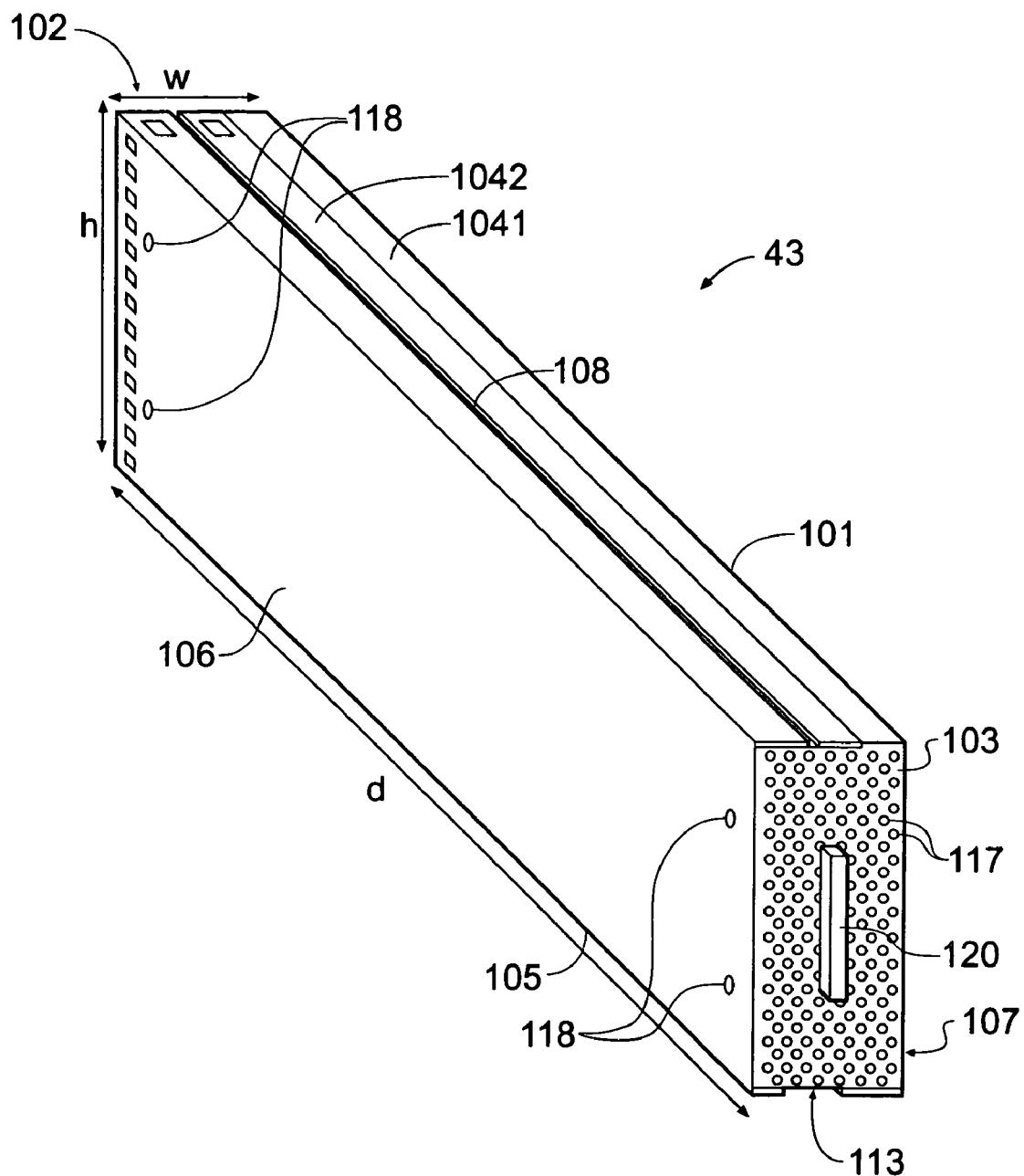
FIGS. 5A, 5B and 5C are schematic perspective views and a schematic exploded view respectively of an example of an information processing cartridge for mounting in the shelf of FIG. 2.
Figure 5B:
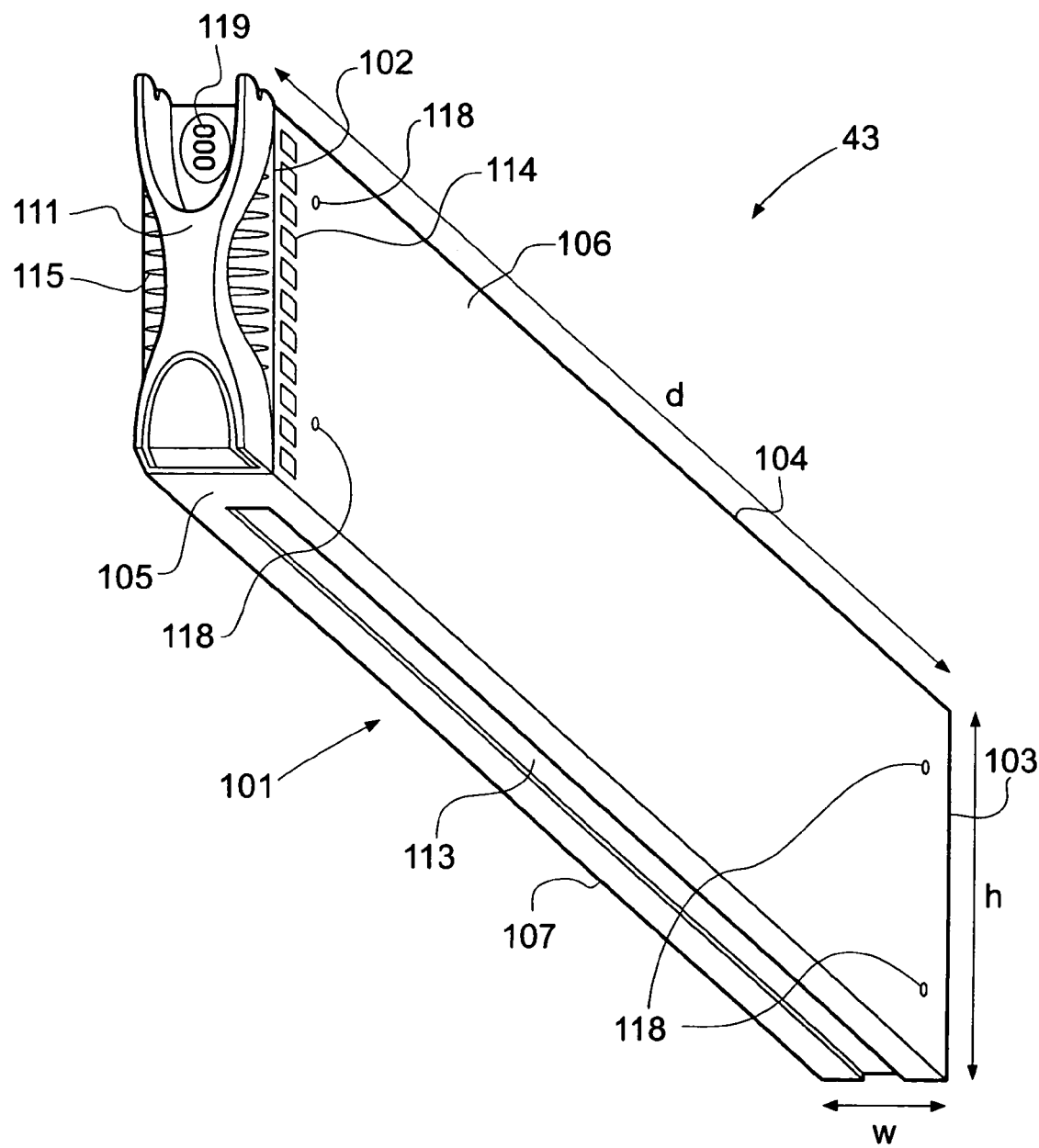
Figure 5C:
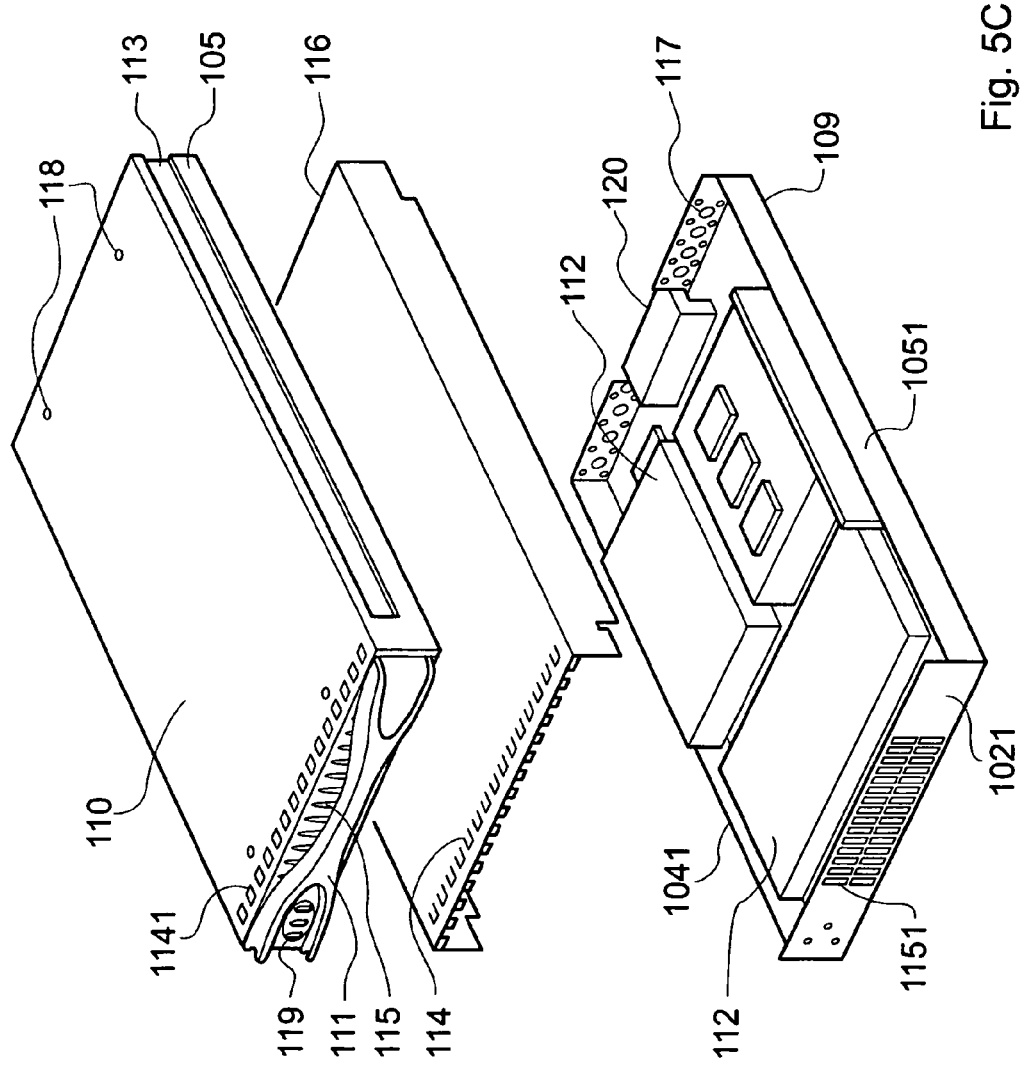

FIG. 5A provides a perspective view, partly from the rear, of an information processing cartridge 43. FIG. 5B provides a perspective view, partly from the front of the same information processing cartridge 43. FIG. 5C provides an exploded perspective view of the construction of the information processing cartridge 43. Here is it to be noted that the term "rear" is applied in the context of the position, when installed, of the information processing cartridge, with respect to the shelf 41 (i.e. in this case the "rear" of the information processing cartridge 43 is the innermost part of the information processing cartridge when it is inserted in the shelf 41). Likewise, "front" refers in the present context to the outermost part of the information processing cartridge when it is inserted in the shelf 41.

With reference to FIGS. 3, 5A and 5B, it will be noted that information processing cartridges are three-dimensional, having a height (h), width (w) and depth (d). If, as in the present example, the information processing cartridges are to be arranged in a one-dimensional array (a row) across the shelf, then efficient packing for the information processing cartridges is achieved where one dimension (here the width, w) is smaller than the other dimensions (here the depth, d, and the height, h). In a particular example, the enclosure of a processing cartridge 43 has a height h, width w and depth d of 115 mm, 26 mm and 315 mm, respectively, although of course, other examples may have different dimensions.

It will be noted that an enclosure 101 of the present example of an information processing cartridge 43 has six, generally rectangular, faces. For convenience only, the face that is visible from the front of the racking when an information processing cartridge 43 is mounted in the shelf 41 is known as the front face 102. The opposite face is known as the rear face 103. In the present example these two faces, as well as top and bottom faces 104 and 105, and the side faces 106 and 107 have the shape of elongate rectangles.

Although in the present example the information processing cartridges have six generally rectangular faces, it will be appreciated that other examples could have other configurations. For example, rather than having a generally rectangular shape, the side faces of another example of an information processing cartridge could have the general shape of a triangle (whereby the information processing cartridge may then only have five faces), a pentagon (whereby the information processing cartridge may then have seven faces), and so on. Indeed, one or more or all of the edges could be curved. However, it will be appreciated that the present configuration provides advantages for example, in terms of manufacturing, engineering and packing density within a shelf 41.

In this example, the information processing cartridge enclosure 101 is fabricated from two housing portions. The first housing portion 109 can be fabricated from, for example, a metal (e.g., pressed steel) and can include one side face 106, the rear face 103 and part of the top face 104. The part of the top face formed by the metal portion 109 is given the reference 1041 in FIG. 5A. The second housing portion 110 can be fabricated from, for example, a plastics material and can include the other side face 107 and the front faces 102 and bottom face 105 and the remaining part 1042 of the top face 104. In the present example, a plastics material used is PolyCarbonate Acrylonitrile Butadiene Styrene (PCABS), however many other plastics materials such as other ABSs and nylons may be used. The metal portion 109 also includes a part 1021 corresponding to the front face 102 and a part 1051 corresponding to a part of the bottom face 105. The parts are covered by the plastics portion 110 when enclosure 101 is fully assembled. These parts are visible in the exploded view of FIG. 5C. The two housing portions 109 and 110 are secured to one another by fixings such as screws 118.

As shown in FIG. 5A, a groove 108 runs along the length of the plastic top face portion 1042. This groove 108 is provided for interfacing with a guide member of the shelf chassis (not shown in FIG. 5A, but see FIGS. 8B and 8C). A similar groove 113 is formed in the bottom face 105 of the plastics portion 110 as shown in FIGS. 5B and 5C. This groove 113 is provided for interfacing with a guide member of the shelf chassis (not shown in FIGS. 5B and 5C, but see FIG. 8D).

The provision of the enclosure 101 means that the information processing cartridge 43 can safely be handled by an operator who is not a skilled technician. Also, through the use of the enclosure 101, the information processing cartridge is a robust unit that protects its inner workings from the outside environment and vice versa. The use of a conductive enclosure, e.g., a metal enclosure, can result in the information processing cartridge including its own electromagnetic shielding. To this end, the enclosure 101 can also be provided with an internal electromagnetic interference (EMI) shielding member 116 as shown in FIG. 5C. The EMI shielding member can be located between the internal components 112 of the information processing cartridge 43 (not described in detail with reference to FIGS. 5A to 5C, but see FIGS. 11 and 18 below) and the plastics portion 110. The EMI shielding member can be secured to the plastics portion 110, for example by heat bonding or an adhesive. In other examples, the plastics portion could have a conductive layer deposited thereon, or conductive plastics material could be used. In this example, the EMI shielding member 116 is provided with electromagnetic interference (EMI) fingers 114 to ensure good contact with the shelf chassis and the adjacent components. These fingers 114 extend through EMI finger apertures 1141 in the plastics portion 110.

As shown in FIGS. 3, 5B and 5C, the information processing cartridge 43 incorporates an injector/ejector handle 111 on the front face 102 for facilitating insertion and latching of the information processing cartridge 43 within an aperture in the shelf 41.

As shown in those Figures, the handle 111 of the injector/ejector lever extends substantially the whole height of the front face of the information processing cartridge 43, thereby increasing the mechanical advantage and facilitating injection and ejection of the information processing cartridge 43. As is further shown in those Figures, the front face 102 of the information processing cartridge 43 has perforations 115, in the present example slits, to allow for airflow into the information processing cartridge 43. The front face part 1021 of the metal portion 109 has perforations corresponding to those in the front face 102 such that airflow into the information processing cartridge 43 is not impeded. It will be noted in FIGS. 3, 5B and 5C that the handle 111 is narrower in its middle than at its ends. This reduces any masking effect of the handle 111 on the airflow to the perforations 115 in the front face of the information processing cartridge 43 and facilitates grasping of handle 111. The handle 111 can be bowed out from the front face of the information processing cartridge to further facilitate grasping thereof and to reduce any masking effect with regard to the perforations. In other examples, the handle 111 could have an open frame-like structure to further facilitate airflow.

As shown in FIG. 5A, the rear face 103 of the information processing cartridge 43 also has perforations 117 to allow for air to be exhausted from the rear of the information processing cartridge 43. A fan can be located within the enclosure 101 of an information processing cartridge 43. In the present example the fan is a combined radial fan (blower) and heat sink to direct cooling air onto a processor of the information processing cartridge, which fan also encourages air movement within the enclosure 101. LED indicators 119 (see FIGS. 3 and 5B) can be provided on the front face 102 of an information processing cartridge to indicate whether power is on, whether service intervention is required and whether the information processing cartridge 43 can be removed. A connector 120, for example a 40 way single connector attachment (SCA-2) connector (a small computer systems interface (SCSI) connector), can be provided at the rear of the information processing cartridge 43 for electrical connection of the information processing cartridge 43 within the shelf 41. The connector 120 is advantageously able to withstand repeated removals and insertions of the enclosure 101 from and into a shelf 41. The connector arrangement can include a guide pin arrangement to prevent module misalignment during insertion of the information processing cartridge into the receiving location.

Thus an example of features and the construction of an information processing cartridge enclosure has been described. Although particular materials and constructions have been described, it will be appreciated that other examples could be employed. Indeed, it will be appreciated that this particular example relates to only a possible form for the processing cartridge 43. An example of an alternative construction will now be described with reference to FIG. 5D.

Figure 5D:
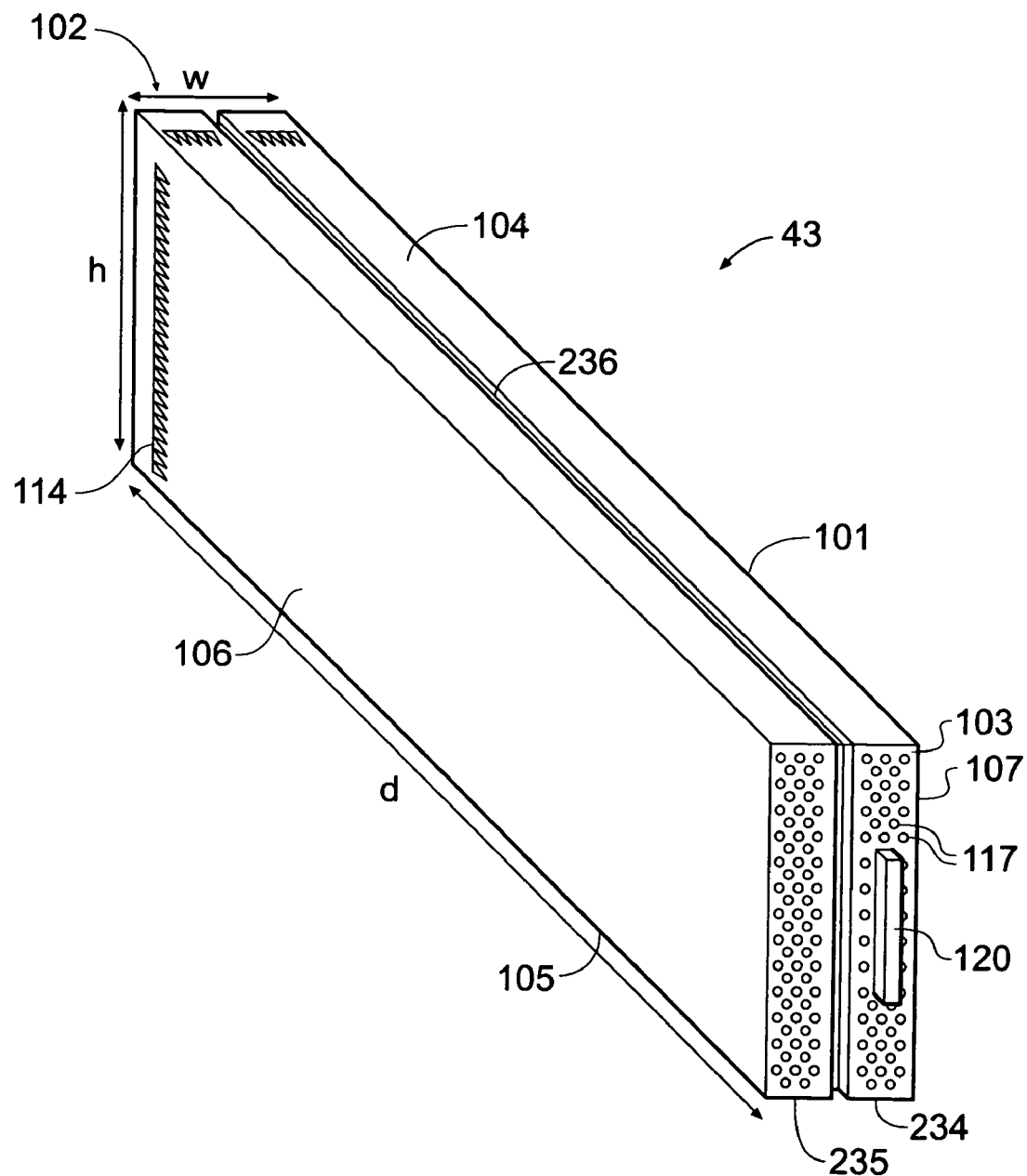
FIG. 5D is a schematic perspective view of an example of an information processing cartridge for mounting in the shelf of FIG. 2.

FIG. 5D provides a perspective view, partly from the rear, of an alternative information processing cartridge 43. Here is it to be noted that the term "rear" is applied in the context of the position, when installed, of the information processing cartridge, with respect to the shelf 41 (i.e. in this case the "rear" of the information processing cartridge 43 is the innermost part of the information processing cartridge when it is inserted in the shelf 41).

In this example, the information processing cartridge enclosure 101 is fabricated from pressed steel to form two chassis portions. The first portion 234 includes one side face 107, and part of each of the front and rear faces 102 and 103 and the top and bottom faces 104 and 105. The second portion 235 includes the other side face 108 and the remaining part of each of the front and rear faces 102 and 103 and the top and bottom faces 104 and 105. The two chassis portions 234 and 235 meet at a groove 236 and are secured to one another by fixings (e.g., one or more screws, not shown). Grooves 236 run along the top and bottom faces 104 and 105 of the enclosure 101 and are provided for interfacing with guide rails of the shelf chassis 49 (not shown in FIG. 5, but see FIG. 8C). A cover portion that is secured to the chassis portion forms the other side face 106. It will be appreciated however, that in another example, the chassis portions could be joined at a position other than the groove 108, with the groove 108 being formed entirely in one of the chassis portions. Alternatively, the enclosure 101 may be constructed from a number of sheets of steel, with each sheet forming one of the faces.

Figure 6:
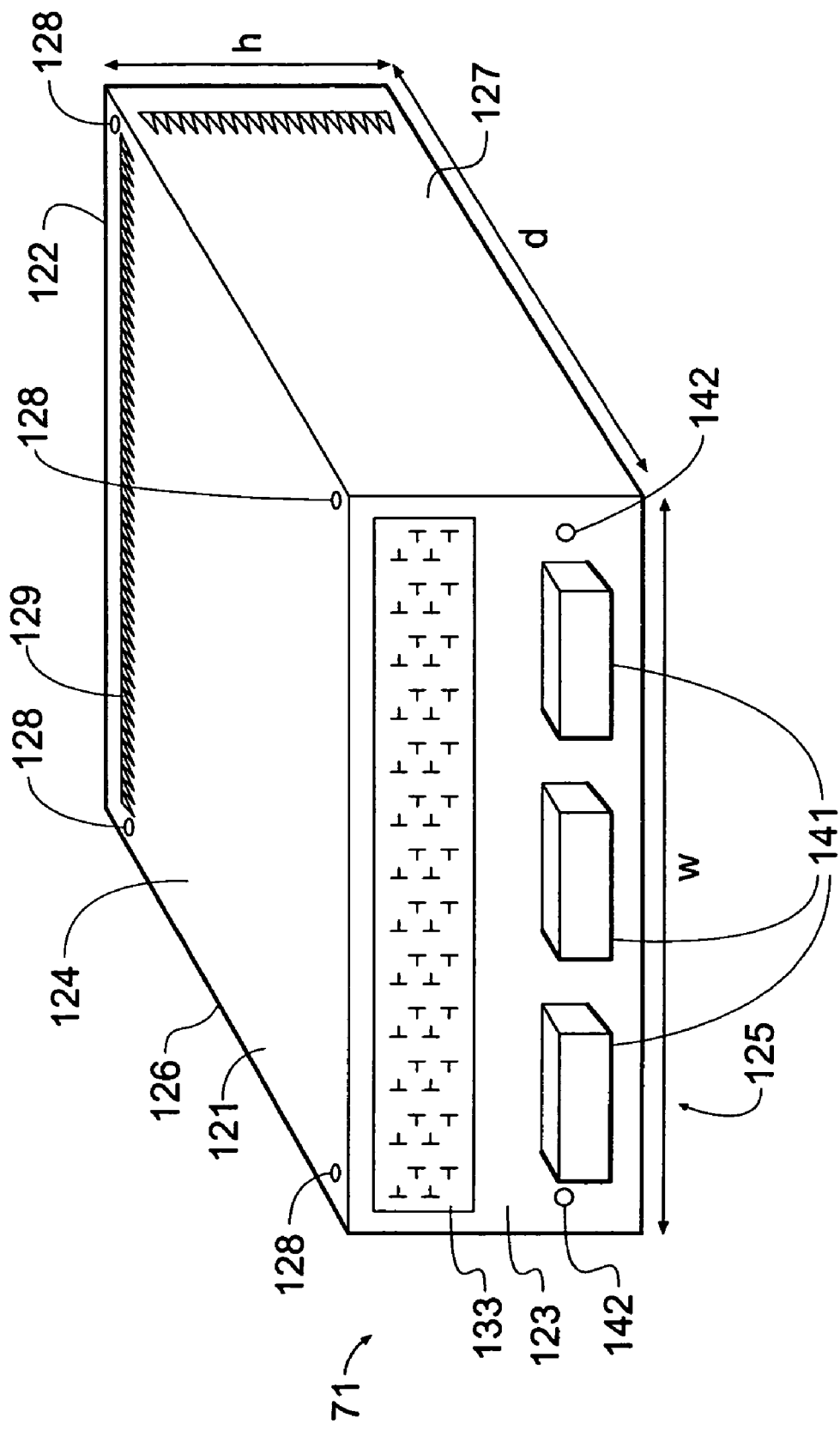
FIG. 6 is a schematic perspective view of an example of a combined switch and service processor module for mounting in the shelf of FIG. 2.

FIG. 6 provides a perspective view, partly from the front, of a Combined Switch and Service Processor (CSSP) cartridge (or CSSP) 71. Here is it to be noted that the term "front" is applied in the context of the position, when installed, of the CSSP cartridge 71, with respect to the shelf 41 (i.e. in this case the "front" of the CSSP cartridge 71 is the innermost part of the CSSP cartridge 71 when it is inserted in the shelf 41).

With reference to FIGS. 4 and 6, it will be noted that a CSSP cartridge 71 is three-dimensional, having a height (h), width (w) and depth (d). In a particular example, the enclosure of a CSSP 71 has a height h, width w and depth d of 43 mm, 202 mm and 278 mm, respectively, although of course, other examples may have different dimensions.

An enclosure 121 of present example of a CSSP cartridge 71 has six, generally rectangular, faces. For convenience only, the face that is visible from the rear of the racking when a CSSP cartridge 71 is mounted in the shelf 41 is known as the rear face 122. The opposite face is known as the front face 123. In the present example these two faces, as well as side faces 126 and 127 have the shape of elongate rectangles. The top and bottom faces 124 and 125 are also rectangular, but not elongate in the manner of the front, rear, top and bottom faces. Although in the present example the CSSP cartridges have six generally rectangular faces, as for the information processing cartridges 43 it will be appreciated that other examples could have other configurations.

In this example, the CSSP enclosure 121 is fabricated from steel sheet to form a chassis portion that includes the bottom face 125, the front and rear faces 122 and 123 and the side faces 126 and 127. A cover portion that is secured to the chassis portion forms the other top face 124. The cover portion is secured to the chassis portion by suitable fixings, for example one or more screws 128. It will be appreciated however, that in another example, other faces, or portions, of the enclosure could form the chassis and the cover portions. The provision of the enclosure 121 means that the CSSP cartridge 71 can safely be handled by an operator who is not a skilled technician. Also, through the use of the enclosure 121, the switch cartridge is a robust unit that protects its inner workings from the outside environment and vice versa. The use of a conductive enclosure, e.g., a metal enclosure, means that the CSSP cartridge includes its own electromagnetic shielding. To this end the CSSP enclosure 121 is provided with EMI fingers 129 to ensure good contact with the shelf chassis and the adjacent components.

As shown in FIG. 4, the CSSP cartridge 71 incorporates two D-shaped handles 132 to facilitate insertion and removal of the CSSP cartridge 71 with respect to an aperture 72 in the rear face of the shelf enclosure. A latch member 131 can be pivotably mounted on a plate that can be secured (e.g., using screws) to the rear face of the shelf enclosure. The latch member 131 is configured to engage one of the handles 132 and to secure the CSSP cartridge 71 in place. In other examples, the CSSP cartridge 71 could be provided with an injector/ejector handle in a manner similar to the information processing cartridge. As shown in FIG. 6, the front face 123 of the CSSP cartridge 71 has perforations 133 to allow for airflow into the CSSP cartridge 71. As shown in FIG. 4, the rear face 122 of the CSSP cartridge 71 has perforations 135 to allow for air to be exhausted from the rear of the CSSP cartridge 71.

At least one fan can be located, for example behind the perforated portion 135 of the rear face, in a CSSP cartridge 71 to channel cooling air through the CSSP cartridge 71 from the front to the rear. In this particular example shown, two fans are provided, one behind each set of perforations 135. LED indicators 137, as shown in FIG. 4, can be provided on the rear face 122 of the CSSP enclosure 121 to indicate whether power is on, whether service intervention is required and whether the switch can be removed. Additional link status indicators can be provided integral to 2×4 stacked RJ-45 connectors 139, also shown in FIG. 4. As shown in FIG. 4, electrical connections 141 can be provided at the front face of the CSSP (i.e. on the face that in use is inside the shelf enclosure 47). Suitable connections for use in the present example include a connector for power connections, a connector for serial management data connections and a connector for information connections. In the present example, information connections are implemented using an Ethernet information communication protocol, e.g. at 1 Gigabit (Gb). However other protocols could equally be used, for example the Infiniband information communication protocol. The connector arrangement can include a guide pin arrangement to prevent module misalignment during insertion of the CSSP module into the receiving location. For this purpose, guide pin holes 142 can be provided on the front face 123 into which guide pins may pass to aid module alignment.

In the present example, up to two CSSPs 71 can be mounted at any one time at the rear of the shelf unit in corresponding apertures 72 in the rear face of the shelf enclosure 47. The number of CSSPs 71 provided in any particular implementation depends upon system configuration and the need, or otherwise, for redundancy.

It will be appreciated that one possible construction of the CSSP cartridge 71 has been described and that as for the information processing cartridge 43, other examples could employ other materials and/or constructions.

Figure 7:
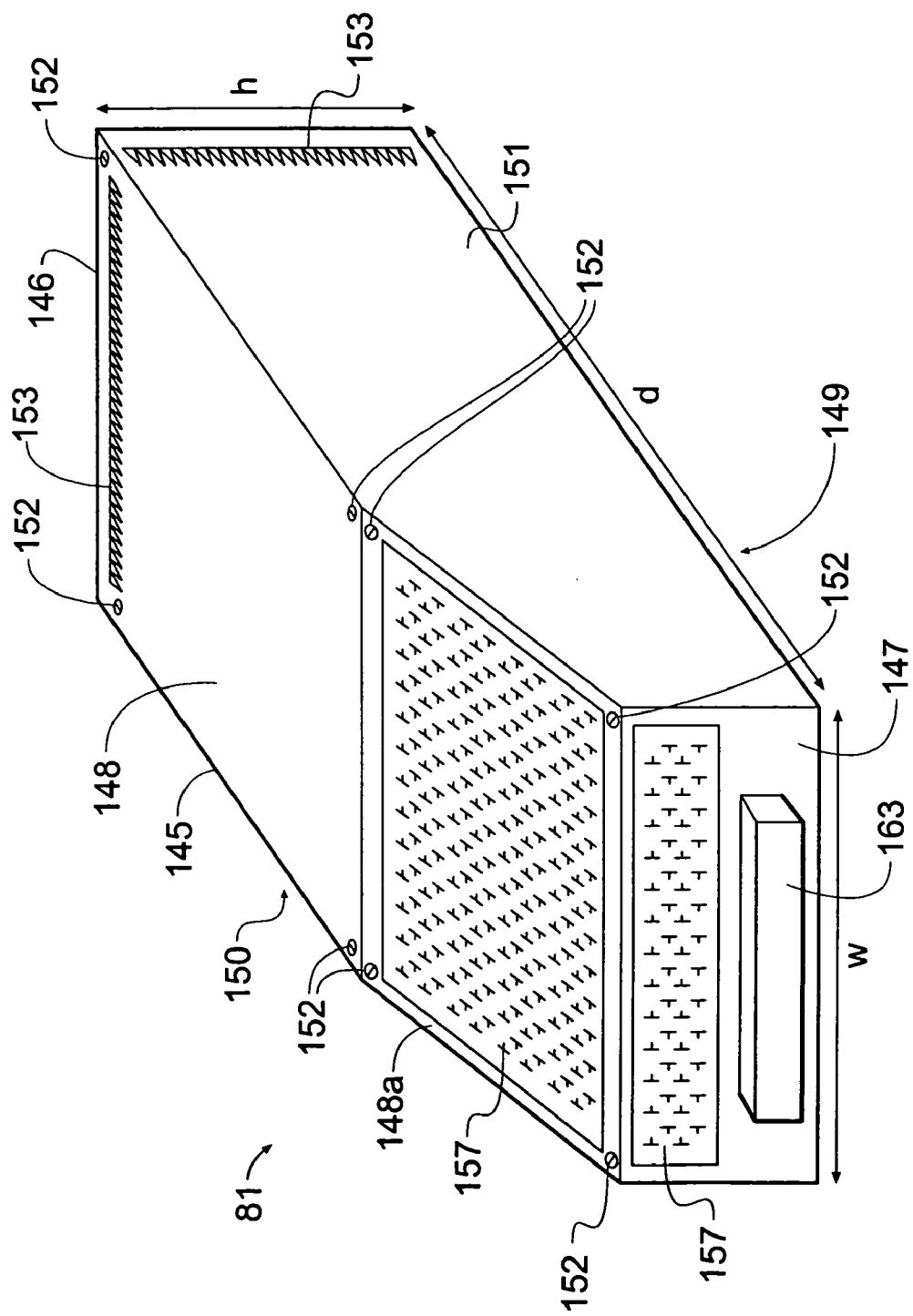
FIG. 7 is a schematic perspective view of an example of a power supply module for mounting in the shelf of FIG. 2.

FIG. 7 provides a perspective view, partly from the front, of a power supply unit (PSU) cartridge 81. Here is it to be noted that the term "front" is applied in the context of the position, when installed, of the PSU cartridge 81, with respect to the shelf 41 (i.e. in this case the "front" of the PSU cartridge 81 is the innermost part of the PSU cartridge 81 when it is inserted in the shelf 41).

With reference to FIGS. 4 and 7, it will be noted that PSU cartridge 81 is three-dimensional, having a height (h), width (w) and depth (d). In this particular example, the order to provide for a dense packing of the FRUs in the rear of the shelf 41, the PSU cartridge 81 has two dimensions (hereinafter described as the width, w, and the depth, d) that are generally similar. In a particular example, the enclosure of a PSU cartridge 81 has a height h, width w and depth d of 83 mm, 202 mm and 276 mm, respectively, although of course, other examples may have different dimensions.

An enclosure 145 of present example of a PSU cartridge 81 is of generally oblong shape, but has the "top" "front"

edge cut away to form an additional "top" "front" sloping face. The enclosure 145 therefore has five, generally rectangular, faces and two faces of generally rectangular shape with one corner cut away. For convenience only, the face that is visible from the rear of the racking when the PSU cartridge 81 is mounted in the shelf 41 is known as the rear face 146. The opposite face is known as the front face 147. In the present example these two faces and the two side faces 150, 151 are of elongate, generally rectangular shape with one corner cut away, given that the width and depth of the PSU cartridge are similar, whereas the top and bottom faces 148, 149, although still rectangular, are not, in this example, notably elongate. A top front face 148a is present at the top front of the enclosure. Thus the front of the enclosure is sloped at the top edge. As for the information processing cartridges 43, however, it will be appreciated that other examples could have other configurations.

In this example, the PSU cartridge enclosure 145 is fabricated from steel sheet to form a housing portion that includes the bottom face 149, the side faces 150 and 151 and the front and rear faces 146 and 147. Cover portions that are secured to the housing portion form the top face 148 and top front face 148a. The cover portions are secured to the chassis portion by suitable fixings, for example one or more screws 152. It will be appreciated however, that in another example, other faces, or portions, of the enclosure could form the chassis and the cover portions. The provision of the enclosure 145 means that the PSU cartridge 81 can safely be handled by an operator who is not a skilled technician. Also, through the use of the enclosure 145, the PSU cartridge 81 is a robust unit that protects its inner workings from the outside environment and vice versa. The use of a conductive enclosure, e.g., a metal enclosure, means that the PSU cartridge includes its own electromagnetic shielding. To this end the PSU enclosure 145 is provided with EMI fingers 153 to ensure good contact with the shelf chassis and the adjacent components.

As shown in FIG. 4, the PSU cartridge 81 incorporates two D-shaped handles 156 to facilitate insertion and removal of the PSU cartridge 81 with respect to an aperture 82 in the rear face of the shelf enclosure. A latch member 155 can be pivotably mounted on a plate that can be secured (e.g., using screws) to the rear face of the shelf enclosure. The latch member 155 is configured to engage one of the handles 156 and to secure the PSU 81 in place. In other examples, the PSU 81 could be provided with an injector/ejector handle in a manner similar to the information processing cartridge. As shown in FIG. 7, the front face 147 of the PSU cartridge 81 has perforations 157 to allow for airflow into the PSU cartridge 81. As shown in FIG. 4, the rear face 146 of the PSU cartridge 81 also has perforations 159 to allow for air to be exhausted from the rear of the PSU cartridge 81.

A pair of fans can be located behind the perforated portions 159 of the rear face of a PSU cartridge 81 to channel cooling air through the PSU cartridge from the front to the rear. LED indicators 161 can be provided on the rear face 146 of the PSU enclosure 81 to indicate whether input power is good, whether output power is good, whether service intervention is required and whether the PSU can be removed. Electrical connectors 163 can be provided at the front face of the PSU (i.e. on the face that in use is inside the shelf enclosure 47) for connection to the shelf. The PSU 81 of the present example may suitably employ an SSI-MPS (Server Systems Interface—Midrange Power Supply) compliant right angle connector at the front face 147 of the PSU 81 to connect to the shelf 41. The power inlet 83 for each PSU 81 can incorporate a cable/connector retention mechanism (not shown) on the rear face 146 of the PSU to prevent accidental or malicious removal of the power input cord from the PSU 81.

In the present example, the shelf unit enclosure provides slots at the rear of the shelf unit for two hot-swappable, AC input PSUs 81. To provide redundant power supply, both PSU slots are populated. More generally, N+M power supplies can be provided, where N is the minimum number of power supply units needed to support the components mounted in the shelf, and M is a selectable number of 0, 1 or more power supplies to provide for redundancy. In the present example, N=M=1.

It will be appreciated that one possible construction of the CSSP cartridge 71 has been described and that as for the information processing cartridge 43, other examples could employ other materials and/or constructions.

If the full complement of information processing cartridges or switches are not fitted to the enclosure, then blanking panels/modules (e.g., the blanking panels 44 shown in FIG. 3) are fitted to all unpopulated positions to maintain the correct airflow and thermal characteristics of the shelf, a safe internal operating temperature for the shelf life expectancy of all shelf components, electromagnetic compliance (EMC) containment and electrostatic discharge (ESD) containment.

It will be noted that each of the FRUs, such as the information processing cartridges 43, is advantageously contained in its own robust enclosure to facilitate EMC containment, ESD containment, handling, storage and transportation. Each FRU can be configured as a 'sealed' unit in the sense that it can be configured not to have field or customer serviceable parts internally. The FRUs can be configured readily to plug into the shelf enclosure and to be hot swappable. The FRUs can be keyed to prevent incorrect positioning and insertion into the shelf enclosure and are arranged positively to be retained in the shelf by a latching/locking mechanism.

The examples of FRUs described above are not provided with removable media. In the present example, internal data storage is provided by 2.5" IDE 9.5 mm or 12.7 mm profile hard disk drive (HDD) devices mounted internally in each information processing cartridge 43 and in the CSSP cartridge 71. The drives are not considered as FRUs and are not hot-swappable disk drives in the present example, although they could be in other examples. In other examples, the information processing cartridges can be configured without internal hard disk drives.

The internal configuration of the shelf 41 and a midplane 171 contained therein is described in the following with reference to FIGS. 8A, 8B 8C and 8D, and FIGS. 9A, 9B and 9C.

Figure 8A:
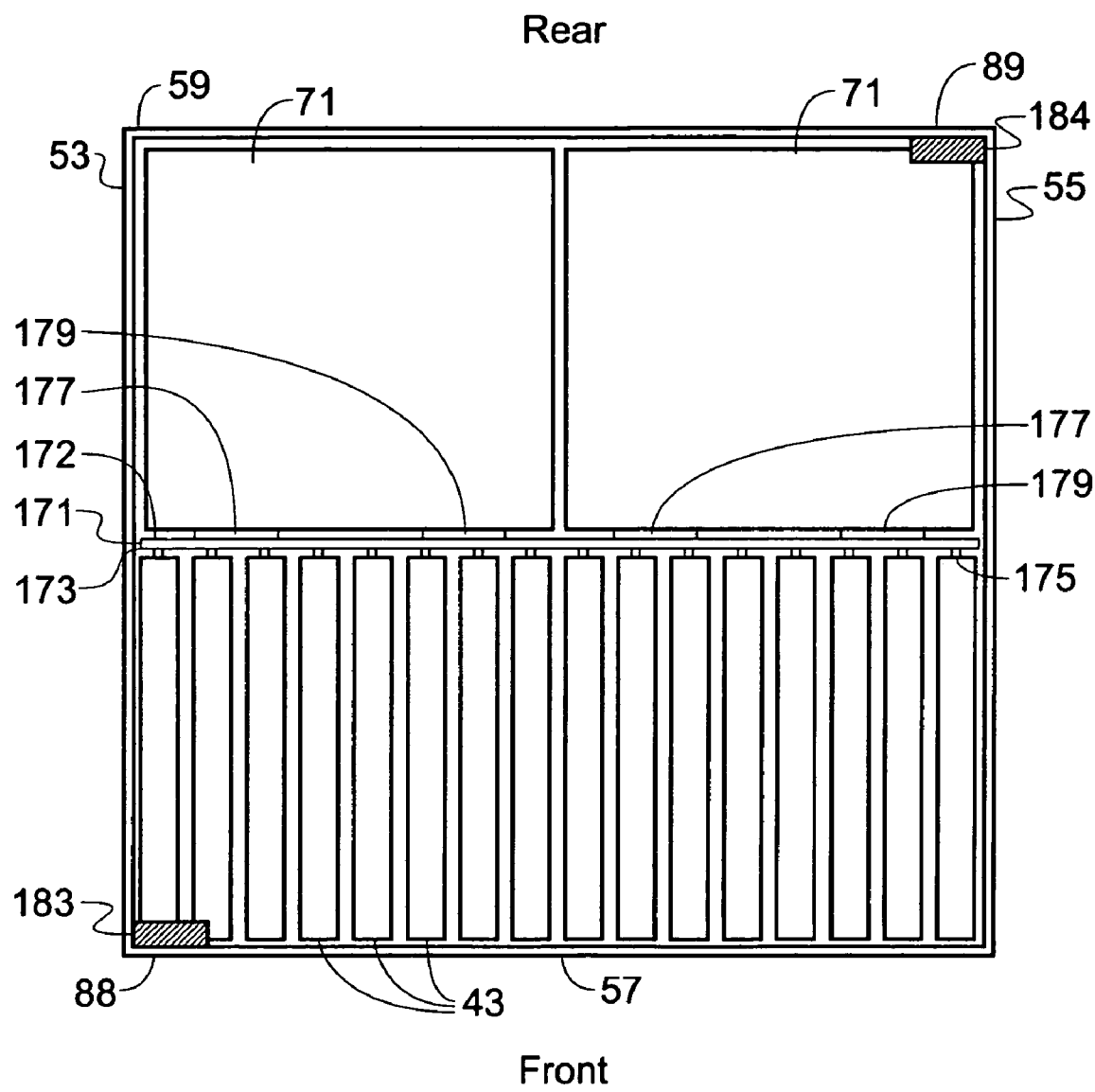
Figure 8B:
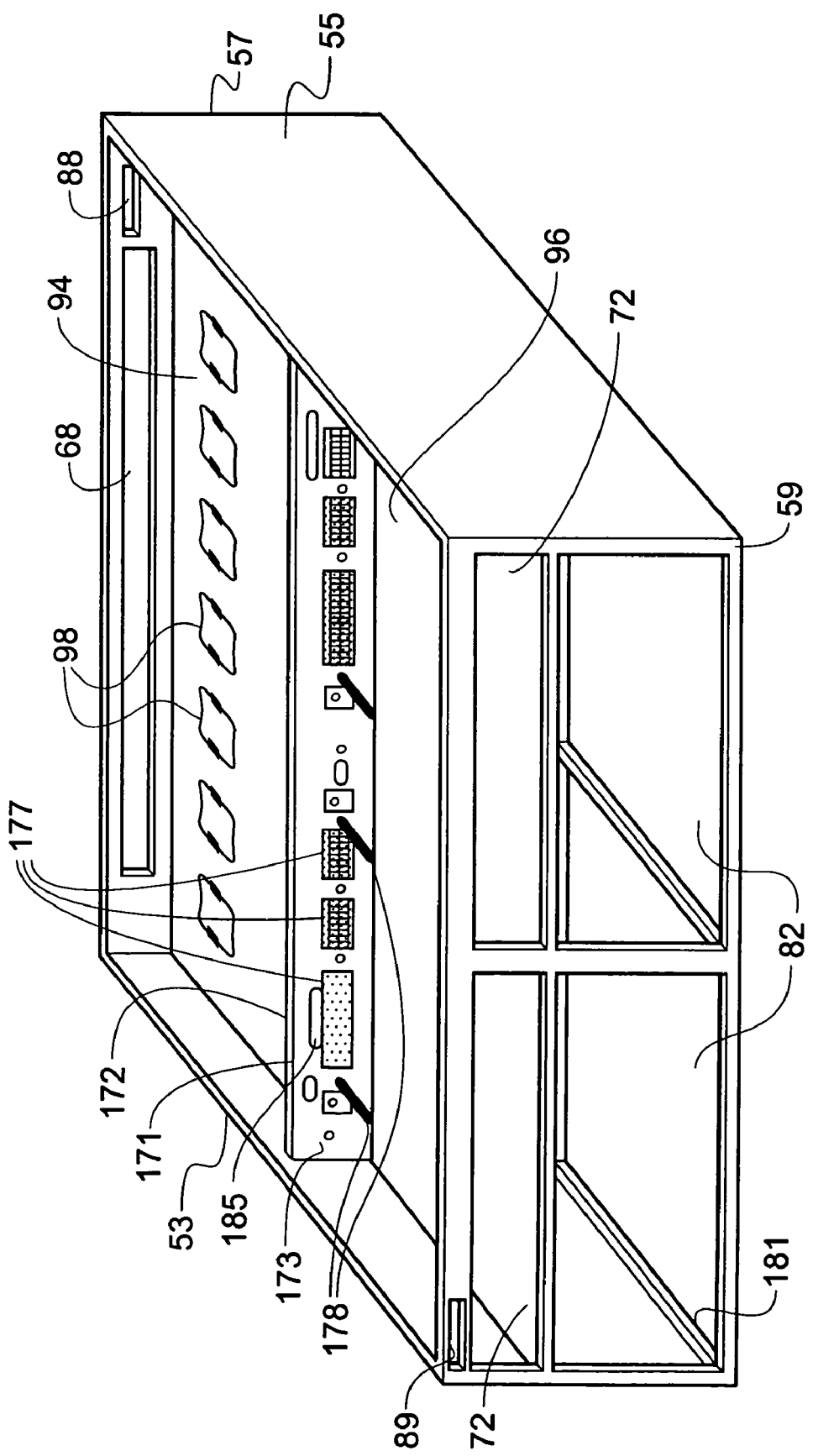
Figure 8D:
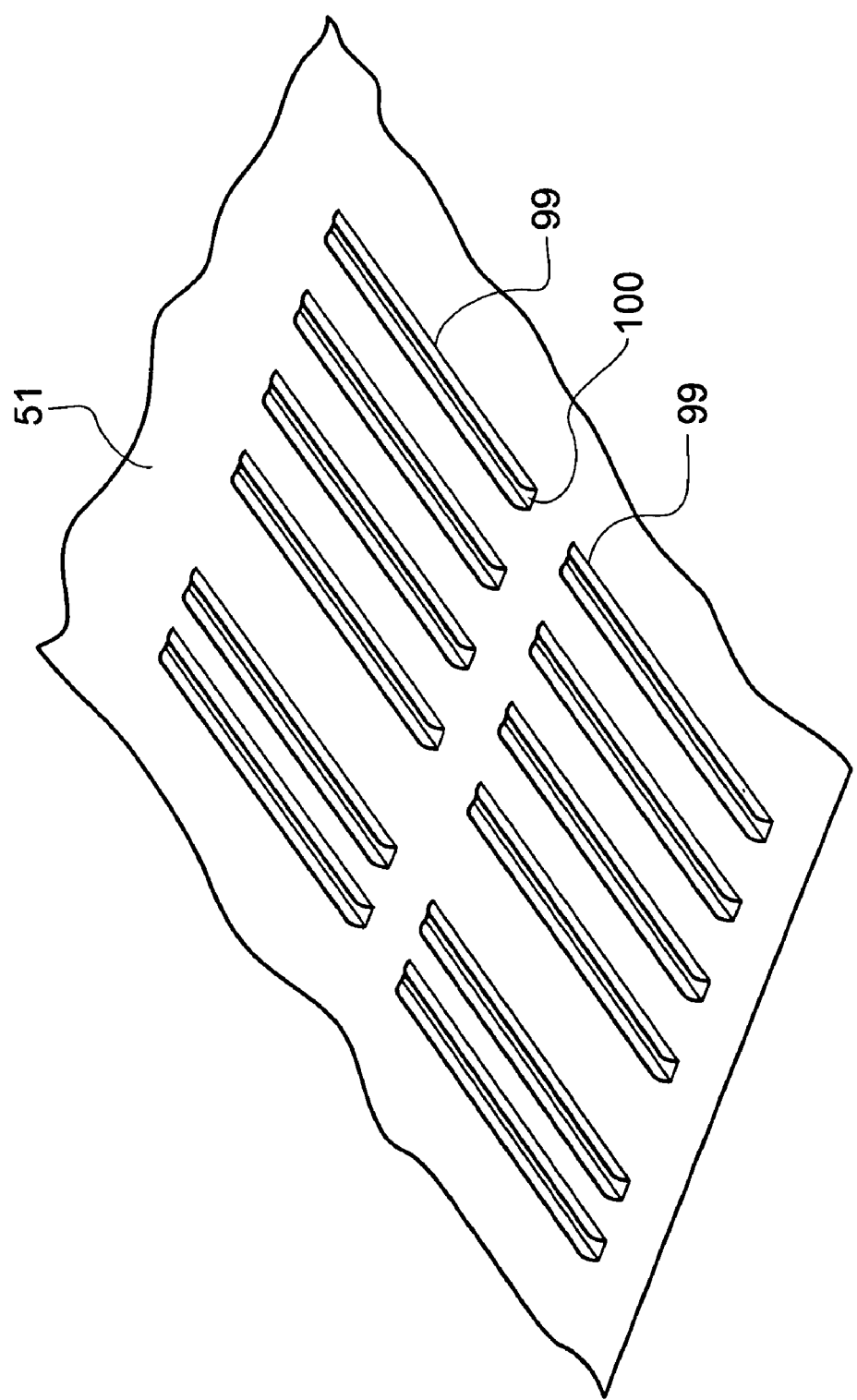
FIG. 8D is a schematic perspective view of a part of a base member of the shelf of FIG. 2.
Figures 9A, 9B, 9C:
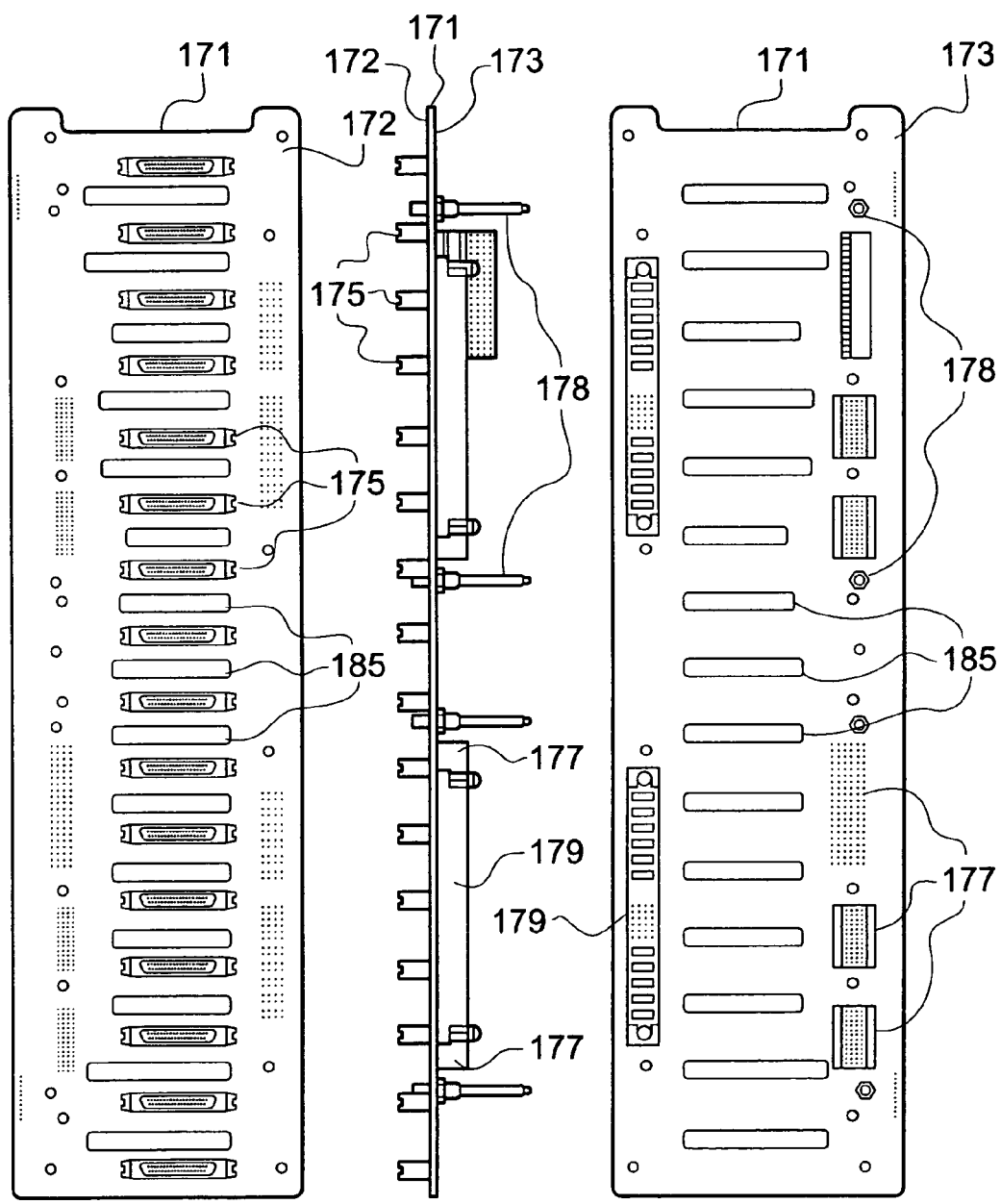
FIGS. 9A, 9B and 9C are schematic front, top and rear views, respectively, of an example of a midplane of the shelf of FIG. 2.

FIG. 8A is a schematic plan view showing the internal configuration of an example of a shelf 41 with the cover 61 removed. FIG. 8B is a schematic perspective view from above the rear of the chassis portion 47 of the shelf enclosure with the field replaceable units removed. FIG. 8C is a schematic perspective view from below the front of the chassis portion 47 of the shelf enclosure with the field replaceable units and the base 51 removed. FIG. 8D is a schematic perspective view from the front and above a part of the base 51 of the shelf 41. FIGS. 9A, 9B and 9C are, respectively, front, top and rear views of the midplane 171. In this example, the midplane is, in use, mounted vertically within the shelf 41 extending across the width W of the shelf 41 at a position approximately half way between the front and the rear of the shelf 41.

The vertically mounted midplane 171 extends, in this example, across the shelf 41 and allows for the electrical interconnection of the FRUs. The various apertures in the front and rear faces 57 and 59 of the shelf 41, in combination with the midplane 171, can be provided with guides (e.g., rails 181) and keying e.g., offset connector positioning for the insertion of the FRUs into the enclosure and midplane 171. The midplane 171 can be a double-sided, or multi-layer printed circuit board (PCB) assembly that can be mounted vertically in a rigid manner within the enclosure. It can carry connectors 175 on a front surface 172 for making electrical connection with corresponding connectors 120 on the information processing cartridges 43. It can also carry connectors 177 and 179 on rear surface 173 for making electrical connection with corresponding connectors 141 and 163 on the CSSPs 71 and the PSUs 81, respectively. Conductive tracks (not shown) on and through the midplane 171 can be provided to interconnect the various connectors. In addition, the midplane can provide connectors for receiving corresponding connectors connected to first and second indicator boards 183 and 184 that each carry a respective set of LED indicators 69. In the present example, the midplane 171 is not configured as a FRU and is not hot swappable. It is perforated to facilitate airflow through the shelf 41. The midplane 171 can include openings 185, which cooperate with openings in the enclosures of the FRUs 43 and 81, to provide a path for cooling air to pass from the front to the rear of the shelf 41, the cooling air being driven by fans in one or more of the FRUs, for example in the PSUs 81, possibly also in the information processing cartridges 43.

A plenum chamber floor member 94 can extend horizontally from the front of the midplane 171 to the front face 57 of the shelf enclosure, or chassis 47. The member 94 provides a floor for a plenum chamber 66, which is supplied with air via the apertures 65 in the front bezel and, in the illustrated example, the slot shaped aperture 68 in the front face 57 of the shelf enclosure 47. Although, for reasons of ease of illustration a slot shaped aperture 68 is shown, a plurality of apertures 68 aligned with the blade receiving locations may be provided. The aperture or apertures 68 can serve both as air vents for a flow of air to the plenum chamber 66, and also as latching locations for latching portions at the top of the injector/ejector levers 111 for the blades shown in FIGS. 5B and 5C. The top and sides of the plenum chamber are provided by the top cover 61 and side faces 53 and 54 of the shelf enclosure 47.

A plurality of cartridge guides 97 can be provided at the underside of the plenum chamber floor member 94. In the present example, these guides comprise sprung wire members, e.g., of a resilient metal such as spring steel, that are attached to the top surface of the plenum chamber floor member 94 and extend through a plurality of apertures therethrough to result in a row of guides 97 at the underside of the plenum chamber floor member 94. This arrangement is shown in FIGS. 8B and 8C. In FIG. 8B, the sprung wire members 98 are shown attached to the top surface of the plenum chamber floor member 94. In the present example, the sprung wire members 98 are arranged in pairs, such that two guides 97 are provided by each spring clip 98. In FIG. 8C, the guides 97 formed by the protruding portions of the sprung wire members 98 are shown at the underside of the plenum chamber floor member 94. Each guide 97 is advantageously positioned so as to interface with the groove 108 in the plastics material in the upper face 104 of a processing cartridge 43 as shown in FIGS. 5A–5C to aid correct alignment and to facilitate insertion of the processing cartridge during insertion of the cartridge into the shelf 41. The use of the spring clip as a guide 97 also serves to urge the processing cartridge downwards to provide a secure mounting of the processing cartridge 43, to take account of manufacturing and operational tolerances and to assist in insertion of the processing cartridge where an operator does not align this absolutely correctly.

A further row of cartridge guides 99 can be provided at the upper surface of the base 51 of the shelf 41. In the present example, as shown in FIG. 8D, these guides 99 have a rail like form, which can be achieved by punching or stamping through the base 51 of the shelf 41. In this example each guide, or rail, 99 includes a pair of upstands separated by an aperture 100 through the base 51. The size of the aperture 100 can correspond to the width between the upstands. The separation of the upstands is selected so that the overall width of the resulting rails is slightly less than the width of a groove formed in the lower face of an information processing cartridge 43. Thus, each guide 97 is advantageously arranged so as to interface with the groove 1113 in the plastics material in the lower face 104 of a processing cartridge 43 as shown in FIGS. 5A–5C to aid correct alignment and to facilitate insertion of the processing cartridge during insertion of the cartridge into the shelf 41.

In the present example, where the guides 97 and 99 are formed from metal, the provision of the grooves 108 and 113 in plastics material at the upper and lower faces, respectively, of each information processing cartridge 43 (see FIGS. 5A–5B) results in a combination of metal and plastics materials that can provide a low friction interaction, facilitating insertion of the information processing cartridges.

If, for example, the information processing cartridge enclosure is made of a metal, it may be undesirable to provide metal guides to avoid a metal to metal interaction. In such a case, for example, it may be desirable to form the guides from a plastics material having a low coefficient of friction, such as polytetrafluoroethene (PTFE) or polythene. Plastics rails could be attached to the underside of the plenum chamber floor member 94 and/or on the upper surface of the base 51 of the shelf 41. In such an example, grooves on the upper and lower faces of the information processing cartridges 43 could then be formed of metal or plastics and still result in a low friction arrangement.

A CSSP/PSU divider 96 can be provided to the rear of the midplane 171 and can extend horizontally to the rear face 59 of the shelf enclosure 47. The CSSPs 71, when inserted, are supported by the divider 96. To aid the correct insertion of the CSSPs 71, CSSP guide pins 178 are provided on the midplane 171 at positions adjacent connectors 177 on the midplane 171 for connection to the CSSPs 71.

Respective positions 88 and 89 can be formed in the front face 57 and the rear face 59 at which first and second indicator boards 183 and 184 supporting the indicator LEDs 69 can be located. These positions 88, 89 therefore include an aperture through the respective face of the shelf enclosure 47 such that indicator LEDs 69 mounted onto a circuit board attached to the inside of the shelf enclosure 47 may be viewed from outside the shelf enclosure.

There now follows are more detailed description of the midplane 171.

As mentioned above, the midplane 171 connects all the elements of a shelf together, including, in the present example, up to sixteen information processing cartridges 43, up to two CSSPs 71, two PSUs 81 and the two indicator boards 183 and 184. In the present example, due to its location within the shelf enclosure, the midplane 171 is not configured to be swappable. Accordingly, to maximize the system reliability, the midplane is configured to provide as a high level of reliability as possible. To this end, the midplane is advantageously configured without active devices and to include the minimum number of decoupling capacitors consistent with good design practice (ideally zero).

The midplane supports a number of paths for various power and signal lines to interconnect the FRUs.

In the present example, each information processing cartridge 43 has a high speed information signal connection (e.g., a Gigabit (Gb) Ethernet SERializer/DESerializer (SERDES) connection) to each of the CSSPs 71, each connection consisting of two pairs of differential signals. In a conventional manner therefore, the tracking of the paths for these signals is arranged to keep the pairs well balanced and on a single signal layer (i.e. without vias) to support such differential signals at high frequency.

In addition, in the present example, each information processing cartridge 43 has a serial console connection to the CSSP cartridge 71. Each connection consists of two TTL (Transistor-Transistor Logic) level signals that make a transmit and return (TX and RX) pair.

Also, each PSU 81 has a management signal connection (e.g., a serial I2C (Inter-IC Bus) connection) to the CSSP cartridge 71 to control power and monitor environmental parameters. The I2C bus comprises of two signals SCL and SDL (serial clock line and serial data line). In addition, an I2C address programming pin is provided for the PSUs 81.

Each information processing cartridge 43 and PSU 81 can signal to the CSSP cartridge 71 that it is inserted by pulling to ground (GND) a respective Inserted_L signal (i.e., an active low signal). These signals are fed to the CSSP cartridge 71 via the midplane 171.

Each PSU 81 has five 12 Volt output rails. The routing from each PSU 81 is arranged so that a fault in any single FRU cannot completely interrupt the power to any other.

As mentioned above, the midplane 171 is provided with appropriate connector arrangements for receiving the connectors on the FRUs.

In the present example, the information processing cartridge 43 connects to the midplane 171 through a 40 pin Single Connector Attachment (SCA-2) connector as defined by the Small Computer Systems Interface (SCSI) standard. Accordingly, the midplane carries corresponding connectors 175.

In the present example, each CSSP cartridge 71 connects to the midplane 171 through a two right-angle 20 pair connector (e.g., 2 mm HM-Zd connectors available from Tyco Electronics). The corresponding connectors 177 on the midplane are straight male parts with a power connector. A guide pin arrangement is provided in addition to the connectors to prevent misaligned modules causing bent pins during insertion. The guide pin also provides a leading ground. The CSSP cartridge 71 also connects to the midplane 171 through a right-angled 125 way 5 row 2 mm connector. The connector 177 on the midplane 171 includes a straight male part. A guide pin arrangement is provided in addition to the connectors to prevent misaligned modules causing bent pins during insertion.

In the present example, as mentioned above, each PSU 81 connects to the midplane 171 through an SSI-MPS specification connector. The contacts are configured 5P/24S/6P with sequenced signal (S) and power (P) pins. Where the connector on the PSU is a 1450230-1 R/A male header, solder tails connector, the mating connector 179 on the midplane can be a 1450540-2 vertical receptacle, press-fit connector.

In the present implementation, indicator boards 183 and 184 (see FIG. 8A) are provided at the front and rear of the system and are configured as FRUs. In this example they hold three system-level indicator LEDs 69 and include a FRU identity (FRU-ID) programmable read-only memory (PROM) each. Three LEDs 69 are present on the indicator board. There can, for example, be a white locator LED that can be switched by the user for locating the system; a green power-on LED to indicate when the system is powered; and an amber service-required LED to indicate a fault or other condition requiring servicing. These LEDs can be driven by the CSSP 71.

In the present example, identification information (FRU ID) for the midplane 171 is held on an I2C electrically erasable programmable read only memory (EEPROM) in the front indicator board 183. In addition to the I2C signals necessary to access the FRU ID EEPROM, the CSSPs 71 provide a current limited supply to the indicator boards 183 and 184 via the midplane. The indicator boards 183 and 184 are also provided with an I2C address programming pin. Depending on the implementation, FRU ID information can be stored instead, or in addition, on the rear indicator board 184.

As the FRU-ID for the midplane 171 is held on one or both of the indicator boards 183 and 184, the midplane can be a totally passive unit. The FRU-ID PROMs communicate with the CSSPs 71 via an I2C bus. Each device on the bus has a separate I2C address. The lower three I2C address bits of the EEPROMs used are available as pins on the device, to allow programming with resistors. The least significant bit of this address (A0) is passed to the midplane via the corresponding connector. This allows the midplane 171 to program the address of the FRU-ID differently for the front and rear indicator boards 183 and 184, by pulling the address low for the front board and high for the rear indicator board 183. This ensures that both EEPROMS are available on the bus, at different addresses. The FRU-ID for the midplane can be stored on either front or rear EEPROM, but the present example the FRU-ID is stored in the EEPROM on the front indicator board 183. The EEPROM can be 8 kByte or larger.

As mentioned above, the midplane 171 includes openings 185 to provide a ventilation path for cooling air passing through the shelf 41. The cooling air passing through the shelf 41 via the midplane 171 can be driven by means of fans provided in each of the information processing cartridges 43 and the power supply modules 81. The openings 185 shown in FIGS. 8B, 9A, 9B and 9C form schematic representations of openings in the midplane 171. In practice, the openings could have any form (i.e., a series of large openings, or a number of small perforations), arranged on the midplane to align with corresponding openings or ventilation apertures in the various field replaceable units 43, 71 and 81. In this way, the path of the airflow from the front of the shelf to the back of the shelf can be configured to be as efficient as possible, depending on the detail configuration of the fan units and the ventilation openings or apertures in the information processing, switch, service processor and power supply unit modules 43, 71 and 81. Providing the fan units in the field replaceable units 43, 71 and 81, contributes to the aim of maintaining the chassis 49 and the midplane 171 of the shelf 41 free of active components, thereby minimising cost, and facilitating maintenance. Also, by providing the fan units in each of the field replaceable units, merely inserting and removing field replaceable units automatically adapts the flow of cooling air to the number and type of field replaceable units inserted in the shelf 41.

As described above, in the present example each of the FRUs is designed to be a non-user serviceable unit. Thus each FRU presents the user with a "sealed" unit which may be inserted into and removed from the shelf 41 as desired or required. If a FRU ceases to be operable, then the user has a choice only of returning the FRU to a supplier or service company for repair or of discarding the non-operable unit. As the FRUs are non-user serviceable, there is no requirement for a skilled technician to be employed in inserting or removing the FRUs into or from a shelf 41. Thus each FRU is designed such that a non-skilled person should have difficulty in causing damage to the FRU during handling. Moreover, the configuration and construction of the FRUs (e.g., the injector/ejector levers, the grooves in the enclosures of the information processing units, etc), of the shelf enclosure and the midplane (e.g., the guide rails to guide insertion of the FRUs, the locating pins, etc) contribute to facilitating easy insertion and removal of the FRUs.

Figure 10:
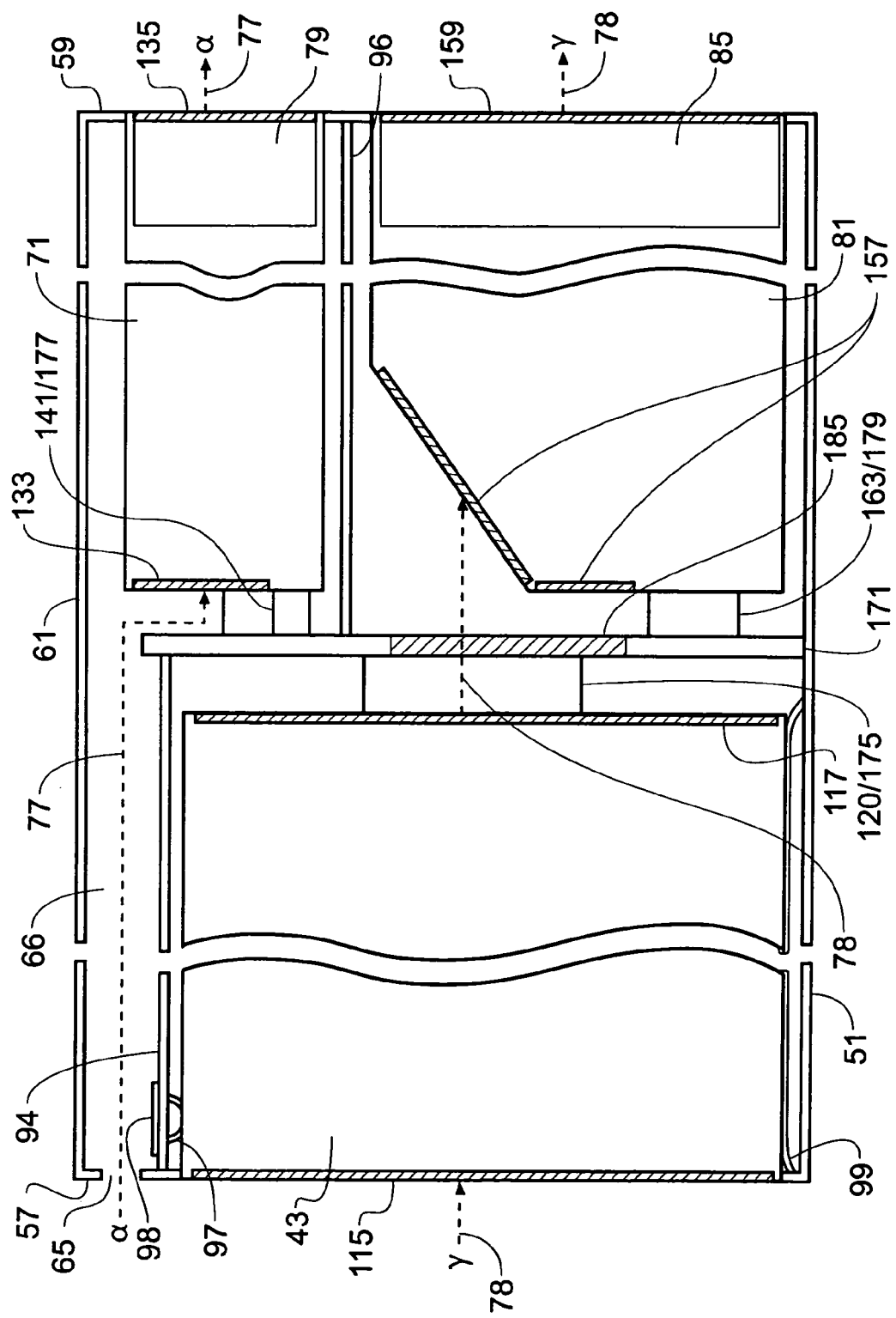
FIG. 10 is a schematic cross section view through the shelf of FIG. 2.

Shown in FIG. 10 is an example of the flow of cooling air through the shelf 41 and FRUs 43, 71, 81 mounted therein.

In this example, the cooling air passing through the shelf 41 is drawn generally in a front to rear direction through the shelf 41 by cooling fans mounted within the CSSPs 71 and the PSUs 81. Two separate flow paths for cooling air are provided in this example. The first, indicated as flow path αα by dotted lines 77 provides cooling air to the CSSPs 71. The second path, indicated as flow path γγ by dotted lines 78 provides cooling air to the information processing cartridges 43 and PSUs 81.

The flow of cooling air along path αα enters the shelf 41 through the aperture(s) 65 in the front face 57 of the shelf enclosure 47 into the plenum chamber 66. Further apertures (not shown) could also be provided in the side faces 53 and 55 of the shelf enclosure 47 to allow air to flow into the plenum chamber 66. This air then flows through the plenum chamber 66, and passes over the top edge of the midplane 171 to reach the perforations 133 of the front face of the CSSPs 71. The cooling air then passes through the CSSPs 71, providing cooling to the components thereof before passing out of the CSSPs 71 through the perforations 135 in the rear face of the CSSPs 71 thus being exhausted from the shelf 41. This flow of cooling air along flow path αα is driven by fans 79 mounted within the CSSPs 71. In the present example, a pair of fans 79 is provided within each CSSP 71 and is mounted against the rear face thereof.

Air flowing along path αα is impeded from flowing around the processing cartridges 43 by plenum chamber floor member 94 and is impeded from flowing to the PSUs 81 by CSSP/PSU divider 96. This flow path αα therefore ensures that air flowing to the CSSPs 71 is not warmed by passage though the processing cartridges 43 and therefore provides maximum efficiency cooling to the CSSPs 71.

The flow of cooling air along path γγ enters the shelf 41 through the perforations 115 in the front face of the information processing cartridges 43. The air thus enters the information processing cartridges 43 and provides cooling to the components thereof. Cooling fans (not shown) within the information processing cartridges 43 direct the cooling air to the processor (CPU) of the information processing cartridge and direct the flow of air in the cartridge thereby increasing cooling efficiency. The air then exits the information processing cartridges 43 through the perforations 117 in the rear face thereof. The air then passes through the apertures 185 through the midplane 171 to reach the PSUs 81. This cooling air then passes though the perforations 157 on the front and upper front faces of the PSUs 81 to enter the PSUs and provide cooling to components thereof. It will be appreciated from FIG. 10 that the sloping rear of the upper face of the PSUs 81 increases the area over which air can be drawn into the PSUs, thereby reducing the back pressure on the air flowing through the shelf unit and aiding the cooling efficiency. The flow of cooling air along path γγ is driven by fans 85 mounted within the PSUs 81. In the present example, a pair of fans 85 is provided within each PSU 81 and are mounted against the rear face thereof.

Air reaching the PSUs 81 via path γγ will already have passed through the processing cartridges 43. Such air will therefore be already warmed above the ambient temperature outside of the shelf 41 by its passage through the processing cartridges 43. However, as the cooling requirement of the PSUs 81 is typically less than that for the CSSPs 71, this does not cause any difficulty in the operation of the PSUs 81, which are adequately cooled by this flow of pre-warmed air. The pre-warmed air passing through the apertures 185 through the midplane 171 is impeded from flowing into path αα and entering the CSSPs 71 by the SCCP/PSU divider 96.

As will be appreciated by the skilled addressee, the arrangement shown in FIG. 10 is illustrative only and other arrangements whereby, for example, a mixture of cool air from the plenum chamber 66 and warmed air from the processing cartridges 43 is provided to each rear-mounted FRU can readily be constructed.

Figure 11:
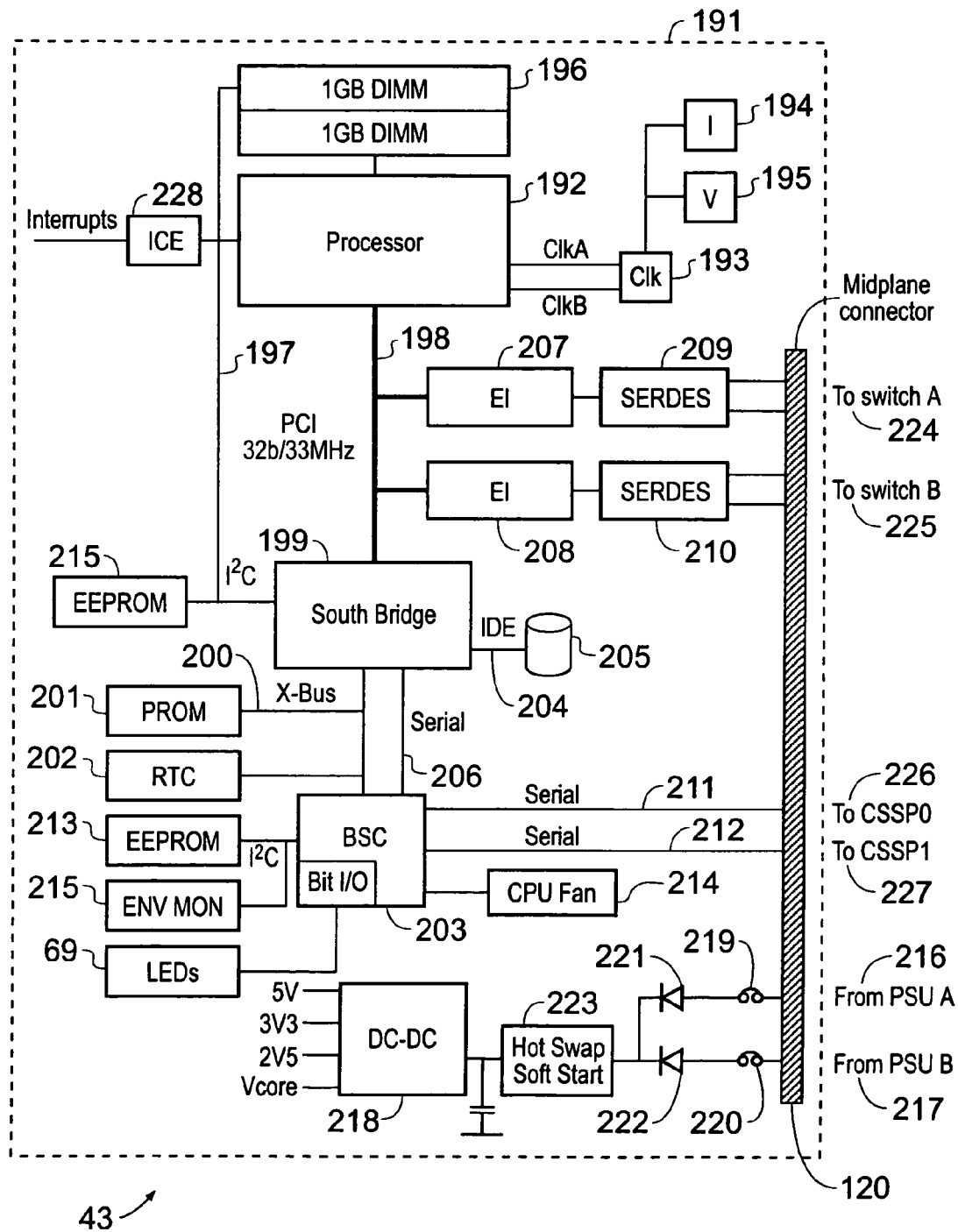
FIG. 11 is a functional block diagram of an example of an information processing subsystem for the information processing cartridge of FIG. 5.

With reference to FIG. 11, there now follows a description of functional elements of an information processing cartridge 43 as contained within the information processing cartridge enclosure 101.

The information processing cartridge 43 includes a microprocessor 192 (a non-limiting example of a microprocessor that can be utilised in the present example is an UltraSPARC™ processor). The microprocessor is mounted on an information processing cartridge motherboard 191.

A configurable clock generator 193, configured as a programmable clock synthesizer employing a crystal, can be used to produce CPU clock signals, CLKA and CLKB. The clock frequency can be determined by jumper settings (not shown). A vectored interrupt controller (I-Chip) 194 and a configurable core voltage regulator module (VRM) 195 are provided.

In the present example, memory means for use by the processor 192 when executing instructions can be provided in the form of buffered dynamic random access memory (DRAM), for example configured as dual in line memory modules (DIMMs) 196 with a 72-bit data path with error correction codes (ECC), seated in two sockets on a riser card from the information processing cartridge motherboard 191. The memory capacity can be chosen to suit the processor addressable memory space. For example, in the present example, up to 4 Gigabytes (4 GB) of addressable memory can be provided. Serial Presence Detect (SPD) auto-configuration is provided via a Service Management Bus (SMBus) over an I2C bus 197.

In the present example, a PCI bus architecture can be employed with a so-called SouthBridge bus bridge 199 with SuperIO and two Gb Ethernet Media Access Control (MAC) devices. As described above, however, other bus protocols (e.g., Infiniband) can be used. A 32 bit PCI bus 198 can be provided from the microprocessor 192. The SouthBridge 199 is a standard form of bus bridge, in the present example packaged in a 352 pin PBGA (Plastic Ball Grid Array) package, that provides the following functions: an SM Bus interface over the I2C bus 197 for access to the SPD (Serial Presence Detect) feature of the DIMMs that allows initialization of the memory controller; an Xbus interface for access via an Xbus 200 (which is a packet switched multiprocessor bus) to a PROM 201, a real time clock (RTC) 202 and an information processing cartridge service controller (hereinafter termed a Blade Service Controller (BSC)) 203; an IDE (Integrated Drive Electronics) interface that provides an ATA-100 (AT Attachment) IDE connection 204 to an IDE disk drive 205; and a serial console interface on a service bus 206 to the BSC 203 that is used for operating system functions including a console function with this embodiment.

For IO to the midplane 171, two AC-coupled Ethernet interfaces 207 and 208 are provided in the present example, which are packaged in a 316 pin PBGA. These Ethernet interfaces can provide a PCI attached Ethernet MAC capable of operation up to Gigabit Ethernet performance. The physical layer can be implemented using SERializer/DESerializers (SERDESs) 209 and 210. An example of a SERDES device is the TLK2201 transceiver manufactured by Texas Instruments, Inc. The SERDES devices use differential PECL TX+/− and RX+/− (Positive Emitter Coupled Logic Transmit and Receive) pairs to communicate to the switch portions of the CSSPs 71 over the midplane 171. The RX+/− pairs can be AC coupled at the information processing cartridge 43, the TX+/− pairs can be AC coupled at each CSSP 71. This facilitates hot-swap of the information processing cartridges 43 and the CSSPs 71.

Asynchronous serial connections 211 and 212 for communication between the BSC 203 and the Service Processor parts of the CSSPs 71 can be provided.

Internal data storage can be provided in the present example by a hard disk 205 with a capacity of 30 GB or more rated for 24/7 continuous operation. The hard disk 205 is accessed using the primary IDE interface of the SouthBridge 199. The hard disk 205 can hold an operating system, for example a Solaris operating system, and other software and data for performing information processing using the main, or host, processor (CPU) within the information processing cartridge 43.

In the present implementation, the BSC 203 can be implemented as a microcontroller (e.g., a Hitachi H8 microcontroller). The BSC 203 can provide various functions, including for example: dual access (for the information processing cartridges and the CSSPs 71) to PROM 201 and EEPROM 213 for boot information and a FRU-ID for the information processing cartridge; channelling communication between an information processing cartridge 43 and the service processor part of the CSSPs 71; control of power on reset (POR), system reset and externally initiated reset (XIR) to the microprocessor 192; control of the power, service-required and ready-to-remove LEDs 69; upgrading of field-upgradable firmware, via the serial interface; a watchdog function for the operating system; monitoring the speed of a CPU fan 214; and communications with an EEPROM 215 and the operating system via the Xbus 200.

In the present example, the BSC 203 can be powered by a 5V service bus (SB) rail as soon as a CSSP 71 and a PSU 81 are fully inserted into the midplane 171, it then turns on other DC/DC converters to provide power to the remainder of the information processing cartridge 43. A BSC reset signal can be derived from a simple conventional power on reset (POR) generator that monitors a 5V supply rail.

In the present example a 1 MByte Flash PROM 201 can be provided for storing boot variables for OpenBoot™ PROM (OBP) and Power-On-Self-Test (POST). Further OBP variables can be stored in a second 16 kByte (16 kB) I2C PROM 215, accessible via the SouthBridge SM Bus port over the IC Bus 197. The PROM 215 can contain 8 kByte for OBP variables and 8 kByte of unused space. A 16 kByte I2C EEPROM 213 that is accessible via the BSC 203 can contain BSC variables and FRU-ID variables. The EEPROM is nominally divided into 8 kByte for FRU-ID and 8 kByte for the BSC variables. Write protection for the FRU-ID is implemented by BSC firmware. Such write protection may be carried out by, for example, acknowledging instructions to write to the protected area, but not to carry out those write instructions.

An environmental monitor sensor 215 can be provided to monitor the CPU and ambient temperatures. This sensor can be accessible via the onboard I2C bus from the BSC 203.

The information processing cartridge 43 can be powered from two, diode commoned, 9V power supply rails 216 and 217. DC/DC converters 218 can be used to provide the voltage levels required by the information processing cartridge 43. The DC/DC converters 218 are supplied by dual 9V inputs 216, 217, individually fused 219, 220 and then diode commoned 221, 222. A 5V DC/DC converter can be turned on as soon as the FRU is fully inserted, with the BSC 203 and required portions of the SouthBridge 199 being powered (the 5VSB rail). A field effect transistor (FET) can be used to gate off the main 5V supply to the rest of the information processing cartridge 43. The DC/DC converter outputs and the main 5V FET can be arranged not to turn on until the BSC 203 turns them on via a signal from the SouthBridge 199. The SouthBridge 199 can be used so that if the BSC 203 is reset (by a watchdog timeout or after a firmware download) the state of the DC/DC converters 218 is not affected. When the remaining outputs from the DC/DC converters 218 are within specification, a PWR_GOOD signal can be asserted low to the BSC 203.

A SouthBridge resume circuit can be operable to run from 3V3, and a simple Zener diode dropper circuit can be used to generate 3V3 from the 5VSB supply.

When the FRU is inserted the inrush current can be limited, for example to <1 A, and the rate of rise can be configured not to exceed a predetermined value (e.g., 20 A/s) to provide a so-called soft start to facilitate hot-insertion. The intent is to prevent damage to the connectors and to avoid generating noise. A soft start controller 223, which controls a ramping-up of voltage levels, can be enabled when the predetermined signal (Inserted_L signal) is asserted low, this signal is on a short pin in the connector and is connected to ground (GND—not shown) through the midplane 171.

In the present example, a processor impingement fan (processor fan) 214 is configured to run at full speed to cool the information processing cartridge 43 and the fan. The speed of the processor fan and sink can be monitored by the BSC 203, using a tachometer sense pin on the microcontroller. In the event of the fan speed falling below a predetermined speed, or percentage of its nominal speed (e.g., 80%), the BSC 203 can be arranged to issue an alert. The nominal speed of the fan can be recorded as part of the BSC EEPROM contents.

The midplane connector 120 for the information processing cartridge 43 is used to establish the connection between the information processing cartridge 43 and the midplane. In the present example it supports up to 84 connections (pins) that will deliver SERDES outputs 224, 225, I2C signals 226, 227, and power 216, 217. Signal connections may be made through a right-angled connector. Power connections may be made through the information processing cartridge right-angled connector. The connector can be configured to facilitate hotswapping of the information processing cartridge, for example by having a low insertion force and/or guide pins to increase the ease of serviceability and prevent module misalignment during insertion.

Interrupts to the processor 192 can be encoded using an encoded interrupt vector mechanism. An I-Chip Emulator (ICE) 228 functions as an interrupt concentrator, receiving all system interrupts and encoding them as an interrupt vector according to an interrupt vector code utilisable by the processor 192. In the present example, where an UltraSPARC™ processor is used, the interrupt vector encoding may be based on a 6-bit interrupt vector code.

Figure 12:
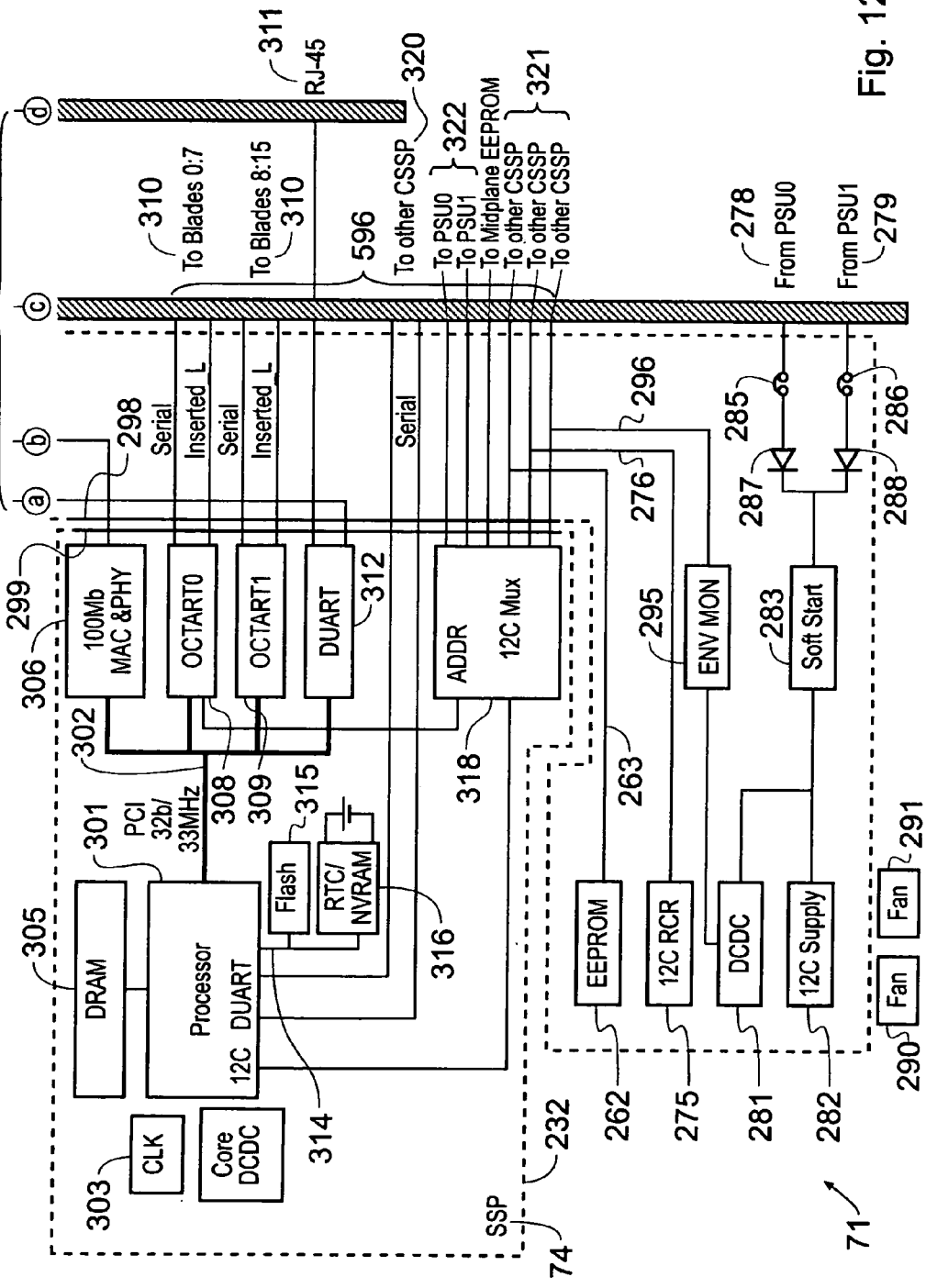
FIG. 12 is a functional block diagram of an example of an information processing subsystem for the combined switch and service processor module of FIG. 6.

With reference to FIG. 12, there now follows a description of an example of a combined switch and service processor (CSSP) 71. In the present example, each CSSP 71 provides the functionality of a Switch 73 and of a Shelf Service Processor, or Shelf Service Processor (SSP) 74.

FIG. 12 provides an overview of the functional components of the CSSP 71 including functional components of the Switch 73 and functional components of the SSP 74. In the present example, most of the components relating to the Switch 73 are mounted on a Switch PCB 231, and the components relating to the SSP 75 are provided on a SSP PCB 232. However, it should be noted that the components located in the lower portion of the switch PCB 321 (i.e., that portion below the SSP PCB 232 as illustrated in FIG. 12 logically belong to the SSP 74, rather than to the switch 73. It will be appreciated that such component arrangements are not compulsory for successful operation and that any other component arrangement over any number of component boards can be easily achieved using conventional component arrangement techniques.

Firstly, with reference to FIG. 12, there follows a description of functional elements of the Switch portions 73 of a CSSP 71 as contained within the CSSP enclosure 121.

The midplane connector 141 on the CSSP 71 establishes the connection between the CSSP 71 and the midplane 171. In the present example, it supports up to 84 connections (pins) that will deliver SERDES outputs 265–268, I2C signals 310, 320, 321 and 322, and power 278, 279. Signal connections may be made through two 20-pair right-angled connectors. Power connections may be made through a right-angled connector. The connector can be configured to facilitate hotswapping of the board, for example with a low insertion force. The connector also uses guide pins to increase the ease of serviceability and prevent module misalignment during insertion.

A switch microprocessor 240 is provided, in the present example the microprocessor used is a Power PC (MPC8245) packaged in a 352 pin Tape Ball Grid Array (TBGA) package. This microprocessor 240 supports between 1 MB and 2 GB of address space in the present example. It further includes an Embedded Programmable Interrupt Controller (EPIC) that provides 5 hardware interrupts (IRQs) or 16 serial interrupts. There are 4 programmable timers with cascade mode function. DRAM memory for the processor can provided in the present example by a commodity DIMM 242. The processor 240 can be connected to a 32 bit PCI bus 241, which operates at, for example, 33 MHz/66 MHz.

A clock input to the processor 240 can be provided by a clock generator (CLK) 243. The CLK 243 can include a configurable clock generator (not shown) implemented as a programmable clock synthesiser employing a crystal used to produce CPU clock signals. The clock frequency can be determined by jumper settings (not shown). A vectored interrupt controller (I-Chip) (not shown) and a configurable core voltage regulator module (VRM) (not shown) can be provided that operate substantially as described above with reference to the like components of FIG. 11.

In the present embodiment two switch ASICs (application specific integrated circuits) 244, 245 are provided (in the present example, BCM5632 Gigabit switch ASICs). Each ASIC can provide twelve GMII Interfaces (1 Gigabit Ethernet) (for uplinks and downlinks) and one 10 Gb XGMII interface for chip-to-chip communication (bridging) 246 between the ASICs 244 and 245. Sixteen GMII 1 Gb 'downlinks', in the form of serialized Gb Ethernet data, are provided through four quad SERDES 248–251 to allow each information processing cartridge 43 to communicate with the switch 73. Eight GMII 1 Gb 'uplinks' are provided for external communication through two quad PHYs 253 and 254 (in the present example BCM5404 ASICs) and RJ45 connectors on the rear panel 122. The ASICs 244 and 245 are configured via a PCI interface (32 bit/33 MHz) to the PCI bus 241.

A Flash PROM 256 can store a real time operating system, and management and configuration data for the microprocessor. The Flash PROM 256 in the present example can be operable to hold 8 MB–16 MB of data, depending on the software required. The flash PROM 256 can be operated via an on-chip XBus 258.

Also connected to communicate with the processor 240 via the XBus 258, a Real Time Clock (RTC) 259 can be provided for real-time functions with a back-up battery.

Also connected to the XBus 258 can be a UART (Universal Asynchronous Receiver Transmitter) 260 which in turn connects to a serial bus 261 for providing an asynchronous console connection from the switch 73 to the SSP 74 which can be accessed by the SSP.

An integrated MAC/PHY (Media Access Control/Physical) switch 271 can provides its own interface to the PCI bus 241. This MAC/PHY switch 271 can connects to a 10/100 Ethernet hub 272. The hub 272 can be operable to provide a management interface to the SSP 74 and a connection from an external management network to the switch 73 and SSP 74 of a given CSSP 71. The connection from the integrated MAC/PHY device 271 to the SSP 74 can be coupled capacitively. A loopback mode can be provided by the MAC/PHY device 271 for system diagnostics. The hub 272 can connect to an RJ45 connector 273 on the rear panel 122 of the CSSP enclosure 121.

An 8 kByte I2C EEPROM 262 can be used to store the FRU-ID and is accessible by the SSP portion 74 of each CSSP 71 via a serial bus 263 and the midplane 171. The upper 2 kByte of the EEPROM 262 can be configured to be write protected.

An I2C Redundant Control Register (RCR) 275 can be used to provide an alternate, redundant path for powering-down the CSSP 71 and Shelf Level Indicators 69 mounted on the front 57 and rear 59 panels of the shelf 41. The I2C RCR 275 can be accessible by both the SSP 74 of the CSSP 71 containing the RCR and the SSP 74 of a further CSSP 71 connected via the midplane 171 via an I2C bus 276. In the present example, a device suitable for use as the RCR 275 is a Phillips PCF8574 IC.

With continued reference to FIG. 12, there now follows a description of functional elements of the Shelf Service Processor (SSP) portion 74 of a CSSP 71 as contained within the CSSP enclosure 121 and provided on an SSP PCB 232.

In the present example, communication between the Switch PCB 231 and the SSP PCB 232 is facilitated by an interboard connector pair 298 and 299. It supports connections (pins) for I2C signals, 10/100 MAC/PHY output, and power. As described above, the switch PCB 231 carries the components associated with the switch, and it also carries the power, FRU-ID and environmental monitoring components along with the connectors for connections to the midplane 171 and external connectors. Thus, in the present example, all SSP components requiring a connection to the midplane 171 or an external connection have signal paths routed through the connector pair 298, 299 and via the switch PCB 231 to the relevant midplane or external connectors.

In the present example, the SSP 74 includes a microprocessor 301 (e.g., a Power PC (MPC8245) processor) mounted on the SSP printed circuit board (PCB) 232. The processor 301 can be connected to a PCI bus 302, the present instance a 32 bit bus that operates, for example, at 33 Hz/66 MHz.

A clock input to the processor 301 can be provided by a clock generator (CLK) 303. The CLK 303 can comprise a configurable clock generator (not shown) implemented as a programmable clock synthesiser employing a crystal used to produce CPU clock signals. The clock frequency can be determined by jumper settings (not shown). A vectored interrupt controller (I-Chip) (not shown) and a configurable core voltage regulator module (VRM) (not shown) can be provided that operate substantially as described above with reference to the like components of FIG. 11.

The processor 301 can be provided with a DRAM memory 305. The memory capacity can be chosen to suit the processor addressable memory space. In the present example, 8 MB of DRAM memory is provided.

An integrated MAC/PHY switch 306 can provide its own interface to the PCI bus 302. The MAC/PHY switch 271 can be connected to 10/100 Ethernet hub 272 via the interboard connectors 298, 299. A loopback mode can be provided by the MAC/PHY switch 306 for system diagnostics.

Octal UARTs 308 and 309 can be connected between the PCI bus 302 and the interboard connector pair 298, 299. The signal path can be continued from the interboard connector pair 298, 299 to serial connections 310 on the midplane connector 141 on switch PCB 231. The Octal UARTS 308, 309 can facilitate serial communications between the SSP 74 and each of the processing cartridges 43.

Also connected to the PCI Bus 302 can be a dual UART (DUART) 312 that in turn can connect via the interboard connectors 298, 299 to serial bus 261 for providing an asynchronous console connection from the SSP 74 to the switch 73. The DUART 312 can also have an I2C connection to an external connector on the rear face 122 of the CSSP enclosure 121. The external connector can provide a common operating system/boot console and command port 311.

Connected to the processor 301 via an XBus 314 can be a Flash PROM 315. The Flash PROM 315 can store a real time operating system, and management and configuration data for the microprocessor 301. The Flash PROM 315 can be operable in the present example to hold up to 2 MB of data, depending on the software required.

Also connected to the processor 301 via the XBus 214 can be a real time clock (RTC) 316 for real-time functions with a backup battery. The RTC 316 can also provide 8 kByte of non-volatile random access memory (NVRAM), in the present instance implemented as an EEPROM. This can be used to contain information such as the FRU-ID, a serial number and other FRU information.

To facilitate I2C communications between the SSP 74 and the other CSSP 71, the midplane 171 and the PSUs 81, a multiplexer 318 can be provided. The multiplexer 318 can have a single I2C connection to the processor 301 and connections, via the interboard connector pair 298, 299 and the midplane connector 141 to both PSUs 81, the midplane 171 and the other CSSP 71.

The processor 301 can also comprise an embedded DUART to provide a redundant serial link to the SSP 74 of the other CSSP 71. Although it would be possible to implement this link using an external DUART, the advantage of using an embedded DUART is that the connection to the other CSSP is reliable and therefore likely to be functional. Where the embedded DUART link does not use the I2C Multiplexer for communications to the other CSSP, a common mode of failure for both the SSP—SSP I2C links can be avoided, it being assumed that the processor 301 is likely to be functional even if both embedded DUART channels are non-functional.

The CSSP 71 can powered from two, diode commoned, 9V power supply rails 278 and 279. DC/DC converters 281 can be used to provide the voltage levels required by the CSSP 71. The DC/DC converters 281 can be supplied by dual 9V inputs 278, 279, individually fused 285, 286 and then diode commoned 287, 288. A soft start controller 283 can be provided to facilitate hot-insertion. A 5V DC/DC converter (I2C power regulator) 282 can be turned on as soon as the CSSP 71 is fully inserted. A 3.3V DC/DC converter can be turned on when instructed, for example through SSP service software, by asserting low an appropriate signal (ON_L—not shown). The 3.3V converter can be arranged to turn on a converted for 2.5V, 1.2V, and a processor core voltage rail (Vcore) when the voltages are within an appropriate range.

When the CSSP 71 is inserted the inrush current can be limited, for example to <1 A, and the rate of rise can be configured not to exceed a predetermined value (e.g., 20 A/s) to provide a so-called soft start to facilitate hot-insertion. The intent is to prevent damage to the connectors and to avoid generating noise. A soft start controller 283, which controls a ramping-up of voltage levels, can be enabled when the predetermined signal (Inserted_L signal) is asserted low, this signal is on a short pin in the connector and is connected to ground (GND—not shown) through the midplane 171 until one of the supplies is removed. These circuits can be configured to withstand an overvoltage at their inputs whilst the input they are feeding is not powered, without any leakage to the unpowered circuit. A sense circuit can detect if the voltage has dropped below a threshold, for example 2.0V, as a result of a blown fuse, a power rail going down, etc. The DC/DC converters 281 can be protected against short circuit of their outputs so that no damage occurs.

The I2C regulator 282 can be powered as soon as the CSSP 71 is fully inserted into the midplane 171. This can be facilitated through short pins connected to the soft start controller 283, which controls a ramping-up of voltage levels. The other DC/DC regulators can be turned on, for example by SSP software.

A pair of fans 290, 291 can provide cooling to the CSSP 71. The fans 290, 291 can be configured to run at full speed to prevent overtemperature conditions by minimizing the temperature of the internal components and the fan. The speed of the fans 290, 291 can be monitored by the SSP 74 through an environmental monitor 295 on the switch board 231. The environmental monitor 295 can be alerted in the event of the fan speed falling below a predetermined value (e.g., 80% of its nominal speed). The fan can provide tachometer outputs to facilitate the measurement of fan speed.

LED indicators 137 can be provided, for example with a green power LED, an amber LED for indicating that service is required and a blue LED for indicating that the switch is ready to be removed. LED indicators integrated on 2×4 stacked RJ45 connectors on the rear face of the CSSP 71 can be arranged, for example, to show green continually when the link is present and flash green when the link is active.

The environmental monitor ENV MON 295 can be provided to maintain operational integrity of the CSSP 71. The ENV MON 295 can include limit values in limit registers and can monitor, for example, temperature within the CSSP enclosure 121, the CSSP power rails, including the 12V, 3V3, Switch Processor Core Voltage, CSSP Processor Core Voltage and the two 9V power feed rails 278, 279 from the midplane 171. The outputs of the DC/DC converters 281 can be fed in to A/D inputs of the ENV MON 295 for Watchdog comparisons to be made to the voltage limits set in the limit registers. As noted above, the ENV MON 295 can also monitor the operating speeds of the fans 290 and 291. The ENV MON 295 can communicate with the SSP 74 of both CSSPs via an I2C bus 296.

For IO to the midplane 171 shown in FIGS. 8A–10, the midplane connector 141 can include sixteen 1 Gb Ethernet connections 265–268 from four quad SERDES 248–251 and the I2C bus lines 596.

The SSP 74 can access the I2C devices (FRU-ID EEPROM, 8-bit I/O expansion chip, and the system hardware monitor) through the midplane 171.

For external IO, rear panel Gb Ethernet connections can be provided from the two quad PHYs 253, 254 to 2×4 stacked RJ45 connectors 139 (to give 8 uplinks). Each port can be an independent 10/100/1000 BASE-T (auto negotiating) port. The PHY devices 253, 254 can operate in GMII mode to receive signals from the 8-Gigabit interfaces on the ASICs 244, 245.

The Power Supply Units (PSUs) 81 can configured such that when two or more PSUs 81 are connected in parallel in the shelf 41, failure of any one of the paralleled units shall not affect system operation. Moreover, one of the PSUs can be installed or removed from a "live" system with or without input power applied. The outputs can have overcurrent protection.

The PSU can have an I2C interface to provide power supply status via the midplane 171. The PSU can have an internal temperature sensor that reports via the I2C interface. The PSU fan speed can also be monitored and errors are reported via the I2C interface. Overvoltage and overcurrent sensors can also report via the I2C interface.

Figure 13:
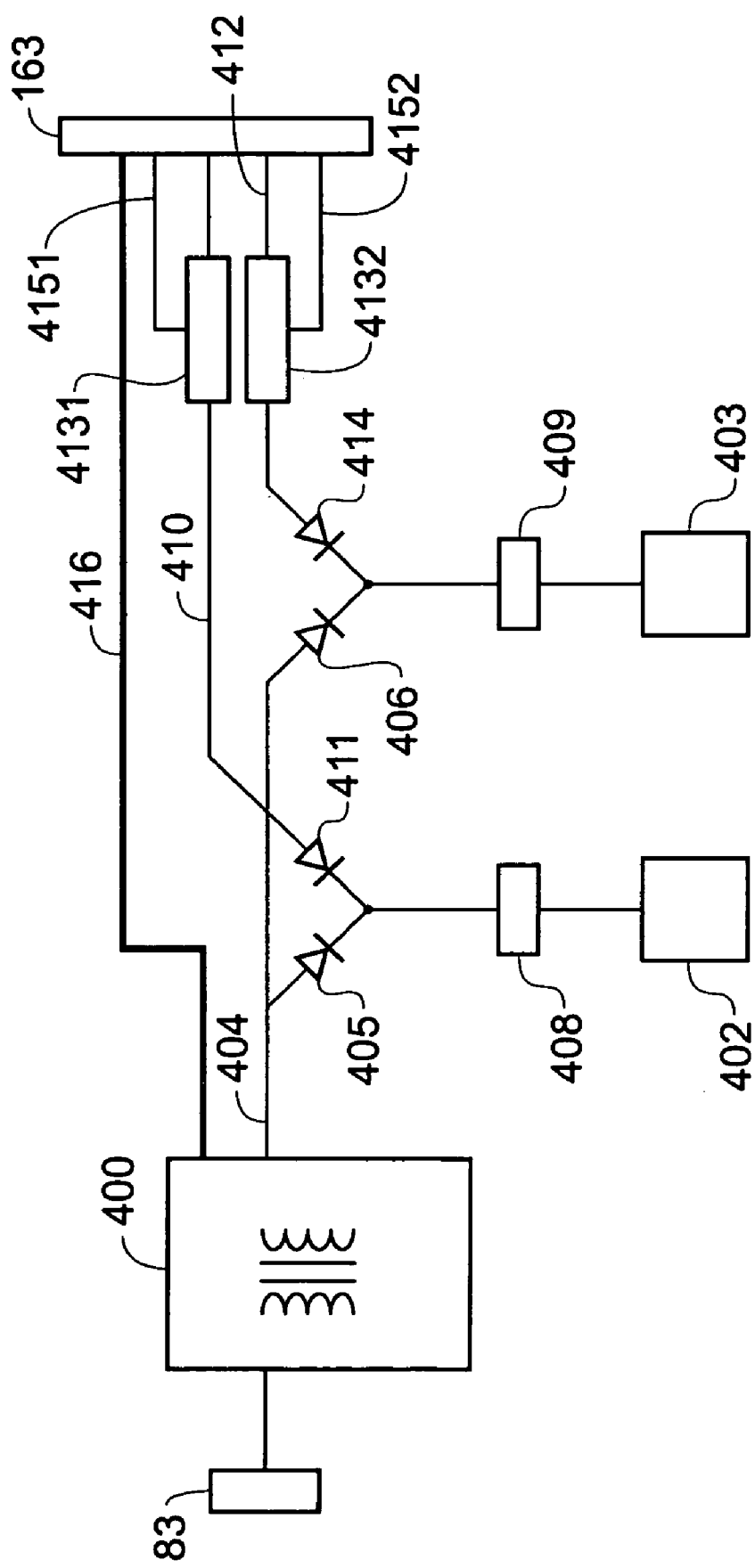
FIG. 13 is a functional block diagram of an example of a subsystem for the power supply unit of FIG. 7.

There now follows a description of aspects of an example of a power supply 81 with particular reference to FIG. 13.

When a power supply (e.g. mains power, or UPS type protected power) is connected to the cable connector 83, transformer, regulator and rectifier circuitry 400 can operate to generate a DC output (in the present example, 12V DC) from the input (in the present example 230/240V 50 Hz AC or 110V 60 Hz AC).

In order to ensure good cooling reliability within the shelf 41, each PSU 81 can have a pair of cooling fans 402, 403 located at the rear of the PSU enclosure as described above with reference to FIG. 7. As a failsafe measure against a failure of one PSU 81, the fans of each PSU 81 can be powered by both PSUs 81. Thus, in the event that one PSU 81 is non-operative to produce the DC supply for the shelf 41, as long as the other PSU 81 is operative, not only will all components of the shelf 41 be powered as normal, the fans of both PSUs 81 can continue to run.

As shown in FIG. 13, this dual powering of cooling fans 402, 403 can be effected by providing a power supply line 404 from the transformer, regulator and rectifier circuitry 400 to power both fans 402, 403. Also, first and second separate power lines 410, 412 from the other PSU 81 can provide duplicate power supply to the first and second fans 402, 403 respectively. The fan 402 can thus be powered by a diode commoned supply from line 404 and a diode commoned supply from line 410. Diode protection can be provided by diodes 405 and 411 respectively. The speed of the fan 402 can be controlled by a speed controller 408. Similarly the fan 403 can be powered by a diode commoned supply from line 404 and a diode commoned supply from line 412. Diode protection can be provided by diodes 406 and 414 respectively. The speed of the fan 403 can be controlled by a speed controller 409.

The two speed controllers 408, 409 can in turn be controlled by a data input from each CSSP 71 received via an I2C bus connection (not shown in FIG. 13). Power supply lines carrying DC power for the other FRUs of the shelf 41 are shown in FIG. 13 as power line 416. All power connections to and from the PSU 81 can connect to the midplane 171 when the PSU is inserted in the shelf 41 via the midplane connector 163. In the present example the PSU 81 connects to the shelf through a 5P/24S/6P configuration SSI-MPS compliant right angle connector 163 at the front face 147 of the PSU 81. Connectors for the I2C interface can also be provided.

The input power line 410 and 412 for each fan 402 and 403 can be provided with a softstart module 4131 and 4132 respectively, to allow for hot insertion of the PSU 81 into the shelf 41. The softstart modules 4131 and 4132 can be controlled, for example, by pulling a signal to ground (e.g., a "mated" input line 4151 and 4152).

Where the two input power lines 410 and 412 are separate lines having separate softstart provision, there is no common failure mode for the backup method of powering the fans 402, 403. Thus even if the PSU 81 ceases to be operable to generate the DC supply, and a component (power line or softstart module for example) fails in the supply path from the second PSU 81 to the fans 402, 403, at least one of the fans 402, 403 can remain operational as the shelf 41 still receives the cooling effect of three PSU fans.

In the present example, the power supply has four rear panel LED indicators 137. A blue "Ready to Remove" LED can be driven by the I2C interface and indicate that the power supply may be removed from the system. An amber "Service Required" LED can be driven by the I2C interface and indicate that the power supply is in a fault condition: any output out of range, over-temperature or shutdown. A green "DC Output-OK" indicator can be driven by internal power supply circuits and show that the main 12 volt supply is functioning. The LEDs can remain lighted when individual outputs are in the current limited mode of operation. A green "AC Input-OK" indicator can be driven by internal power supply circuits and show that AC input power is within normal operating range.

Figure 14:
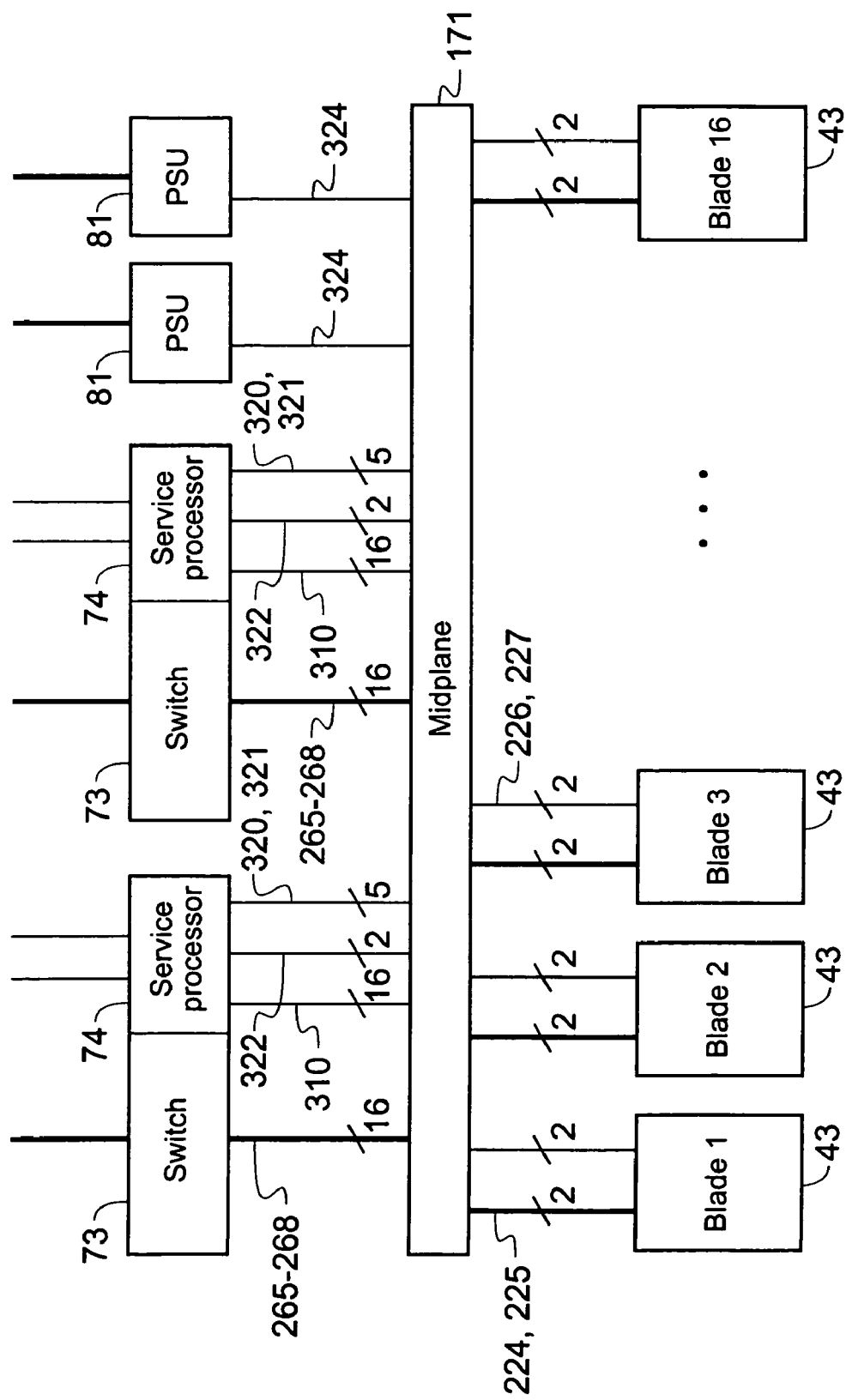
FIG. 14 is a functional block diagram showing the connectivity between the components of the shelf of FIG. 2.

With reference to FIG. 14, there will now be described an example of data connectivity between the FRUs and midplane of the shelf 41. Power transmission paths are not illustrated in FIG. 14. However, it will be appreciated that to facilitate the maximum component redundancy of the shelf 41, each PSU 81 can independently provide power to each FRU.

In the present example each of the processing cartridges (blades) 43 connects to the midplane 171 via a pair of information signal connections (e.g. Gb Ethernet links) 224, 225 and a pair of serial management signal connections 226, 227. Connections within the midplane 171 can ensure that each Ethernet link 224 is directed to a connection 265–268 from the midplane 171 to a first switch 73, and that each Ethernet link 225 is directed to a connection 265–268 from the midplane 171 to a second switch 73. Thus one Ethernet link can be established between each processing cartridge 43 and the switch 73 of each CSSP 71. Further connections within the midplane 171 can ensure that each serial connection 226 is directed to a connection 310 from the midplane 171 to the first SSP 74 and that each serial connection 227 is directed to the second SSP 74. Thus one serial link can be established between each processing cartridge 43 and the SSP 74 of each CSSP 71. As mentioned earlier, information signal connections other than Gb Ethernet connections (e.g. Infinband connections) could be employed in other examples.

A plurality of serial connections can connect each SSP 74 to the other. Serial lines 320, 321 can connect each SSP 74 to the midplane 171 and connections within the midplane can connect the two sets of lines together. To provide a control interface from the SSPs 74 to the PSUs 81, serial lines 322 can connect each SSP 74 to the midplane 171 and connections within the midplane 171 can connect to serial lines 324 from the midplane 171 to each PSU 81.

Figure 15:
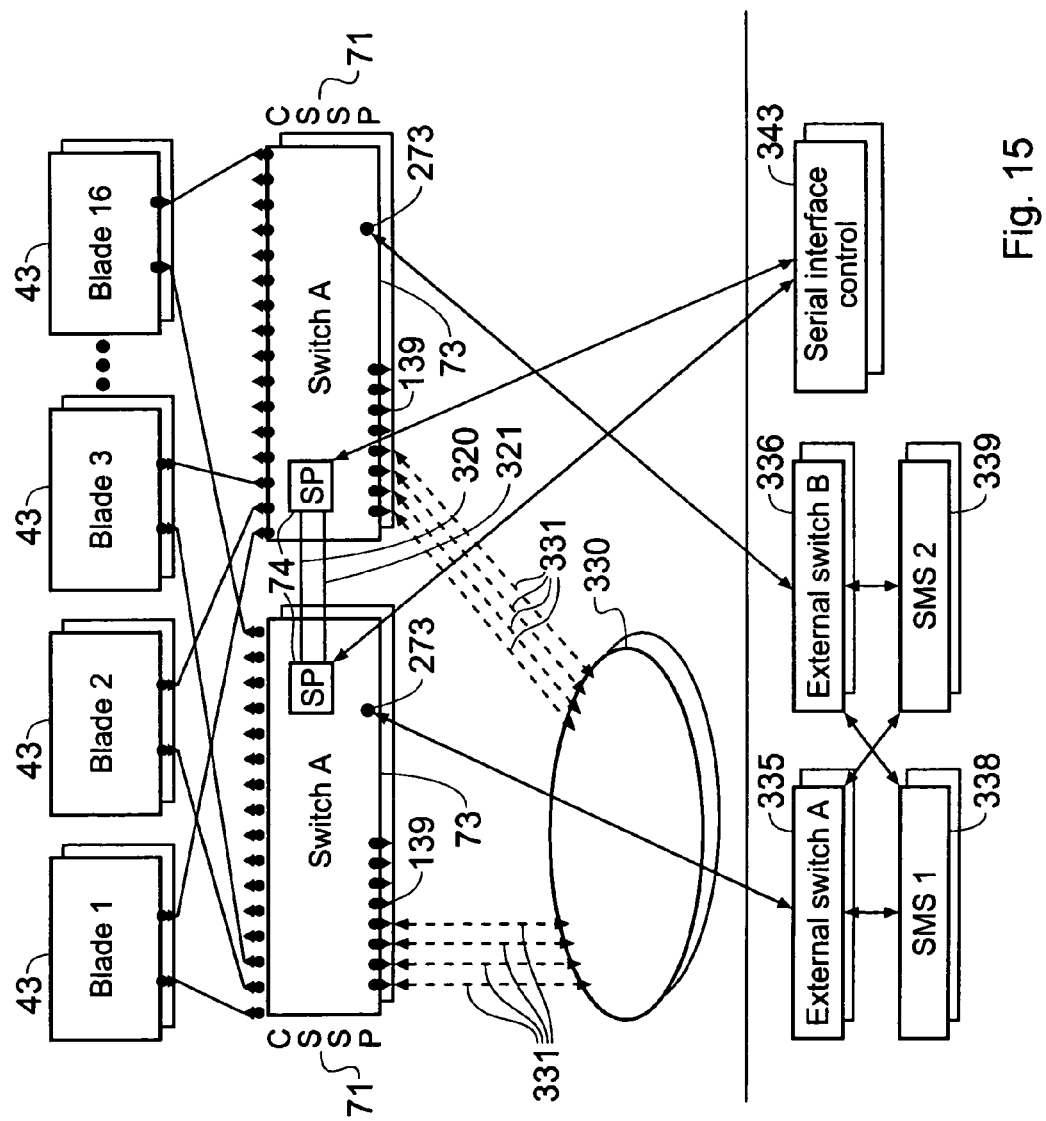
FIG. 15 is a functional block diagram showing the external connectivity of the shelf of FIG. 2.

An example of data and control connectivity of the shelf 41 to and from computer systems external to the shelf 41 when the shelf 41 is arranged for use within a multiprocessor server system such as that described above with reference to FIG. 1 will be described with reference to FIG. 15.

As summarised above with reference to FIG. 14, in the present example each processing cartridge, or blade, 43 is connected to the switch 73 of each CSSP 71 by an information signal connection (e.g. a 1 Gb Ethernet link) formed by a combination of links 224, 225 from the processing cartridge 43 to the midplane 171, connections within the midplane 171 and links 265–268 from the midplane 171 to each switch 73.

Further, in this example a set of serial management signal connections comprising links 320, 321 and connections within the midplane 171 connect the SSP 74 of each CSSP 71 to the SSP 74 of the other CSSP 71.

To provide external data connectivity between the shelf 41 and an external core data network 330, in association with which all information processing performed by the processing cartridges 43 of the shelf 41 is undertaken, connections 331 can be formed between the core data network 330 and the eight 1 Gb Ethernet ports 139 provided on the rear panel 122 of the CSSP enclosure 121.

In the present example, the connections by means of which control and configuration of the shelf 41 are performed are entirely separate to the connections to the core data network 330. Therefore, a first external switch 335 can connect to a management (I2C) port 273 of the first CSSP 71 and a second external switch 336 can connect to a management (I2C) port 273 of the second CSSP 72. As described above with reference to FIG. 12, the management port 273 can provide a management network interface to both the switch 73 and SSP 74 of each CSSP 71. The external switches 335, 336 can each be connected to each of a pair of System Management Server (SMSs) 338, 339. The SMS is not essential to the operation of the shelf 41, but use thereof aids optimal operation of the shelf 41. In a typical multiprocessor server system a plurality of shelves 41 may be connected together via the core data network 330 under the control of a single management network utilising one set of SMSs 338, 339. A set of SMSs 338, 339 may comprise a single SMS (as well as a plurality thereof). However use of at least two SMSs enables redundancy of components, therefore increasing overall system reliability.

A serial interface control 343 operable under telnet protocol control is also connected to the shelf 41 in the present example. This can provide a common operating system/boot console connection to the SSP 74 of both CSSPs 71 via the RJ45 connector 311 on the rear panel 122 of each CSSP enclosure 121.

It will be appreciated from the above that a flexible and scalable modular computer architecture has been described. In the described example up to 16 information processing cartridges, or blades 43, can be configured as sealed FRUs on a single shelf 41, the number of blades being chosen according to customer requirements. Each blade has its own processor and random access memory. If, for example, there is a maximum of 2 Gbytes of memory per information processing cartridge, and one processor per blade, 16 processors (16P) with 5.33 processors per unit height (IU) and a total of 32 GB of memory per shelf can be provided.

In the present example, the shelf 41 incorporates redundant combined switch and shelf service processor modules (CSSPs) 71 and redundant power supply units (PSUs) 81 separate from the blades 43. As the power supplies are carried by the shelf, the information processing cartridges can be kept compact and inexpensive. Also, as a result, they can be powered by DC power only, via the midplane 171.

Also, as mentioned earlier, the FRUs (e.g., the information processing cartridges, or blades, 43, the CSSPs 71 and the PSUs 81) can all be configured as sealed units that do not contain any internal FRUs themselves and do not contain user serviceable items. The enclosures of the FRUs can be arranged to enclose all of the functional components of the FRU with only electrical connectors being externally accessible and with indicator LEDs being externally visible as well.

These factors can all contribute to keeping the cost of the FRUs low, as well as that of the overall system. The modular approach with the use of sealed modular field replaceable units for providing system functionality and with non-field replaceable units designed with a minimum possible number of active components enhances reliability. Moreover, easy and rapid maintenance is facilitated in the event of a failure of a FRU by simple replacement of that FRU, further reducing the cost of ownership.

Thus, it will be appreciated from the above description that the provision of a rack mountable shelf, that includes power supplies, a shelf service processor and switches in modular units, for carrying a number of processing cartridges, wherein the number of processing cartridges can be chosen according to customer requirements, provides a flexible and scalable computer configuration. The balancing of the load between the processors of the processing cartridges can be effected by software using conventional principles.

A configuration as described provides an easily scalable processor architecture, whereby the processing power provided by a complete system based on the information processing cartridge/information processing cartridge carrier architecture can be scalable from moderate to very high capacity through the simple addition of further information processing cartridges.

Figure 16:
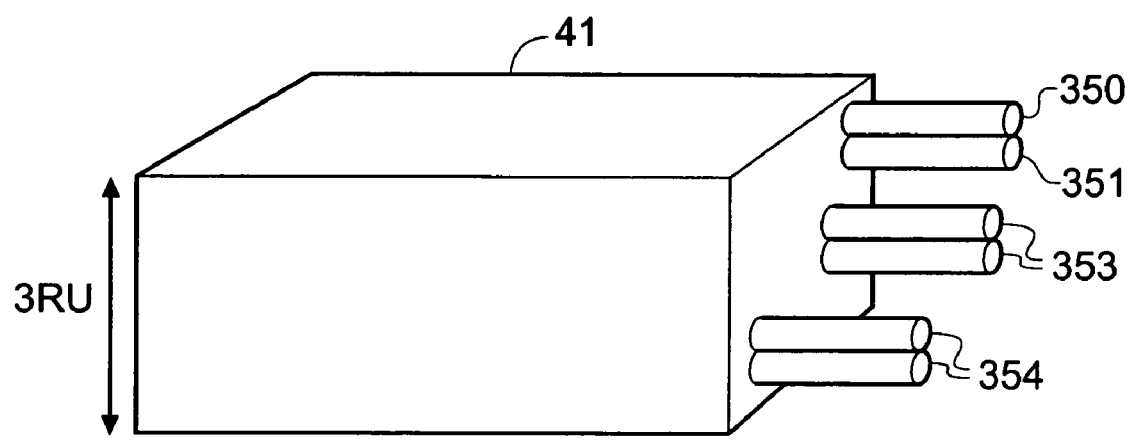
FIG. 16 is a schematic representation of a shelf showing the external connections from the shelf of FIG. 2.

As illustrated in FIG. 16, an example of the external connections from a shelf 41 can be in the form of two active information signal connections (e.g., Ethernet connections) 350 and 351, two active power connections 353 and an active/standby pair of management connections 354. With regard to the management connections, each connection comprises a serial connection and a network (e.g. Ethernet or Infiniband) connection. It is possible to connect to either the active or the standby connection, as the incoming signal will be internally routed to whichever management controller (CSSP) is the current master. It will be appreciated, therefore, that the connections to a shelf can be kept to a minimum. It will further be appreciated from the configuration shown in FIG. 16 that the system is scalable beyond a single shelf unit 41.

Figure 17:
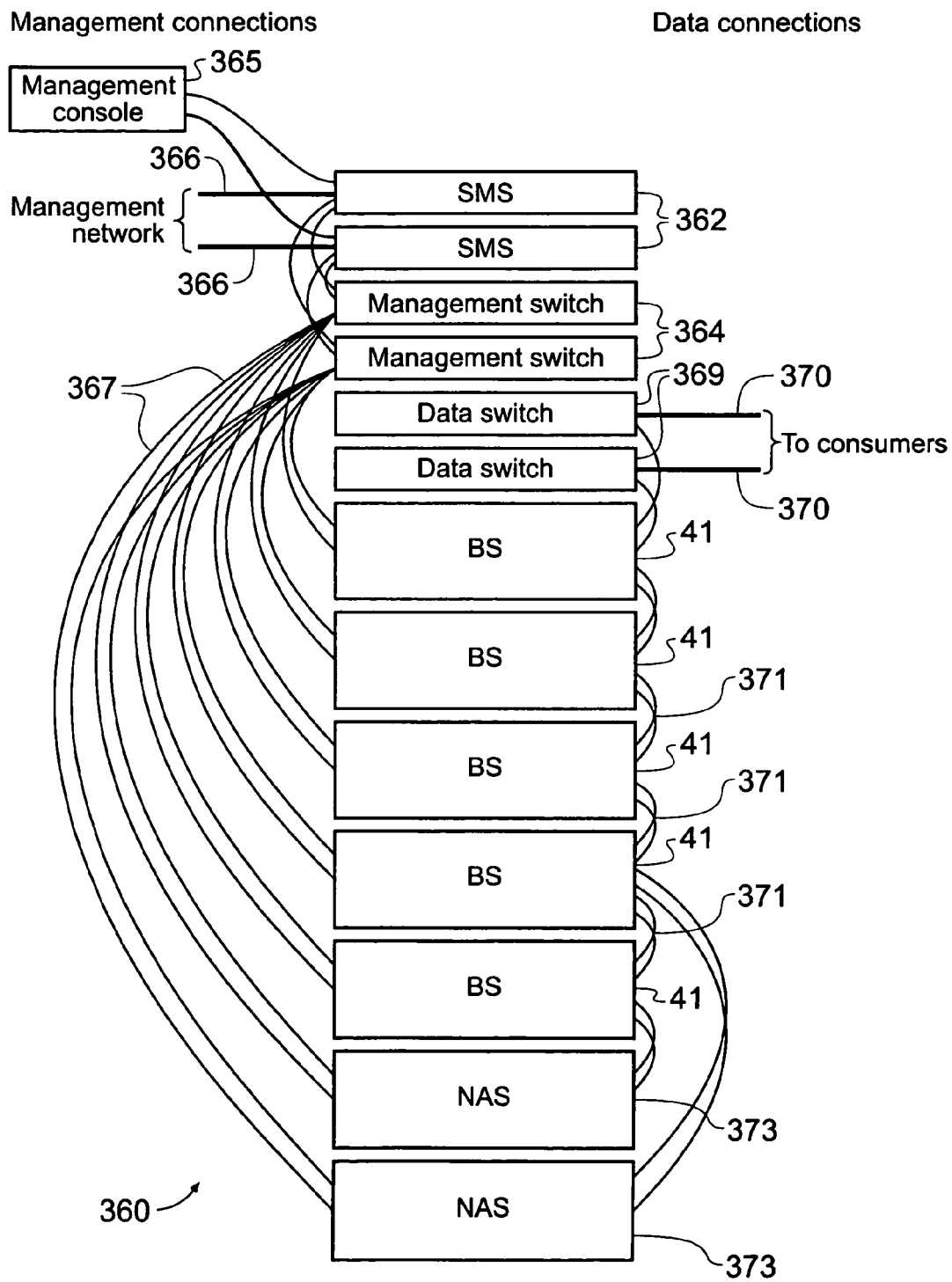
FIG. 17 is a schematic representation of a rack mounted system comprising a plurality of such shelves.

FIG. 17 illustrates how a plurality of shelves can be configured within one (or more) racks to provide even higher processing power. Such a constellation of shelves to provide a large grouping of servers is sometimes termed a "web farm" or "server farm" 360. As shown in FIG. 17, the web farm comprises a plurality of shelves 41 that each carry a plurality of blades 43. Also provided are a plurality of Network Attached Storage devices (NAS) 373 for providing storage for critical data, e.g. email data storage, for the web farm. The NASs 373 are not required if there is no critical data to be stored, e.g. if the web farm is operating solely to provide web caching services.

Management control of the web farm 360 can be provided through a pair of System Management Servers (SMSs) 362. Each SMS 362 can be connected to a management network via a link 366 and to a management console 365. The SMSs 362 can communicate with the individual shelves 41 via a pair of management switches 364. Each shelf 41 and NAS 373 can be connected to each management switch 364 via a connection 367. Thus dual redundant management connections can be provided to each shelf 41 and NAS 373.

Flow of data to and from the web farm 360 can be provided through a pair of data switches 369. Each data switch 369 can be connected to a consumer network via a link 370. It is to be understood that the consumer network can be a larger data network to which the web farm 360 is connected. This network can be an office or corporation intranet, a local area network (LAN), a wide area network (WAN), the Internet or any other network. Connections between the data switches and the shelves 41 can be facilitated by connections 371. It is to be noted that as each shelf has its own switching capability, there is no need for each shelf 41 to be directly connected to the data switches 369. Connections can also be provided to connect the NAS units 373 to the shelves 41. The topology used for interconnection of the data switches 369, shelves 41 and NASs 373 can be any topology providing at least one connection of any length between every possible pair of units. Complex topologies arranged to minimise the maximum connection length between any two given units in the web farm can be used.

The web farm 360 comprising a plurality of shelves 41 with or without a plurality of NASs 373 can suitably be used as any or all of the entry edge server group 9, web edge server group 15 and application servers 19 described above with reference to FIG. 1.

As an alternative to providing critical data storage within a NAS 373, such storage can be provided within one or more NAS cartridges fitted into one or more of the shelves 41 in place of processing cartridges 43. Another alternative is to provide a server shelf with local storage (such as a RAID array (Redundant Array of Inexpensive Disks) in place of the NAS 373.

Thus there has now been described an example of a fully configurable computing system based on a plurality of self contained field replaceable units (FRUs) and scalable from a single processing cartridge with power supply and switching capability to a multiply redundant multiprocessor server system with full system management capability extending over a number of co-operably connected server shelves. It will of course be readily apparent to the skilled reader that many of the specific features specified in the above description are in no way limiting and a variety of alternatives may be produced using only ordinary skill and common general knowledge. Non-limiting examples of example modifications which may be made to the above described system are discussed hereafter.

There is no limit placed on the processing cartridges as to what software they should run. Each module within a shelf or farm may run under the same operating system, or a plurality of different operating systems may be used. Examples of possible operating systems include Sun Microsystems' Solaris® OS or another UNIX™-Type OS such as Linux™, MINIX™, or Irix™, or UNIX™ or a Microsoft OS such as Windows NT™, Windows 2000™, Windows ME/98/95™, Windows XP™.

It is also not necessary that each processing cartridge within a shelf or farm be configured to run the same program software. For example, individual processing cartridges may be configured to execute, for example, fileserver software, mailserver software, webhosting software, database software, firewall software, or verification software.

Although it has been described above with reference to FIGS. 4, 8, 12, 13 and 14, that functionality of a switch and of a shelf service processor should be provided within a single combined switch and service processor unit, this is not essential and separate switch and shelf service processor field replaceable units may be used.

Although it has been described above that a pair of PSUs and a pair of CSSPs may be provided so as to enable dual-redundancy, further PSUs and CSSPs may be provided so as to increase FRU redundancy further, thus providing statistically higher reliability.

In the power supply circuitry in each of the blades and CSSPs, two voltage sense circuits may be provided after the fuses and before the diodes, to prevent a latent fault caused by a failed fuse going undetected until one of the PSUs is removed or taken offline. Such circuits may configured to withstand an overvoltage at their inputs whilst the input they are feeding is not powered, without any leakage to the unpowered circuit.

Figure 18:
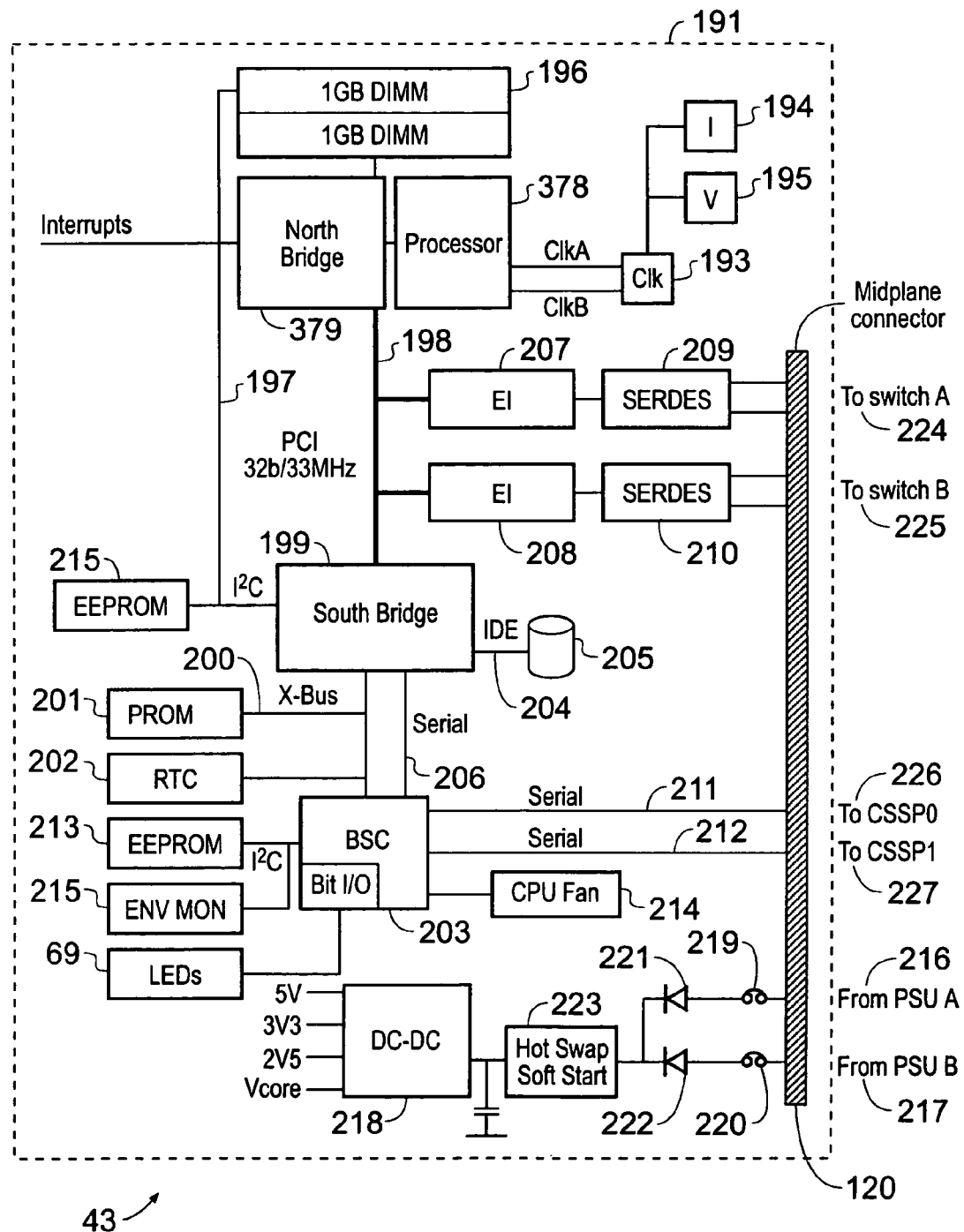
FIG. 18 is a functional block diagram of a further example of an information processing subsystem for the information processing cartridge of FIG. 5.

Although it has been described above with particular reference to FIG. 11 that the processing module may be based on an UltraSPARC™ processor, this is not limiting and any other processor having sufficient processing capacity to undertake the tasks required of a particular processing cartridge may be used. Alternative processors include, but are not limited to, Intel x86 series and compatible processors, AMD x86 compatible processors, Alpha processors and PowerPC processors. The particular example of an x86 compatible processor is described in more detail with reference to FIG. 18. In FIG. 18, the parts corresponding to those of the UltraSPARC™ based system of FIG. 11 have the same reference numerals and will not be described again here. In a system based on an x86 compatible processor, the processor 378 itself communicates with the other components, including the memory 196 and PCI bus 198 via a Northbridge 379. The Northbridge 379 also includes an interrupt controller, so no separate interrupt concentrator is required. The other components of the processing cartridge could be substantially the same as for the UltraSPARC™ based system described above.

Although it has been described above that each information processing cartridge comprises a single microprocessor, this is not a limiting case as each or any of the information processing cartridges may have more than one microprocessor arranged to share common storage resources to operate synchronously (in lockstep) or asynchronously. Also, it is not necessary that all information processing cartridges inserted into a shelf at a given time are identical, rather a variety of different blade architectures may be used simultaneously.

The provision of the functions of both Switch and Shelf Service Processor within a single FRU in the present example provides a facility within a single shelf 41 for dual redundancy in both functions in fewer different FRUs. As will be appreciated, there is no restriction that these two functions must be provided within a single FRU and division of the two functions into separate FRUs would present no difficulty to the skilled addressee.

The backup power provision for the cooling fans of the PSUs is described above with reference to FIG. 13. Although it is described that the backup power supply to each fan should be independent of the other, if the risk of common mode failure of backup power supply is judged to be low, or is of low importance, then the backup supply to each fan may be provided in common with the backup supply to all other fans.

Also, an information processing module forming a field replaceable server blade can include a processor and memory can be configured by means of software, firmware or hardware to provide a special purpose function. By way of examples only, an information processing module can be configured to perform the function of one or more of a firewall, or a load balancer, encryption and/or decryption processing, an interface to a secure network, e.g. a virtual private network (VPN), a specialized switch with wide area network (WAN) connectability.

Also, a storage blade may be provided. The storage blade can be configured to be mountable in a server blade receiving location in a blade server carrier. The storage blade can comprise storage blade connectors configured for interconnecting with carrier connectors on the server blade carrier, whereby the storage blade is interchangeable with a server blade. A carrier, or shelf, for a server system can be arranged with a plurality of blade receiving locations for receiving blades, wherein the blades can be storage blades or information processing blades. The server system can be self configuring on receipt of the blades according to the type of blade received in each said location. To achieve the blade service controller in each blade can be operable to communicate with a shelf service processor to perform said configuring.

Figure 19:
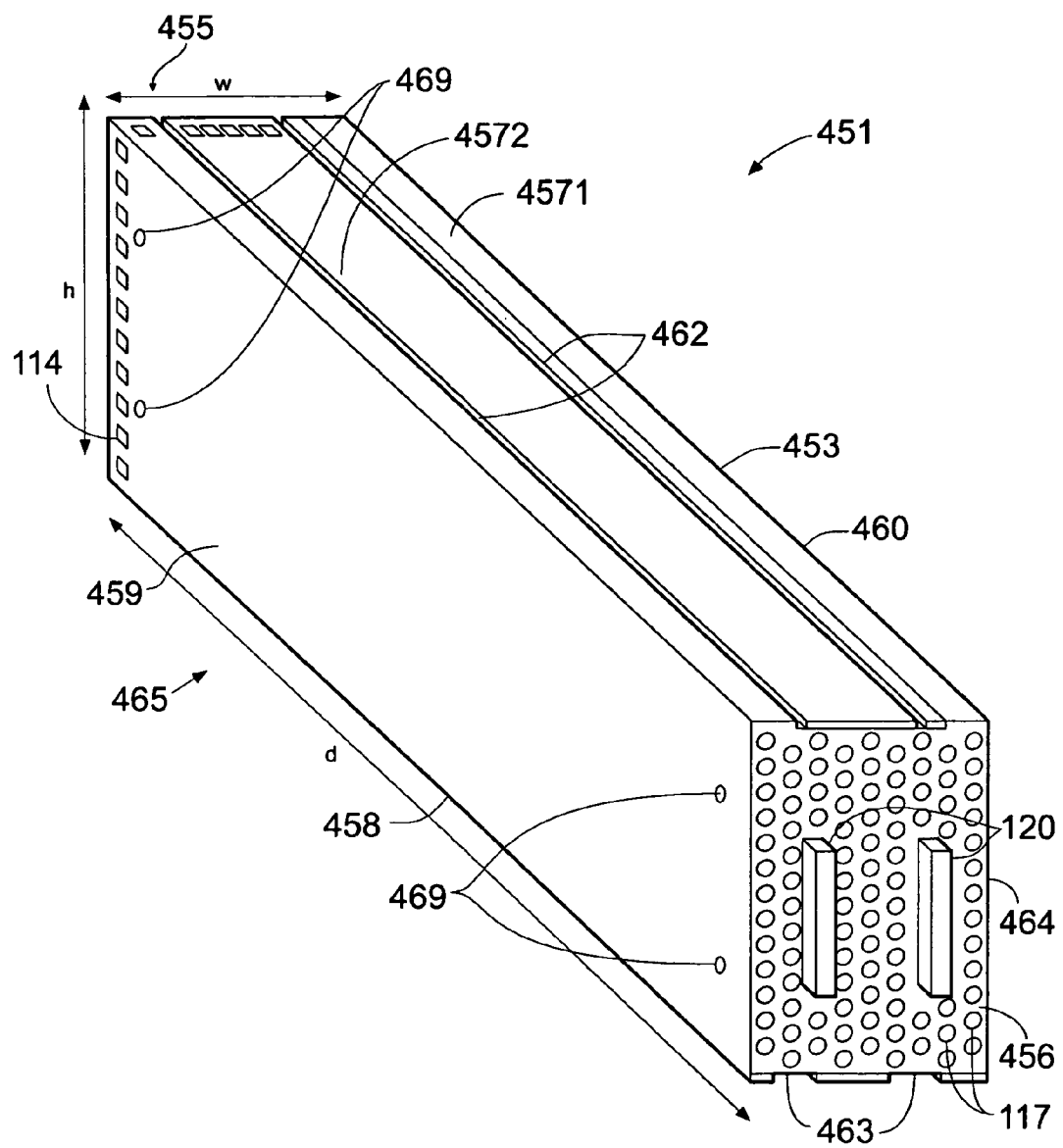
FIG. 19 is a schematic perspective view, partly from the rear, of an example of an information processing cartridge for mounting in the shelf of FIG. 2.

In order to provide a high density of processing cartridges, or blades, in the above described examples, the cartridges have a very narrow form factor. This provides for a very high processor density. However, there are situations where a "standard" information processing cartridge 43 is too compact, or otherwise inappropriate or unsuitable for a particular task or tasks. Accordingly, an example of the present invention can provide a non-standard unit that may be located in the standard shelf. A particular example of a non-standard information processing cartridge 451 is illustrated in FIG. 19. The non-standard processing cartridge 451 is constructed in a similar manner to the standard processing cartridge 43 described above with reference to FIG. 5.

The view shown in FIG. 5 is a perspective view partly from the rear of the nonstandard processing cartridge 45 1. Here it is to be noted that the term "rear" is applied in the context of the position, when installed, of the information processing cartridge, with respect to the shelf 41 (i.e. in this case the "rear" of the information processing cartridge 451 is the innermost part of the information processing cartridge when it is inserted in the shelf 41).

With reference to FIG. 19, it will be noted that the information processing cartridge 451 is three-dimensional having a height (h) width (nw) and depth (d). If, as in the present example, the information processing cartridges are to be arranged in a one-dimensional array (a row) across the shelf 41, then efficient packing for the information processing cartridges 451 is achieved where one dimension (here the width, nw) is smaller than the other dimensions (here the depth, d and the height, h). In contrast to the standard cartridge described above with reference to FIG. 5, the present oversize cartridge therefore has a width n times the width of the standard cartridge.

It will be noted that an enclosure 453 of the present example of an information processing cartridge 451 has six, generally rectangular faces. For convenience only, the face that is visible from the front of the racking when an information processing cartridge 451 is mounted in the shelf 41, is known as the front face 455. The opposite face is known as the rear face 456. In the present example these two faces have the shape of rectangles. The top and bottom faces 457 and 458 and the side faces 459 and 460 are also rectangular and are generally elongate in shape.

The non-standard information processing cartridge 451 shown in FIG. 19 is, as will be recognized, generally similar to the standard information processing cartridge 43 described above with reference to FIG. 5. However, the present non-standard information processing cartridge 451 has a width (nw) which, in the present example, is double that of the standard information processing cartridge 43. Therefore, the present non-standard information processing 451 will take up the mounting space for two standard information processing cartridges 43 within the shelf 41. Thus the internal volume of the non-standard processing cartridge 451 is considerably increased over that of a standard information processing cartridge 43. In the present example, in order to occupy two slots within the shelf 41, the housing 453 is formed to have a pair of grooves 462 running therealong. Each groove 462 corresponds to the groove 108 of a standard size processing cartridge 43. Thus the guide rails 98 of the shelf 41 will interface with the grooves 462 of the cartridge 451 to aid insertion and removal of the cartridge 451 into and from the shelf 41. Therefore, the oversize cartridge 451 will in general have one groove for each standard processing cartridge receiving location it occupies.

In the present example, the non-standard processing cartridge 451 is constructed from a metal portion 464, which comprises one side face 460 the rear face 456 and a part 4571 of the top face 457 of the cartridge enclosure 453, and a plastic portion 465. The plastic portion 465 comprises the other side face 459, the bottom face 458, the front face 455 and the remaining part 4572 of the top face 457. The plastic and metal portions may be fastened to one another using screws 469. As will be recognized, this construction is substantially the same as the construction of the standard size processing cartridge 43 described above with reference to FIGS. 5A, 5B and 5C. Therefore, a detailed description of the construction will not be repeated here.

The grooves are in the present example are formed in the plastic portion 465 of the enclosure 453. Two top face grooves 462 are formed in the plastic portion 465 top face part 4571 and two bottom face grooves 463 are formed in the bottom face 458.

In alternative arrangements, the non-standard processing cartridge enclosure 453 may be constructed from a plurality of sheets of metal attached to an enclosure chassis to form the desired shape, or attached to one another to form the desired shape. Other alternative constructions include a plurality of metal chassis portions having the grooves formed at junctions therebetween and a metal chassis supporting a plastic enclosure. In the event that the grooves are formed from a metal portion, the grooves may be lined with a plastics material to provide a low friction contact to the guide members of the shelf.

The non-standard information processing cartridge 451 shown in FIG. 19 has two information processing cartridge midplane connectors 120. In general, a non-standard information processing cartridge may have as many midplane connectors 120 as it is standard processing cartridge widths wide, thus n connectors may be provided. Multiple midplane connectors 120 enable the cartridge to receive more power than a standard size cartridge and/or to communicate over two or more connections to the switch 73, thus providing increased data communication bandwidth. Thus two or more times the standard data bandwidth is available for communication into and out of the processing cartridge and two or more times the power input is available to run the components within the oversize cartridge 451.

Although multiple midplane connectors 120 may be provided, in an example of the invention the oversized module only contains a single service controller 203. Also, only one of the connectors includes management connections for the service controller to communicate with the service processor 74 in the CSSP 71. As a result, the CSSP service processor communicates with the oversized cartridge 451 via the management connections in that connector only, with the result that the CSSP service processor 74 recognizes one received module only, and recognizes that as being in the slot (or information processing module receiving location) for that connector. In this manner, even if information communications take place via other connectors, the oversized module is recognized as being in the slot in which the connector with the management connections is located.

Such an increased size cartridge may be utilized by a number of different functions or components. Three illustrative examples of circumstances which a non-standard size cartridge may be suitable are described below.

Firstly, a particular processing cartridge may be required to carry too many components to fit inside a standard processing cartridge. This situation may occur where a particular function is to be implemented which function is not easily distributable across a plurality of processing cartridges but also requires more processing power than a single standard processing cartridge can provide. Functions which are not easily distributable could include functions where high data bandwidth is required between logical components implementing the function but do not require such high bandwidth for communication into or out of the processing cartridge, for example, encryption/decryption engines. Another example might be SMP (symmetric multiprocessor) arrangements. Other examples might be where a particular processing cartridge is to contain a plurality of storage devices (hard disks) for example, or wherein a particularly hot-running processor is to be used, therefore requiring a large heatsink and/or cooling fan. It may be desired that the information processing cartridge be capable of not only causing a flow of cooling air through the housing of the cartridge by means of processor cooling fans but also where a more positive drive of cooling air through the cartridge enclosure is desired through the mounting of one or more fans at one or other end of the information processing cartridge.

Secondly, a function to be performed by a processing cartridge may require more data bandwidth into and out of the processing cartridge than is possible through a single midplane connector. This may occur together with one of the situations described above wherein additional component space is required or in another situation.

Thirdly, a single function may be distributable across a number of standard processing cartridges, but it may be cheaper to use a single more powerful oversize processing cartridge. This situation arises where all the components of more than one processing cartridge are required to carry out the distributable function. As a processing cartridge requires only one enclosure, only one blade service controller, only one set of serial interface drivers and ports and only one power management circuit, no matter how large or small the processing cartridge or how many components it contains, there may be a substantial cost saving in using a single oversize processing cartridge in place of two or more standard processing cartridges.

As shown in FIG. 19, the present non-standard information processing cartridge 451 has two connectors 120 for connecting to a midplane 171. However, while it may not be the case that the components within the information processing cartridge require additional power input or data bandwidth to communicate with the CSSP 71, it may be the case that the additional space provided by an increased width information processing cartridge is required. Therefore, a non-standard information processing cartridge 451 may be provided with a single midplane connector 120 positioned such that when the non-standard processing cartridge 451 is mounted into the two standard-width mounting slots of the shelf 41 the single information processing cartridge 451 is connected to the midplane 171 via just one midplane connector 120. Thus, although the information processing cartridge 451 takes up the mounting space for two standard information processing cartridges 43, only one information processing cartridge connector 175 of the midplane is occupied by the non-standard information processing cartridge.

The blade service controller of a non-standard size processing cartridge is configured, upon start-up to inform the service processor 74 of each CSSP 71 that it is an over-size blade. To effect this, the boot code for the blade service controller of the cartridge may store data describing the physical and logical size of the cartridge. This data is transmitted to each service processor 74 of a modular computer system shelf into which the cartridge is mounted during the boot sequence following powering-up of the cartridge. Upon receiving this data from the cartridge, the service processor 74 can configure the ports of the switch 73 according to the nature of the cartridge as described in the data. This enables the service processor 74 to manage the logical and physical space within the shelf 41 efficiently. If the oversize processing cartridge has more than one midplane connector 120, then the service processor 74 can instruct the switch 73 of each CSSP 71 that two or more of the switch's processing cartridge bound network ports 265, 266, 267, 268 can communicate with the single processing cartridge. In addition, if the processing cartridge takes up the space of two or more standard processing cartridges, but connects through fewer midplane connectors 120 than spaces occupied, the service processor can instruct the switch that one or more of its cartridge bound network ports should be ignored.

There has been described an information processing module comprising enclosure means for enclosing a processor subsystem including processor means. The information processing module can be configured as a field replaceable unit removably receivable a carrier having a plurality of information processing module receiving locations each configured to receive a standard size information processing module. The information processing module can be configured to have at least one dimension which is a multiple of the equivalent dimension of a standard information processing module.

Thus there has now been described an example of a non-standard information processing cartridge compatible with the above described fully configurable modular computing system. It will of course be readily apparent to the skilled reader that many of the specific features described in the above description are in no way limiting and a variety of alternatives may be produced using only ordinary skill and common general knowledge. In particular, it may be the case that an excessively wide information processing cartridge is required due to both an increased volume requirement and an increased data bandwidth requirement.

As described above, a computer system may be provided with multiple power supplies to provide power redundancy. In its simplest form, this comprises providing two power supplies, each of which is individually capable of powering all elements or components receiving power from those power supplies. Thus in the event of the failure of one power supply, no functionality or data is lost due to power failure as the remaining power supply will continue to fully power all elements or components. In a conventional 2n power redundancy setup, under fully availability operating conditions, each power supply supplies a maximum of 50% of its maximum power supply capability such that both power supplies are in use but are running at half capacity or less. Therefore an arrangement of this type may be termed the provision of capacity redundancy in power supply.

It has been recognized that such a capacity redundancy arrangement is not the only way of providing for redundancy. In order to ensure successful operation of all powered components or elements at a time of failure of one power supply, it is necessary that one power supply is capable of satisfying the power demands of each component or element individually. The following example illustrates a situation where at a time of availability of redundant power capacity, that capacity may be exploited to achieve greater computer system performance, whilst at a time of no redundant power availability such over exploitation is ceased so as to ensure adequate power for all elements or components of the system. Such a system may be considered to be functional redundancy in power supply.

Figure 20:
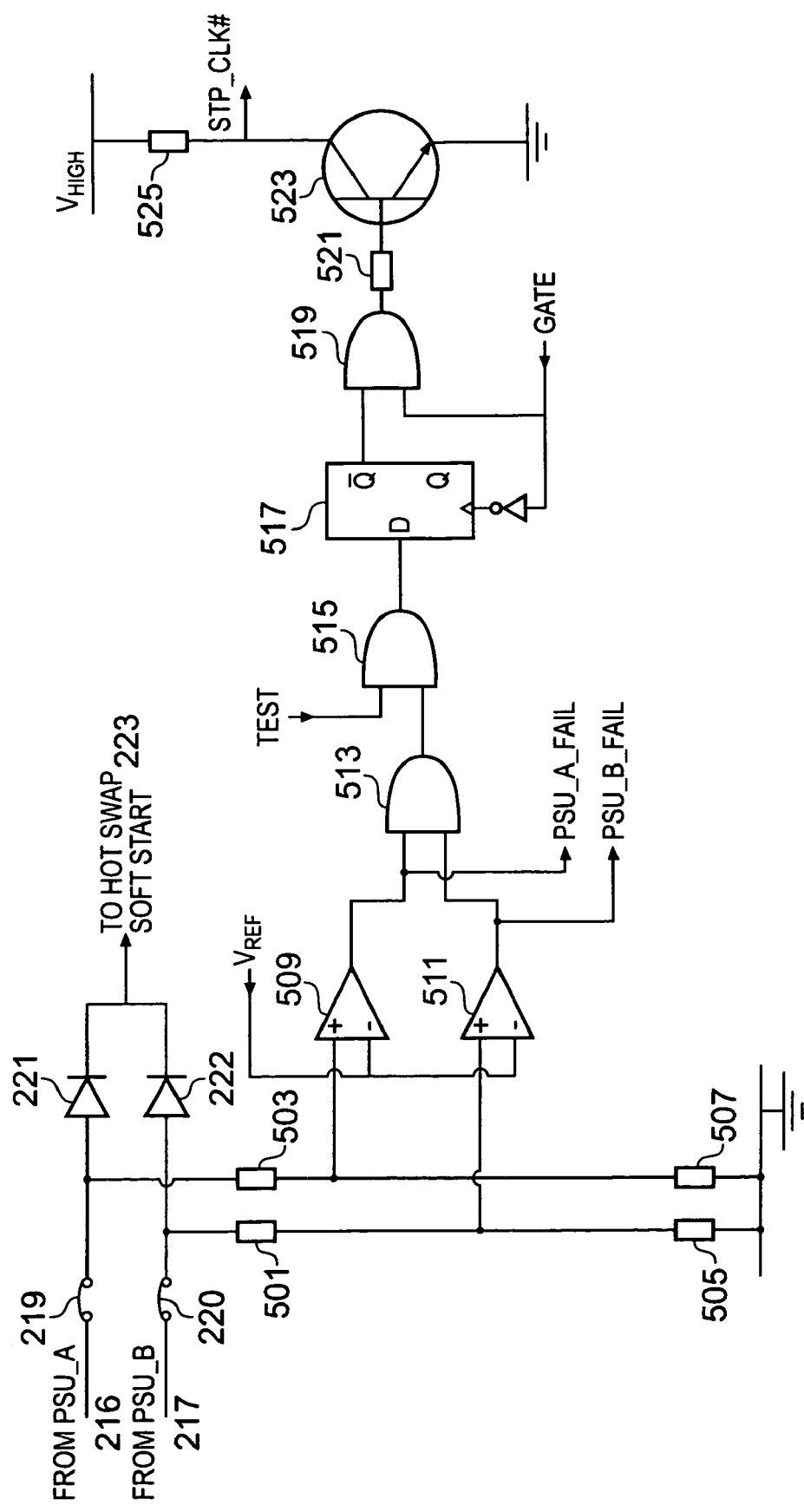
FIG. 20 is a schematic diagram of an example of a throttling control system for an information processing cartridge for mounting in the shelf of FIG. 2.

With reference to FIG. 20 there will now be described an example of how redundant power capacity may be controllably exploited to extract greater system performance without compromising the redundancy function of the power supply arrangement.

In order to exploit the excess power availability provided by a capacity redundant power supply situation, a computer system element or component is operable to increase a performance variable during a period of availability of that excess power. In the context of the above described modular computer system, a processing cartridge 43 may be configured to have a variable power consumption, the adjustment of which causes an adjustment in the performance of the main processor of that processing cartridge 43. Various microprocessors currently available have a facility reducing power consumption by applying a throttling control signal to a pin of the processor. An example of such a microprocessor is the Xeon™ series of processor produced Intel™ Corporation. The Xeon™ processors have a pin designated "STP_CLK#" which can be used for throttling of the processor by the applying thereto of a pulsed signal. The level of throttling is adjusted by altering the duty cycle of the pulse. The STP_CLK# pin is active low, such that when the input to the pin is a constant logic 1 the processor runs at full speed and when the input to the pin is a constant logic 0 the processor halts. During a time at which the STP_CLK# pin of the processor is asserted low the processor enters a halt state (so-called "Stop-grant" state) in which the processor stops running but up to one interrupt event on each interrupt input is noted for servicing following cessation of the halted state. Thus a pulsed STP_CLK# signal causes the processor to repeatedly start and stop operation, thereby decreasing the effective operational capacity of the processor to perform processing but also reducing the power consumed by the processor. The duty cycle of the pulse is directly proportional to the level of throttling (75% duty cycle=>25% power consumption reduction, 50% duty cycle=>50% power consumption reduction, 25% duty cycle=>75% power consumption reduction etc). Other processor besides the Intel™ Xeon™ may be controlled in this fashion.

In the present example the STP_CLK# signal may typically have a period in the region of 20 μs. This provides that the fluctuation in power consumption caused by the repeated starting and stopping of the processor may be hidden from the power supply components within the processing cartridge by conventional bulk decoupling. That is, a large capacitor is provided between the power supply components, for example a DC—DC converter 218, and the power supply inputs to the processor. Thus the fluctuation in drain by the processor can be dealt with by the residual charge in the capacitor without the DC—DC converter being affected.

An example of the implementation of a processing cartridge 43 using an Intel™ type processor has been described above with reference to FIG. 18. For the purposes of the present example, the arrangement shown in FIG. 18 may be taken as the starting point, wherein the processor 378 is an Intel™ Xeon™ series processor having a STP_CLK# input.

The arrangement shown in FIG. 20 is an arrangement of additional components to be added to the arrangement of FIG. 18 to implement the power throttling in case of failure of excess power availability from redundant power supply. In order to ensure that a remaining power supply module 81 is not overloaded by a processing cartridge 43 drawing excess power at a time when only one power supply module 81 is available, detection of power supply availability level is performed in simple hardware at the processing cartridge. The provision of a simple hardware solution ensures that power consumption by the processor cartridge 43 is reduced sufficiently quickly, following a failure of a power supply module 81, that the remaining power supply module 81 is not overloaded. The power consumption reduction should typically be effected within a time frame of approximately 5 μs from power supply failure.

With reference to FIG. 20, a monitoring feed is taken from each power supply input 216, 217 to the processing cartridge 43. This feed is taken after the fuses 219, 220, but before the diodes 221, 222. Each monitoring feed is directed to the non-inverting input of a respective voltage comparator 509, 511. Current limiting resistors 501 and 503 are provided to limit the current diverted from the main power supply circuitry of the processing cartridge 43, and resistors to ground 505 and 507 operate with current limiting resistors 501 and 503 to create a voltage divider arrangement to set the voltage at the input to the voltage comparators 509, 511.

Thus each voltage comparator 509, 511 receives an input corresponding to one of the processing cartridge power supply rails 216, 217. The other input to each comparator 509, 511 is a reference voltage ($V_{REF}$), which in the present example is 2.5V. Thus when the input voltage to each comparator is greater than 2.5V, the comparator outputs a high voltage level, but if the input voltage to a comparator falls below 2.5V then the comparator outputs a low voltage level.

In the present example, the current limiting resistors 501 and 503 have a resistance of 7k5Ω and the resistors to ground 505 and 507 have a resistance of 2k5Ω. The power supply which supplies the processing cartridge has a specification which sets the supply voltage to be 12V nominal, with a lower limit of 10V. Thus if the supply voltage to the processing cartridge falls below 10V, the power supply is deemed to have failed in the present example. Using the resistor values a voltage divider arrangement is provided such that the input to the non-inverting input of each comparator 509 and 511 is 3V when the supply is at 12V and 2.5V when the supply is at 10V. Thus it can be seen that as soon as the supply voltage drops to 10V, the input to the comparator drops to 2.5V, which when compared to the 2.5V $V_{REF}$ signal causes the output of the comparator to change.

The general principle behind the particular numbers of the present example is that the result of a comparison on the input voltage changes from a "positive" result to a "negative" result when the supply voltage drops below a predetermined minimum operational level and changes back when the supply voltage rises above that predetermined voltage level. Thus in the context of the arrangement shown in FIG. 20, the general case is that the non-inverting input to each of 509 and 511 is greater than $V_{REF}$ when the supply voltage is within tolerances, but is not greater than $V_{REF}$ when the supply voltage drops below the acceptable tolerances.

The output from each of the comparators 509, 511 is fed to the BSC 203 to provide for centralized monitoring within the processing cartridge of power supply status. The signals fed to the BSC are PSU_A_FAIL from the comparator 509 monitoring the supply from PSU_A, and PSU_B_FAIL from the comparator 511 monitoring the supply from PSU_B.

The output from each comparator 509, 511 is also fed to a first AND gate 513. Thus the output from the AND gate 513 will be high when the output from both comparators is high (power supply acceptable from both PSUs 81) and low at all other times. The output from the first AND gate 513 is input to a second AND gate 515. The other input to the second AND gate is a TEST signal. Under normal operating conditions, the TEST signal is held high such that the output from second AND gate 515 is dependent upon the output from the first AND gate 513, however a test state may be entered by asserting the TEST signal low. Therefore the output of second AND gate 515 is high when the output of first AND gate 513 is high (power supply acceptable from both PSUs 81) and low at all other times, unless the test state is entered (in which case the output is always low). The TEST signal is supplied by the BSC 203 to enable the failsafe circuitry to be tested by the system management functionality.

The output from second AND gate 515 is input to a D-type flip-flop 517. D-type 517 is clocked by a GATE signal (inverted) having a frequency of approximately 50 kHz (period≈20 μs for Xeon™ throttling input). The output from D-type 517 is taken from the inverting output $\overline{Q}$ such that a high input results in a low output following a clock transition on the GATE signal (thus low output corresponds to acceptable power from both PSUs 81).

The output from D-type 517 is input to a third AND gate 519. The second input to AND gate 519 is the GATE signal, such that at any time when the output from D-type 517 is high (i.e. one PSU 81 is not providing acceptable power), the output from AND gate 519 is a pulsed signal having the same waveform as the GATE signal. At any time when both PSUs 81 are providing acceptable power, the output from D-type 517 is low and thus the output from AND gate 519 is low.

The output from third AND gate 519 is used to control a bipolar junction transistor (BJT) 523 (via an input resistor 521 to limit current flow to the BJT 523). The emitter of BJT 523 is connected to ground, and the collector of BJT 523 is connected to the STP_CLK# pin of the processor 378 and to a voltage rail $V_{HIGH}$ (logic level 1) via pull-up resistor 525. The voltage rail $V_{HIGH}$ is typically at the processor core voltage for the processor 378 being controlled by the STP_CLK# signal.

Therefore, when the output from third AND gate 519 is low, BJT 523 is OFF, such that the STP_CLK# pin is negated high by virtue of pull-up 525. As stated above, when STP_CLK# is high, the processor 378 runs at maximum speed. On the other hand, when the output from third AND gate 519 is low, which occurs intermittently as a result of pulsed signal GATE whenever one of the PSUs 81 is detected not to be providing power, the BJT 523 is turned ON, thereby pulling the STP_CLK# pin to ground (low). As stated above, if this low state were to be maintained, the processor 378 would halt. However as the pulsed signal GATE causes the BJT 523 to be switched on and off at the frequency of the GATE signal (≈50 kHz), the amount of throttling back of the processor 378 is controlled by the duty cycle of the GATE signal.

The duty cycle of the GATE signal is chosen to ensure that the power consumption by the processor 378 is reduced to a level appropriate to ensure that the power supply 81 still in operation is not overloaded.

By means of the arrangement shown in FIG. 20, the excess power available in a power redundancy situation may be exploited without compromising the failsafe functionality of the redundancy situation.

As will be appreciated, the arrangement shown in FIG. 20 is only an example of how such a system may operate and many alternatives and equivalents may be substituted. An example of another system suitable for use in a processing cartridge of the above described modular computer system will be described hereafter with reference to FIG. 21.

In the present example, each PSU 81 of the modular computer system is capable of providing a maximum power of 48 W to each processing cartridge slot. Thus at a time of redundant power being available, a theoretical maximum of 96 W is available per processing cartridge slot. In practice, the 96 W limit is purely theoretical as thermal considerations in terms of power delivery and power usage component cooling become limiting factors. Therefore, in the present example an arrangement is provided to limit the maximum power drawn by the processing cartridge to 40 W per processing cartridge slot during redundant power non-availability to ensure that any sudden surges in drawn power do not cause the functioning PSU 81 to be overloaded.

The present example also uses a 2-slot processing cartridge of the type described above with reference to FIG. 19. Thus the processing cartridge of the present example has available the power allocated to two processing cartridge slots. Thus the maximum power availability at a time of redundant power non-availability is 96 W. The maximum power draw by the processing cartridge during availability of redundant power is directly affected by the power consumption of the processor 378 when no throttling is applied, although the total power consumption by the processing cartridge is set by the processor in combination with all other power consuming components of the processing cartrdige.

Figure 21:
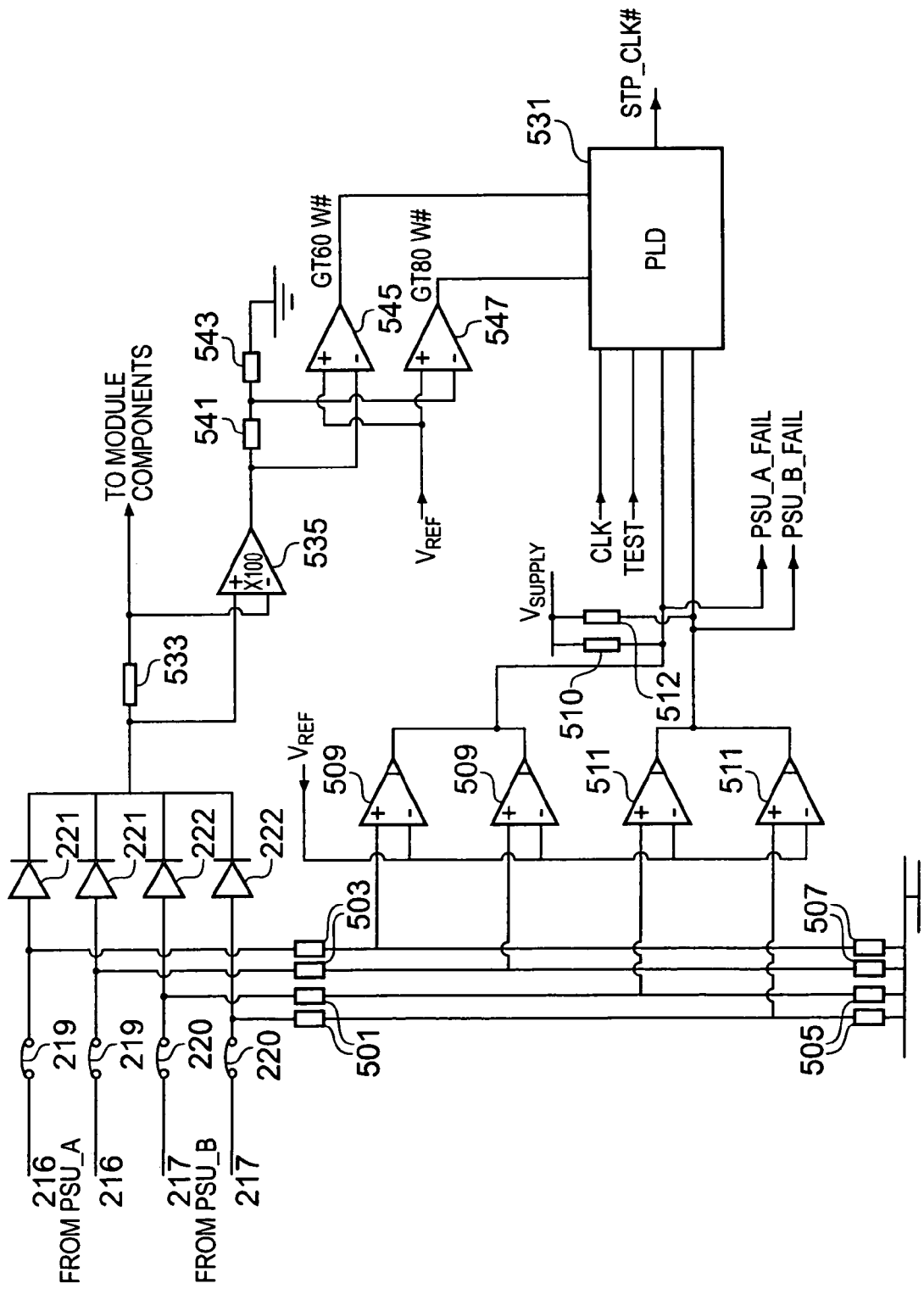
FIG. 21 is a schematic diagram of an example of a throttling control system for an information processing cartridge for mounting in the shelf of FIG. 2.

Shown in FIG. 21 is an example of an arrangement of additional components to be added to the arrangement of FIG. 18 to implement the power throttling in case of failure of excess power availability from redundant power supply for a processing cartridge occupying 2 processing cartridge slots.

The power feed for the processing cartridge arrives on two power supply rails from each PSU 81, two PSU_A feeds 216 and two PSU_B feeds 217. One power feed from each PSU corresponding to the feed for each of the two slots occupied by the 20 processing cartridge. Each power feed line is fused (219, 220) and diode commoned (221, 222) as described above with reference to FIGS. 11 and 18. As described above with reference to FIG. 20, a monitoring feed is taken from each power feed line between the fuse and the diode. Using the voltage divider arrangement described above, the voltage level on each monitoring feed is compared to the reference voltage $V_{REF}$ (which in the present example is 2.5V) at comparators 509, 511 The outputs from each comparator 509 which monitors the voltage level received from PSU_A are ANDed to form a signal PSU_A_FAIL which is fed to the BSC 203 as described above. The ANDing is performed as a wired AND made possible in the present example by the use of open collector comparators for the comparators 509 (and 511) with the outputs from the comparators being provided with a pull up resistor (510 and 512 respectively) to the same supply voltage ($V_{SUPPLY}$) at that provided to supply for example the comparators and the PLD (described below). Similarly, the outputs from each comparator 511 which monitors the voltage level received form PSU_B are ANDed by a wired AND to form a signal PSU_B_FAIL which is also fed to BSC 203 as described above. The two outputs corresponding to each PSU 81 are ANDed to ensure that the processing cartridge only draws power at its full double power limit when double power is available to both of the processing cartridge slots occupied by the processing cartridge.

Each of the output signals from the comparators 509, 511 (the signals PSU_A_FAIL and PSU_B_FAIL) is fed to a programmable logic device (PLD) 531. The PLD 531 also receives as inputs the TEST signal and a clock signal CLK. The PLD 531 performs all of the comparison and switching functions performed by the AND gates, D-type and BJT described with reference to FIG. 20 above to generate the STP_CLK# signal. Thus control of the processor 378 may be effected as described above to prevent power supply overload in a redundant power non-availability situation.

The arrangement shown in FIG. 21 also provides for variable throttling of the processor 378 in situations of redundant power non-availability. Such variable throttling provides for a "safety margin" to be provided between the nominal power consumption of the processing cartridge and the maximum power supply available to that processing cartridge so that a surge in power consumption by the processing cartridge does not cause the power supply 81 to be overloaded.

The variable throttling arrangement in the present example is configured with respect to a maximum power supply capability of 96 W to the two slot processing cartridge. In the present example, a simple three level (two threshold) variable system is provided. To effect this, a differential amplifier 535 is provided to provide an indication of the power being used by the processing cartridge at any given time. The differential amplifier 535 has its inputs connected either side of a low value current measuring resistor 533 (5 mΩ) which is arranged in the path between the supply diodes 221, 222 and the rest of the module components (typically the DC—DC converter 218). The differential amplifier 535 of the present example has a gain of 100 to amplify the voltage difference across resistor 535 caused by the current therethrough to a useable level. Thus, in the present example, for every amp of current flowing through the resistor 535, an increase of 0.5V occurs in the output from differential amplifier 535.

The output from the differential amplifier 535 is fed to a voltage divider arrangement comprising two resistors 541 and 543. In the present example, these resistors have 2k4Ω and 7k5Ω respectively. Thus a controlled voltage level is created at the intermediate point of the voltage divider arrangement. The output voltage from the differential amplifier 535 forms an input to a differential amplifier 545, which by comparing the input to the $V_{REF}$ signal, provides an output indicative of whether the processing cartridge is using greater than 60 W as signal GT60 W#. The voltage level formed by the voltage divider arrangement forms an input to a further differential amplifier 547, which by comparing the input to the $V_{REF}$ signal, provides an output indicative of whether the processing cartridge is using greater than 80 W as signal GT80 W#.

In the context of the present example, the supply voltage is 12V, so if more than 60 W is being consumed, the current through resistor 533 will be greater than 5 A. This in turn means that the output from the amplifier 535 will be greater than 2.5V (greater than 5×0.5). This output will be compared to 2.5V ($V_{REF}$), thereby providing a result signal GT60 W# indicating that more than 60 W is being draw. If the current through resistor 533 is less than 5 A, then less than 60 W is being consumed and the GT60 W# signal will so indicate.

In terms of the GT80 W# signal, if more than 80 W is being consumed, the current through resistor 533 will be greater than 6.67 A. This in turn means that the output from amplifier 535 will be greater than 3.34V (greater than 6.67×0.5). This output will be voltage divided by the 2k4Ω and 7k5Ω resistors 541 and 543 to 0.76%, such that the input to differential amplifier 547 is greater than 2.5V when more than 80 W is being consumed. Thus by comparing that input level to $V_{REF}$ (2.5V), a signal indicative of whether more than 80 W is being drawn is produced (GT80 W#).

Each of the GT80 W# and GT60 W# signals are fed as inputs to PLD 531. The PLD 531 uses these inputs to determine the duty cycle to be used in throttling the processor 378. Thus in the event that the power consumption by the processing cartridge is low, no throttling need be effected even in the event of no redundant power being available. In the present example, the following throttling parameters are implemented by PLD 531.

| Measured power consumption | Throttle level |
| --- | --- |
| <60 W | None |
| 60 W–80 W | 25% (75% duty cycle) |
| >80 W | 40% (60% duty cycle) |

Using the above scheme ensures that the maximum power consumption by the processing cartridge should remain well below the 96 W limit, thereby allowing the circuitry some time lag in responding to changes and to allow for sudden surges in power consumption.

In the arrangements described with reference to FIGS. 20 and 21, the TEST signal is a signal which is generated by the BSC 203 to provide for the failsafe power consumption reduction circuitry to be tested under system management control. Thus the effectiveness of the system may be tested to ensure adequate functionality. In the event that redundant power availability ceases and the processing cartridge does not reduce its power consumption to eliminate any excess power consumption occurring, the remaining PSU 81 will be overloaded. This may cause one of a number of problems. Firstly, such an overload may cause the power supply to fail, thereby causing a total loss of power to all components within the modular computer system shelf. Alternatively, the power supply may detect an overload to the particular processing cartridge and shut down the supply rail, thereby causing a stoppage of power to the processing cartridge. In either of these situations, at least the overloading processing cartridge, and possibly the entire shelf, will lose power and cease operation. This is clearly an undesirable result and is the reason that simple, low latency hardware implementations have been described in the above examples. A software based system could be implemented, but for maximum availability of the failsafe throttling mechanism such a solution would require a processor dedicated to providing the throttling mechanism so as to ensure low enough latency of operation.

As the skilled addressee will appreciate, although the above examples of an excess power draw system and throttling mechanism have been described in the context of the modular computer system described with reference to FIGS. 1 to 19, such a throttling mechanism may be utilized in any computer system where redundant power supply is implemented. It is not necessary that the computer system is a modular computer system, or that the computer system has more than one processing engine or receiving power from the redundant power supplies. A computer system using the excess power draw system and throttling mechanism may be arranged to benefit from increased performance of the computer system at times when redundant power is available, with the throttling mechanism providing a failsafe to ensure availability of the computer system following discontinuation of the redundant power supply.

Although the above examples of an excess power draw system and throttling mechanism have been described in the context of a dual redundant power supply situation, this is not a limiting example and many other power supply arrangements may make use of the system. For example, in a computer system having four power supplies and requiring at least two power supplies to fully power provision the computer system, when four power supplies are available maximum excess power consumption may occur, when three power supplies are available excess power consumption may be throttled back to allow some improved performance whilst not overloading the power supplies, and when only two power supplies are available the power consumption may be throttled back to eliminate any excess consumption. In another example, a computer system has three power supplies and requires at least one power supply to be operational to power the computer system; in this example when all power supplies are available, maximum excess power may be used for maximum performance enhancement, when two power supplies are operational excess power consumption may be halved to allow some performance enhancement whilst not overloading the power supplies, and when only one power supply is present excess power consumption is eliminated to provide availability of all resources albeit with no performance enhancement. Many other arrangements and configurations may be effected, as the skilled addressee will appreciate. All such arrangements and configurations any equivalents thereto lie within the teaching of this document and within the spirit and scope of the appended claims.

Another performance enhancement system which could be used in conjunction with or instead of the above described overdraw and throttling system within a computer system having multiple processing engines is a system of shelf-wide power consumption monitoring and control. An example of such a system described in the context of the modular computing system described above with reference to FIGS. 1 to 19 follows hereafter.

Within a shelf of the modular computer system, each processing cartridge 43 monitors the power consumption by that processing cartridge and report that power consumption to the CSSPs 71 of the shelf. Such monitoring may be effected in a similar fashion to the system described above with reference to FIG. 21 for determining power consumption, with the result of the monitoring being made available to the BSC 203 for reporting to the CSSPs 71.

The SSP 74 of the CSSP 71 maintains a dynamic record of the reported power consumption by each processing cartridge 43. For processing cartridges which are not operational (i.e. totally inactive), the SSP 74 records zero power consumption. By means of this record the SSP 74 is operable to determine the current power load on the system relative to the maximum available power load on the system. The SSP 74 may therefore instruct any processing cartridge to reduce a throttling effect performed on the processor of that processing cartridge to take advantage of available power excess. This system may be utilized both at times of redundant power availability and at times of redundant power non-availability.

Control of which processing engines are instructed to increase their power consumption (and hence performance) may be decided using any of a wide range of variables. A variable which may typically provide an overall system performance enhancement is the current power consumption of each processing cartridge. Any processing cartridge running at near its currently applied maximum power draw limit may be assumed to be capable of using more power to run faster to complete tasks faster, and similarly any processing cartridge running well below its currently applied maximum power draw limit may be assumed to be coping adequately with its current processing load. Therefore any processing cartridge operating at or near it maximum power draw limit may be instructed to draw extra power to increase performance, provided such extra power is available within the shelf as a whole by virtue of one or more other processing cartridges operating below their maximum current draw limit. Such a system permits dynamic control of power to processing cartridges to maximize processing capability and performance by making best use of the available power within the computer system.

Although the examples described above with reference to FIGS. 20 and 21 have been described with reference to specific arrangements of components, the skilled addressee will appreciate that many other implementations of the excess power draw and throttling system may be created without any inventive effort and therefore lie within the scope of the present disclosure and within the spirit and scope of the appended claims.

Although it has been described above that a mechanism is provided for detecting a failure of a power supply at a component or element receiving power from that power supply, alternative methods of determining a power supply failure may occur. For example, a power supply may indicate to a recipient of power that it has failed or is failing.

Although it has been described above with reference to FIGS. 20 and 21 to use the STP_CLK# input to an Intel Xeon™ processor to control power consumption by the processor, many other methods for reducing processor power consumption may be used. For example, the AMD Athlon™ series processors have an equivalent pin to the STP_CLK# pin of the Xeon processors, however in the case of the Athlon™ applying a throttling input to that pin causes the processor to switch to an very low clock frequency rather than causing a total halt of the processor. Alternative power consumption reducing techniques include use of the Intel SpeedStep™ and AMD PowerNow!™ systems. Processors configured to use either of these technologies may be controlled to a lower clock frequency and lower processor core voltage to reduce power consumption.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer system comprising:
   at least one processing element; and
   at least two power supply elements operable to provide redundant power supply for the at least one processing element;
   wherein the processing element is configured to detect an availability status of each power supply element;
   wherein if the redundant power supply is available, the processing element is configured to consume more power than is provided by the power supply capability of one of the power supply elements; and
   wherein if the redundant power supply is not available, the processing element is configured to limit its power consumption to the power supply capability of one of the power supply elements.

2. The computer system of claim 1, wherein the processing element is operable to detect said status by comparison of a voltage level associated with a received voltage level to a reference voltage.

3. The computer system of claim 1, wherein the processing element is operable to reduce its power consumption by reducing the power consumption of a processing component within that processing element.

4. The computer system of claim 3, wherein the processing element is operable to reduce the power consumption of said processing component by applying a control signal to a throttle input of the processing component.

5. The computer system of claim 1, wherein the processing element is further configured to adjust the power consumption of the processing element in response to a measured power consumption of the processing element less than the power supply capability of one of the power supply elements when redundant power supply is not available.

6. The computer system of claim 5, wherein the processing element is operable to detect whether the power consumption of the processing element is greater or less than a predetermined threshold level.

7. The computer system of claim 6, wherein said threshold level is determined based on the maximum power supply available to the processing element when redundant power is not available.

8. The computer system of claim 1, wherein the processing element is further configured to adjust the power consumption of the processing element in response to a measured power consumption of the processing element less than the power supply capability of all of the power supply elements when redundant power supply is available.

9. The computer system of claim 8, wherein the processing element is operable to detect whether the power consumption of the processing element is greater or less than a predetermined threshold level.

10. The computer system of claim 9, wherein said threshold level is determined based on the maximum power supply available to the processing element when redundant power is available.

11. The computer system of claim 1, wherein the at least one processing element includes a plurality of processing elements, at least one of which being a processing element configured to consume more power than is provided by the power supply capability of one of the power supply elements at a time when redundant power supply is available, and to limit its power consumption to the power supply capability of one of the power supply elements when redundant power supply is not available.

12. The computer system of claim 1, configured as a modular computer system.

13. The computer system of claim 12, wherein the processing element is configured as a removable processing module arranged to be removably received in a processing module receiving location of said modular computer system.

14. The computer system of claim 12, wherein each power supply element is configured as a removable power supply module arranged to be removably received in a power supply module location of said modular computer system.

15. The computer system of claim 1, wherein the processing element is configured as a field replaceable unit.

16. The computer system of claim 1, further comprising a computer system management element operable to interrogate each of a plurality of processing elements to determine a current power consumption for each of said plurality of processing elements, to compare each said current power consumptions to a current maximum allowable power consumption for the respective processing element to obtain a power comparison result, and to instruct selected ones of said plurality of processing elements to increase or decrease their power consumption in accordance with said power comparison result.

17. The computer system of claim 16, wherein said power consumption result is dependent upon the total maximum power available from the power supply elements.

18. A computer system comprising:
    at least one processing means for performing a processing task; and
    at least two power supply means for providing redundant power supply for the at least one processing means;
    wherein the processing means is configured to detect an availability status of each power supply means;
    wherein if the redundant power supply is available, the processing means is configured to consume more power than is provided by the power supply capability of one of the power supply means; and
    wherein if the redundant power supply is not available, the processing means is configured to limit its power consumption to the power supply capability of one of the power supply means.

19. A method comprising:
    detecting an availability status of each of at least two power supply elements configured to provide redundant power supply for at least one processing element of a computer system;

consuming more power than is provided by the power supply capability of one of the power supply elements if the redundant power supply is available; and limiting a power consumption to the power supply capability of one of the power supply elements if the redundant power supply is not available.

20. A method of exploiting redundant power provided to a programmable processing apparatus, the method comprising:

detecting an operational status of each of a plurality of power supplies to the programmable processing apparatus to determine a redundancy availability result;

permitting the programmable processing apparatus to utilize more power than is available in the event of a negative redundancy availability result upon a determination of a positive redundancy availability result; and limiting the power utilization of the programmable processing apparatus to the power that is available in the event of a negative redundancy availability result upon a determination of a negative redundancy availability result.

21. A computer system comprising:

at least one processing resource;

at least one power resource; and at least one redundant power resource configured to provide redundant power supply for the at least one processing resource;

wherein the at least one processing resource is operable to detect an availability status of the at least one redundant power resource;

wherein if the at least one redundant power resource is available, the at least one processing resource is configured to exploit power provided by both the at least one power resource and the at least one redundant power resource;

wherein if the at least one redundant power resource is not available, the at least one processing resource is configured to exploit power provided by the at least one power resource or the at least one redundant power resource.

22. The computer system of claim 21, wherein the at least one processing resource is operable to control the level of power exploited by that processing resource in response to detecting an operable status of each of the at least one power resource and the at least one redundant power resource.

23. The computer system of claim 22, comprising a plurality of processing resources, and wherein each of the at least one power resource and the at least one redundant power resource is operable to simultaneously provide power to each of the processing resources.

* * * * *